United States Patent
Shitagaki et al.

(10) Patent No.: US 9,337,438 B2
(45) Date of Patent: May 10, 2016

(54) LIGHT-EMITTING ELEMENT, LIGHT-EMITTING DEVICE, AND ELECTRONIC DEVICE

(75) Inventors: Satoko Shitagaki, Kanagawa (JP); Tsunenori Suzuki, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 884 days.

(21) Appl. No.: 12/252,821

(22) Filed: Oct. 16, 2008

(65) Prior Publication Data
US 2009/0102368 A1 Apr. 23, 2009

(30) Foreign Application Priority Data
Oct. 19, 2007 (JP) ................................. 2007-272003

(51) Int. Cl.
H01L 51/54 (2006.01)
H01L 51/50 (2006.01)
H01L 51/00 (2006.01)

(52) U.S. Cl.
CPC ........ H01L 51/5048 (2013.01); H01L 51/5052 (2013.01); H01L 51/5088 (2013.01); H01L 51/006 (2013.01); H01L 51/0059 (2013.01); H01L 51/0071 (2013.01); H01L 51/0072 (2013.01); H01L 2251/552 (2013.01)

(58) Field of Classification Search
None
See application file for complete search history.

(56) References Cited

U.S. PATENT DOCUMENTS

| | | | |
|---|---|---|---|
| 5,601,903 A | 2/1997 | Fujii et al. | |
| 5,922,481 A | 7/1999 | Etzbach et al. | |
| 6,010,796 A | 1/2000 | Kijima | |
| 6,387,546 B1 * | 5/2002 | Hamada et al. | 428/690 |
| 6,833,201 B2 | 12/2004 | Czerw et al. | |
| 7,196,360 B2 | 3/2007 | Seo et al. | |
| 7,342,355 B2 | 3/2008 | Seo et al. | |
| 7,449,832 B2 | 11/2008 | Itai | |
| 7,456,425 B2 | 11/2008 | Seo et al. | |
| 7,474,049 B2 | 1/2009 | Liu et al. | |
| 7,560,749 B2 | 7/2009 | Sakata et al. | |
| 7,572,522 B2 | 8/2009 | Seo et al. | |
| 7,579,089 B2 | 8/2009 | Seo et al. | |
| 7,615,925 B2 | 11/2009 | Suzuki et al. | |
| 7,622,200 B2 | 11/2009 | Ohsawa et al. | |
| 7,816,668 B2 | 10/2010 | Kawakami et al. | |
| 7,875,879 B2 | 1/2011 | Suzuki et al. | |
| 7,897,964 B2 | 3/2011 | Kawakami et al. | |
| 7,902,742 B2 | 3/2011 | Suzuki et al. | |
| 7,915,807 B2 | 3/2011 | Seo et al. | |
| 8,080,934 B2 | 12/2011 | Kido et al. | |
| 8,148,891 B2 | 4/2012 | Tung et al. | |
| 8,183,793 B2 | 5/2012 | Egawa et al. | |
| 8,288,180 B2 | 10/2012 | Sakata | |
| 8,310,147 B2 | 11/2012 | Seo et al. | |
| 8,415,878 B2 | 4/2013 | Seo et al. | |
| 8,432,094 B2 | 4/2013 | Seo et al. | |
| 8,704,212 B2 | 4/2014 | Kawakami et al. | |
| 2002/0113545 A1 * | 8/2002 | Adachi et al. | 313/504 |
| 2002/0197511 A1 * | 12/2002 | D'Andrade et al. | 428/690 |
| 2003/0068528 A1 * | 4/2003 | Thompson et al. | 428/690 |
| 2003/0189401 A1 | 10/2003 | Kido et al. | |
| 2003/0198831 A1 * | 10/2003 | Oshiyama et al. | 428/690 |
| 2004/0058193 A1 * | 3/2004 | Hatwar | 428/690 |
| 2004/0086743 A1 * | 5/2004 | Brown et al. | 428/690 |
| 2004/0150328 A1 | 8/2004 | Czerw et al. | |
| 2004/0262576 A1 * | 12/2004 | Thompson et al. | 252/301.16 |
| 2005/0031902 A1 | 2/2005 | Uchida et al. | |
| 2005/0100760 A1 | 5/2005 | Yokoyama | |
| 2006/0029828 A1 | 2/2006 | Kanno et al. | |
| 2006/0043859 A1 | 3/2006 | Fukuoka et al. | |
| 2006/0051615 A1 | 3/2006 | Kanno et al. | |
| 2006/0158102 A1 | 7/2006 | Kawamura et al. | |
| 2006/0214151 A1 | 9/2006 | Abe et al. | |
| 2006/0251905 A1 | 11/2006 | Arakawa et al. | |
| 2006/0289882 A1 | 12/2006 | Nishimura et al. | |
| 2007/0024188 A1 | 2/2007 | Kim et al. | |
| 2007/0029941 A1 * | 2/2007 | Ito et al. | 315/169.3 |
| 2007/0048547 A1 | 3/2007 | Chang et al. | |
| 2007/0049778 A1 * | 3/2007 | Nomura et al. | 585/26 |

(Continued)

FOREIGN PATENT DOCUMENTS

CN 001212318 C 7/2005
CN 1682572 A 10/2005

(Continued)

OTHER PUBLICATIONS

Liu et al. "pi-Conjugated Aromatic Enynes as a Single-Emitting Component for White Luminescence" J. Am. Chem. Soc. 2006, 128, 5592-5593. Date of on-line publication: Apr. 7, 2006.*
Li et al. "High efficiency and color saturated blue electroluminescence by using 4,4'-bis[N-(1-naphthyl)-N-phenylamino]biphenyl as the thinner host and hole-transport" Solid-State Electronics 2008, 52, 121-125. Year of publication: 2008.*
International Search Report re application No. PCT/JP2008/068921, dated Jan. 20, 2009.
Written Opinion re application No. PCT/JP2008/068921, dated Jan. 20, 2009.
Tsutsui, T. et al., "High Quantum Efficiency in Organic Light-Emitting Devices with Iridium-Complex as a Triplet Emissive Center", Jpn. J. Appl. Phys., vol. 38, Part 2, No. 12B, Dec. 15, 1999, pp. L1502-L1504.

(Continued)

*Primary Examiner* — Andrew K Bohaty
(74) *Attorney, Agent, or Firm* — Husch Blackwell LLP

(57) ABSTRACT

In a light-emitting element including an EL layer between a pair of electrodes, a structure is formed in which the EL layer includes at least a first layer having a hole-injecting property (a hole-injecting layer) and a second layer having a hole-transporting property (a hole-transporting layer) between the electrode functioning as an anode and a third layer having a light-emitting property (a light-emitting layer), and the absolute value of the highest occupied molecular orbital level (HOMO level) of the second layer is larger than that of the first layer, so that the injection amount of holes from the electrode side which functions as an anode is suppressed, and thus luminous efficiency of the light-emitting element is increased.

12 Claims, 31 Drawing Sheets

(56) References Cited

U.S. PATENT DOCUMENTS

| | | |
|---|---|---|
| 2007/0148493 A1 | 6/2007 | Yoneyama et al. |
| 2007/0172699 A1 | 7/2007 | Nakashima et al. |
| 2007/0215867 A1* | 9/2007 | Kawakami et al. ............ 257/40 |
| 2007/0222376 A1 | 9/2007 | Ohsawa et al. |
| 2007/0285010 A1 | 12/2007 | Lee et al. |
| 2008/0006821 A1 | 1/2008 | Suzuki et al. |
| 2008/0007164 A1 | 1/2008 | Suzuki et al. |
| 2008/0007165 A1* | 1/2008 | Suzuki et al. ................ 313/504 |
| 2008/0107918 A1 | 5/2008 | Egawa et al. |
| 2008/0122350 A1 | 5/2008 | Sakata et al. |
| 2008/0142794 A1 | 6/2008 | Shitagaki et al. |
| 2008/0231177 A1 | 9/2008 | Nomura et al. |
| 2010/0243992 A1 | 9/2010 | Tsuji et al. |
| 2013/0011942 A1 | 1/2013 | Sakata |
| 2013/0187536 A1 | 7/2013 | Seo et al. |
| 2013/0306942 A1 | 11/2013 | Seo et al. |
| 2014/0213798 A1 | 7/2014 | Kawakami et al. |

FOREIGN PATENT DOCUMENTS

| | | |
|---|---|---|
| CN | 1700829 A | 11/2005 |
| CN | 1846988 A | 10/2006 |
| EP | 0 818 943 A2 | 1/1998 |
| EP | 1 220 339 A2 | 7/2002 |
| EP | 1 220 340 A2 | 7/2002 |
| EP | 1 505 647 A2 | 2/2005 |
| EP | 1 610 594 A1 | 12/2005 |
| EP | 2 256 840 A2 | 12/2010 |
| JP | 10-79297 | 3/1998 |
| JP | 2004-79413 | 3/2004 |
| JP | 2005-63763 | 3/2005 |
| JP | 2005-75948 | 3/2005 |
| JP | 2006-49394 | 2/2006 |
| JP | 2006-66890 | 3/2006 |
| JP | 2006-303456 | 11/2006 |
| JP | 2007-42619 | 2/2007 |
| JP | 2007-042624 A | 2/2007 |
| JP | 2007-067361 A | 3/2007 |
| JP | 2007-258362 | 10/2007 |
| JP | 2007-329454 | 12/2007 |
| JP | 2008-81497 | 4/2008 |
| JP | 2008-237686 | 10/2008 |
| TW | 543342 | 7/2003 |
| TW | 545080 | 8/2003 |
| TW | 200716513 | 5/2007 |
| TW | 200721564 | 6/2007 |
| TW | 200738054 | 10/2007 |
| WO | WO 2007/004729 A1 | 1/2007 |
| WO | WO 2007/043354 A1 | 4/2007 |
| WO | WO 2007/044236 A2 | 4/2007 |
| WO | WO 2007/069741 A1 | 6/2007 |
| WO | WO 2007/094101 A1 | 8/2007 |
| WO | WO 2008/026614 A1 | 3/2008 |

OTHER PUBLICATIONS

Goldsmith, C.R. et al, "C—H Bond Activation by a Ferric Methoxide Complex: Modeling the Rate-Determining Step in the Mechanism of Lipoxygenase," J. Am. Chem. Soc., vol. 124, No. 1, 2002, pp. 83-96.

Onishi et al, "Method of Measuring an Energy Level," *High Molecular EL Materials—Development of Light-Emitting High Molecular Compounds*, Kyoritsu Shuppan, Dec. 25, 2004, pp. 64-67 (with English translation, pp. 1-3).

Office Action re Chinese application No. CN 200880107366.1, dated Jun. 24, 2011 (with English translation).

Taiwanese Office Action re Application No. TW 97139959, dated Jul. 9, 2014.

Taiwanese Office Action re Application No. TW 101123259, dated Jul. 9, 2014.

* cited by examiner

EXPLANATION OF REFERENCE

101: substrate, 102: first electrode, 103: EL layer, 104: second electrode, 111: first layer (hole-injecting layer), 112: second layer (hole-transporting layer), 113: third layer (light-emitting layer), 114: fourth layer (electron-transporting layer), 115: fifth layer (electron-injecting layer), 116: sixth layer (carrier-controlling layer), 201: first organic compound, 202: second organic compound, 203: first organic compound, 204: second organic compound, 801: first electrode, 802: second electrode, 803: first EL layer, 804: second EL layer, 805: charge generation layer, 901: source side driver circuit, 902: pixel portion, 903: gate side driver circuit, 904: sealing substrate, 905: sealant, 907: space, 908: wiring, 909: FPC (flexible printed circuit), 910: element substrate, 911: switching TFT, 912: current control TFT, 913: first electrode, 914: insulator, 916: EL layer, 917: second electrode, 918: light-emitting element 923: n-channel TFT, 924: p-channel TFT, 1001: substrate, 1002: first electrode, 1003: second electrode, 1004: EL layer, 1005: insulating layer, 1006: partition wall, 1201: housing, 1202: liquid crystal layer, 1203: backlight, 1204: housing, 1205: driver IC, 1206: terminal, 1301: housing, 1302: light source, 1401: lighting device, 1402: television device, 1501: substrate, 1502: first electrode, 1503: EL layer, 1504: second electrode, 1511: first layer (hole-injecting layer), 1512: second layer (hole-transporting layer), 1513: third layer (light-emitting layer), 1514: fourth layer (electron-transporting layer), 1515: fifth layer (electron-injecting layer), 1601: substrate, 1602: first electrode, 1603: EL layer, 1604: second electrode, 1611: first layer (hole-injecting layer), 1612: second layer (hole-transporting layer), 1613: third layer (light-emitting layer), 1614: fourth layer (electron-transporting layer); 1615: fifth layer (electron-injecting layer), 1616: sixth layer (carrier-controlling layer), 9101: housing, 9102: supporting base, 9103: display portion, 9104: speaker portion, 9105: video input terminal, 9201: main body, 9202: housing, 9203: display portion, 9204: keyboard, 9205: external connection port, 9206: pointing device, 9401: main body, 9403: display portion, 9404: audio input portion, 9405: audio output portion, 9406: operation key, 9407: external connection port, 9408: antenna, 9501: main body, 9502: display portion, 9503: housing, 9504: external connection port, 9505: remote control receiving portion, 9506: image receiving portion, 9507: battery, 9508: audio input portion, 9509: operation key, and 9510: eyepiece portion.

LIGHT-EMITTING ELEMENT, LIGHT-EMITTING DEVICE, AND ELECTRONIC DEVICE

TECHNICAL FIELD

The present invention relates to a current excitation type light-emitting element in which a light-emitting substance is interposed between a pair of electrodes, a light-emitting device having such a light-emitting element, and an electronic device.

BACKGROUND ART

In recent years, research and development have been extensively conducted on light-emitting elements using electroluminescence. In a basic structure of such a light-emitting element, a layer containing a substance having a light-emitting property is interposed between a pair of electrodes. By application of voltage to this element, light emission from the substance having a light-emitting property can be obtained.

Since such a light-emitting element is of self-luminous type, it has advantages over a liquid crystal display, such as high visibility of the pixels and no need of a backlight, and is considered to be suitable as a flat panel display element. In addition, such a light-emitting element can be manufactured to be thin and light, which is a great advantage. Moreover, such a light-emitting element also has a feature that response speed is extremely fast.

Furthermore, since such a light-emitting element can be formed into a film form, planar light emission can be easily obtained by formation of a large-area element. This cannot be easily achieved with a point light source typified by an incandescent lamp or an LED, or with a line light source typified by a fluorescent lamp. Therefore, the light-emitting element has a high utility value as a plane light source which can be applied to lighting and the like.

The light-emitting elements utilizing electroluminescence are roughly classified in accordance with whether a substance having a light-emitting property is an organic compound or an inorganic compound. In the present invention, an organic compound is used as the substance having a light-emitting property. In that case, by application of voltage to the light-emitting element, electrons and holes are injected from a pair of electrodes into a layer containing an organic compound having a light-emitting property, so that current flows. Then, by recombination of these carriers (electrons and holes), the organic compound having a light-emitting property forms an excited state, and light is emitted when the excited state returns to a ground state.

Based on this mechanism, such a light-emitting element is referred to as a current excitation type light-emitting element. Note that there can be a singlet excited state and a triplet excited state as the type of the excited state formed by the organic compound, and light emitted in the case of the singlet excited state is referred to as fluorescence, and light emitted in the case of the triplet excited state is referred to as phosphorescence.

There are many problems which depend on substances in improving element characteristics of such a light-emitting element. Therefore, improvement of an element structure, development of a substance, and the like have been carried out in order to solve the problems.

For example, in Non-Patent Document 1 (: Tetsuo TSUTSUI, and eight others, *Japanese Journal of Applied Physics*, Vol. 38, L1502-L1504 (1999)), by provision of a hole-blocking layer, a light-emitting element using a phosphorescent substance efficiently emits light. As described in Non-Patent Document 1, however, there are problems in that the hole-blocking layer does not have durability and the lifetime of the light-emitting element is extremely short.

DISCLOSURE OF INVENTION

In view of the foregoing problems, it is an object of the present invention to provide a light-emitting element having high luminous efficiency and a longer lifetime than a conventional light-emitting element by formation of a light-emitting element having an element structure which is different from a conventional structure. It is another object to provide a light-emitting device and an electronic device having high luminous efficiency.

One feature of the present invention is a light-emitting element including an EL layer between a pair of electrodes, in which the EL layer includes at least a first layer having a hole-injecting property (a hole-injecting layer) and a second layer having a hole-transporting property (a hole-transporting layer) between a third layer having a light-emitting property (a light-emitting layer) and an electrode functioning as an anode of the pair of electrodes; and the absolute value of the highest occupied molecular orbital level (HOMO level) of the second layer is larger than the highest occupied molecular orbital level (HOMO level) of the first layer.

Note that the absolute value of the HOMO level of the second layer is larger than that of the first layer by greater than or equal to 0.1 eV in the above-described structure.

In the present invention, formation of the light-emitting element having the above-described structure makes it possible to form an energy gap between the first layer (the hole-injecting layer) and the second layer (the hole-transporting layer) and to suppress the injection amount of holes from the first layer (the hole-injecting layer) into the second layer (the hole-transporting layer), which are injected from the electrode side which functions as an anode. Thus, luminous efficiency of the light-emitting element can be increased.

Another feature of the present invention is that, in addition to the above-described structure, a fourth layer controlling transport of electrons (a carrier-controlling layer) is included between an electrode functioning as a cathode and the third layer (the light-emitting layer); the fourth layer is formed of a first organic compound having an electron-transporting property and a second organic compound having a hole-transporting property; and the contained amount of the second organic compound is less than 50% of the total in mass ratio. Note that it is preferable to control the concentration of the second organic compound so that the contained amount thereof becomes 1 wt % to 20 wt % of the total.

Another feature of the present invention is that, in the above-described structure, in the case of making the fourth layer (the carrier-controlling layer) function kinetically, the absolute value of the lowest unoccupied molecular orbital level (LUMO level) of the second organic compound has a difference of less than or equal to 0.3 eV from the absolute value of the lowest unoccupied molecular orbital level (LUMO level) of the first organic compound, and when the dipole moment of the first organic compound is $P_1$ and the dipole moment of the second organic compound is $P_2$, a relation of $P_1/P_2 \geq 3$ is satisfied.

It is preferable that, in the above-described structure, a metal complex be used for the first organic compound and an aromatic amine compound be used for the second organic compound.

Another feature of the present invention is that, in addition to the above-described structure, in the case of making the fourth layer (the carrier-controlling layer) function thermodynamically, the fourth layer is formed of the first organic compound having an electron-transporting property and a second organic compound having an electron-trapping property, and the contained amount of the second organic compound is less than 50% of the total in mass ratio. Note that it is more preferable to control the concentration of the second organic compound so that the contained amount thereof becomes 0.1 wt % to 5 wt % of the total. Another feature of the present invention is that the absolute value of the LUMO level of the second organic compound is higher than that of the LUMO level of the first organic compound by greater than or equal to 0.3 eV. Furthermore, it is preferable that a metal complex be used for the first organic compound, and a coumarin derivative or a quinacridone derivative be used for the second organic compound.

It is preferable that, in the above-described structure, the thickness of the fourth layer be greater than or equal to 5 nm and less than or equal to 20 nm.

It is preferable that, in each of the above-described structures, the third layer (the light-emitting layer) contain a material having an electron-transporting property.

The present invention includes, in its category, a light-emitting device having the above-described light-emitting element and an electronic device having the light-emitting device. The light-emitting device in this specification refers to an image display device, a light-emitting device, or a light source (including a lighting system). In addition, the light-emitting device includes any of the following modules in its category: a module in which a connector such as an flexible printed circuit (FPC), a tape automated bonding (TAB) tape, or a tape carrier package (TCP) is attached to a light-emitting device; a module having a TAB tape or a TCP provided with a printed wiring board at the end thereof; and a module having an integrated circuit (IC) directly mounted on a light-emitting element by a chip on glass (COG) method.

The present invention makes it possible to suppress the injection amount of holes which are carriers of the light-emitting element, from the first layer (the hole-injecting layer) into the second layer (the hole-transporting layer); thus, recombination probability within the light-emitting layer can be increased and luminous efficiency of the light-emitting element can be increased. Moreover, by combination of a structure which is capable of reducing the electron transport rate, a light-emitting element having high efficiency and a long lifetime can be obtained. Furthermore, by application of the light-emitting element of the present invention to a light-emitting device and an electronic device, a light-emitting device and an electronic device with reduced power consumption can be obtained.

BRIEF DESCRIPTION OF THE DRAWINGS

In the accompanying drawings:

FIGS. 11A to 11D are views illustrating electronic devices in Embodiment Mode 5;

BEST MODE FOR CARRYING OUT THE INVENTION

Embodiment Modes of the present invention will be hereinafter described in detail with reference to the accompanying drawings. Note that the present invention is not limited to the description below and the modes and details of the present invention can be modified in various ways without departing from the purpose and scope of the present invention. Therefore, the present invention should not be interpreted as being limited to the description below of Embodiment Modes.

[Embodiment Mode 1]

In Embodiment Mode 1, a light-emitting element of the present invention having a structure which is capable of suppressing the injection amount of holes from a first layer (a hole-injecting layer) into a second layer (a hole-transporting layer) of the light-emitting element will be described.

The light-emitting element in Embodiment Mode 1 includes a first electrode functioning as an anode, a second electrode functioning as a cathode, and an EL layer provided between the first electrode and the second electrode. As for the EL layer, it is acceptable as long as at least a hole-injecting layer, a hole-transporting layer, and a light-emitting layer are sequentially stacked from the first electrode side; the hole-injecting layer is formed of a composite material which makes it easy to inject holes regardless of the work function of the first electrode; and the hole-transporting layer and the hole-injecting layer are provided so that the HOMO level (the absolute value) of the hole-transporting layer becomes deeper (larger) than that of the hole-injecting layer. There is no particular limitation on other layers. The light-emitting element in Embodiment Mode 1 emits light when voltage is applied to the first electrode 102 and the second electrode 104 so that the potential of the first electrode 102 becomes higher than that of the second electrode 104.

Figure 1:
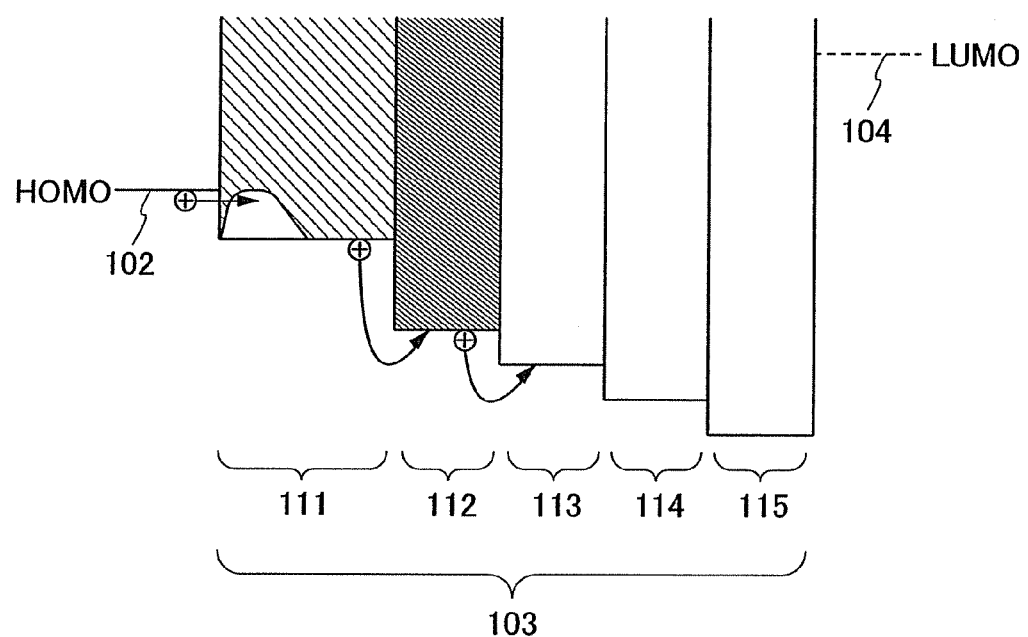
FIG. 1 is a view illustrating a band structure of a light-emitting element in Embodiment Mode 1.

The case will be described, as shown in FIG. 1, where an EL layer 103 has a structure including a first layer (a hole-injecting layer) 111, a second layer (a hole-transporting layer) 112, a third layer (a light-emitting layer) 113, a fourth layer (an electron-transporting layer) 114, and a fifth layer (an electron-injecting layer) 115 from a first electrode 102 side.

In the EL layer 103 of the light-emitting element shown in FIG. 1, the first layer (the hole-injecting layer) 111 is formed using a composite material in which a substance having an acceptor property is contained in a substance having a high hole-transporting property; thus, the Fermi level is shifted and band heading occurs near an interface between the first layer (the hole-injecting layer) 111 and the first electrode 102. Accordingly, injection barrier near the interface between the first electrode 102 and the first layer (the hole-injecting layer) 111 becomes small (or disappears actually), and thus tunnel injection of holes from the first electrode 102 into the first layer (the hole-injecting layer) 111 becomes possible as if ohmic contact was formed.

The second layer (the hole-transporting layer) 112 and the first layer (the hole-injecting layer) 111 are provided so that the highest occupied molecular orbital level (HOMO level) (the absolute value) of the second layer (the hole-transporting layer) 112 becomes deeper (larger) than that of the first layer (the hole-injecting layer) 111. Such a structure makes it possible to suppress the injection amount of holes into the second layer (the hole-transporting layer) 112 from the first layer (the hole-injecting layer). Thus, the injection amount of holes into the third layer (the light-emitting layer) 113 can be suppressed more in the case of the structure than in the case where an energy gap by the second layer (the hole-transporting layer) 112 is not provided. Note that, specifically, the absolute value of the HOMO level of the second layer 112 is preferably larger than that of the HOMO level of the first layer 111 by greater than or equal to 0.1 eV.

Note that formation of the structure shown in FIG. 1 makes it possible to suppress the injection amount of holes into the third layer (the light-emitting layer) 113; thus, higher efficiency of the light-emitting element can be achieved.

Thus, in the present invention, as described above, by formation of the first layer (the hole-injecting layer) 111 with use of the composite material in which a substance having an acceptor property is contained in a substance having a high hole-transporting property, increase in driving voltage can be kept to the minimum in comparison with the case of attempting increase in element efficiency with use of a simple structure in which the highest occupied molecular orbital level (HOMO level) (the absolute value) of the second layer (the hole-transporting layer) 112 is deeper (larger) than that of the first layer (the hole-injecting layer) 111.

Such a structure of the present invention shown in FIG. 1 is effective especially in the case where the third layer (the light-emitting layer) 113 contains a substance having an electron-transporting property. In the case where the third layer (the light-emitting layer) 113 contains a substance having an electron-transporting property, a light-emitting region is located near an interface between the third layer (the light-emitting layer) 113 and the second layer (the hole-transporting layer) 112. Then, if cation is generated near the interface due to excessive holes, luminous efficiency is significantly decreased because cation serves as a quencher. However, since the structure of the present invention suppresses the injection amount of holes, generation of cation around the third layer (the light-emitting layer) 113 and decrease in luminous efficiency can be suppressed. Thus, a light-emitting element having high luminous efficiency can be formed.

A structure of the light-emitting element in Embodiment Mode 1 will be described with reference to FIGS. 2A and 2B. A substrate 101 is used as a support of the light-emitting element. For example, glass, quartz, plastic, or the like can be used for the substrate 101.

The substrate 101 may remain in a light-emitting device or an electronic device which is a product utilizing the light-emitting element of the present invention. Alternatively, the substrate 101 may merely serve as a support in a manufacturing process of the light-emitting element without remaining in a final product.

The first electrode 102 formed over the substrate 101 is preferably formed of a metal, an alloy, an electrically conductive compound, a mixture thereof, or the like each having a high work function (specifically a work function of greater than or equal to 4.0 eV). Specifically, the following are given, for example: indium tin oxide (ITO), indium tin oxide containing silicon or silicon oxide, indium zinc oxide (IZO), indium oxide containing tungsten oxide and zinc oxide (IWZO), and the like. In addition, gold (Au), platinum (Pt), nickel (Ni), tungsten (W), chromium (Cr), molybdenum (Mo), iron (Fe), cobalt (Co), copper (Cu), palladium (Pd), titanium (Ti), nitride of a metal material (e.g., titanium nitride), and the like. In the present invention, however, since the first layer 111 in the EL layer 103 formed in contact with the first electrode 102 is formed using a composite material which makes it easy to inject holes regardless of the work function of the first electrode 102, every known material can be used as long as the material can be used as an electrode material (e.g., a metal, an alloy, an electrically conductive compound, a mixture thereof, and an element belonging to Group 1 or Group 2 of the periodic table).

These materials are usually formed by a sputtering method. For example, indium zinc oxide (IZO) can be formed by a sputtering method using a target in which 1 wt % to 20 wt % of zinc oxide is mixed into indium oxide, or indium oxide containing tungsten oxide and zinc oxide (IWZO) can be formed by a sputtering method using a target in which 0.5 wt % to 5 wt % of tungsten oxide and 0.1 wt % to 1 wt % of zinc oxide are mixed into indium oxide. Alternatively, a vacuum evaporation method, a coating method, an ink-jet method, a spin coating method, or the like may be used.

The EL layer 103 formed over the first electrode 102 can be formed using a known material, and either a low molecular compound or a high molecular compound can be used. Note that the material for forming the EL layer 103 includes not only an organic compound but also an inorganic compound in part thereof.

The EL layer 103 is formed in such a manner that a hole-injecting layer containing a substance having a high hole-injecting property, a hole-transporting layer containing a substance having a high hole-transporting property, a light-emitting layer formed of a light-emitting substance, an electron-transporting layer containing a substance having a high electron-transporting property, an electron-injecting layer containing a substance having a high electron-injecting property, and the like are combined and stacked as appropriate.

Note that, in Embodiment Mode 1, as for the EL layer 103, it is necessary that at least the hole-injecting layer, the hole-transporting layer, and the light-emitting layer be sequentially stacked from the first electrode 102 side, the hole injecting layer be formed using a composite material, and the hole-transporting layer and the hole-injecting layer be provided so that the highest occupied molecular orbital level (HOMO level) (the absolute value) of the hole-transporting layer becomes deeper (larger) than the HOMO level of the hole-injecting layer.

Figure 2A:
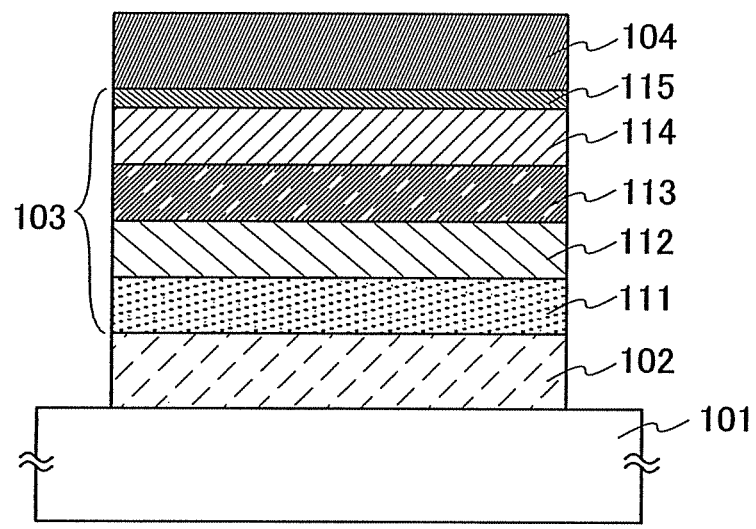
FIGS. 2A and 2B are views each illustrating a stacked structure of a light-emitting element in Embodiment Mode 1.
Figure 2B:
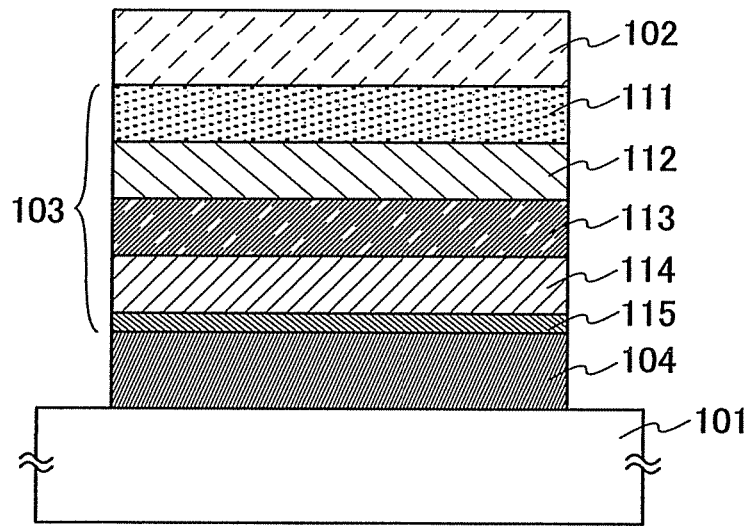

With reference to FIGS. 2A and 2B, the case will be described where the EL layer 103 includes the first layer (the hole-injecting layer) 111, the second layer (the hole-transporting layer) 112, the third layer (the light-emitting layer) 113, the fourth layer (the electron-transporting layer) 114, and the fifth layer (the electron-injecting layer) 115 which are sequentially stacked from the first electrode 102 side, in a similar manner to FIG. 1.

A composite material in which an acceptor substance is contained in a substance having a high hole-transporting property is used for the first layer (the hole-injecting layer) 111 in the present invention. A composite material in which an acceptor substance is contained in a substance having a high hole-transporting property is used, so that a material for forming an electrode can be selected regardless of the work function of the electrode. That is, not only a material having a high work function but also a material having a low work function can be used for the first electrode 102. Such a composite material can be formed by co-evaporation of a substance having a high hole-transporting property and an acceptor substance. Note that in this specification, the term "composition" refers to not only a state in which two materials are simply mixed but also a state in which a plurality of materials are mixed and thus electric charges are transferred among the plurality of materials.

As the organic compound used for the composite material, various compounds such as an aromatic amine compound, a carbazole derivative, aromatic hydrocarbon, and a high molecular compound (oligomer, dendrimer, polymer, or the like) can be used. The organic compound used for the composite material is preferably an organic compound having a high hole-transporting property. Specifically, a substance having a hole mobility of greater than or equal to $10^{-6}$ cm$^2$/V$_s$ is preferably used. Note that other materials may be used as long as they have a hole-transporting property which is higher than an electron-transporting property. The organic compound which can be used for the composite material will be specifically described below.

As the organic compound which can be used for the composite material, the following can be given, for example: aromatic amine compounds such as 4,4',4"-tris[N-(3-methylphenyl)-N-phenylamino]triphenylamine (MTDATA), 4,4',4"-tris(N,N-diphenylamino)triphenylamine (TDATA), 4,4'-bis[N-(4-diphenylaminophenyl)-N-phenylamino]biphenyl (DPBA), 4,4'-bis(N-{4-[N'-(3-methylphenyl)-N'-phenylamino]phenyl}-N-phenylamino)biphenyl (DNTPD), 1,3,5-tris[N-(4-diphenylaminophenyl)-N-phenylamino]benzene (DPA3B), 3-[N-(9-phenylcarbazol-3-yl)-N-phenylamino]-9-phenylcarbazole (PCzPCA1), 3,6-bis[N-(9-phenylcarbazol-3-yl)-N-phenylamino]-9-phenylcarbazole (PCzPCA2), 3-[N-(1-naphthyl)-N-(9-phenylcarbazol-3-yl)amino]-9-phenylcarbazole (PCzPCN1), 4,4'-bis[N-(1-naphthyl)-N-phenylamino]biphenyl (NPB or α-NPD), and N,N'-bis(3-methylphenyl)-N,N'-dipheny-[1,1'-biphenyl]-4,4'-diamine (TPD); and carbazole derivatives such as 4,4'-di(N-carbazolyl)biphenyl (CBP), 1,3,5-tris[4-(N-carbazolyl)phenyl]benzene (TCPB), 9-[4-(N-carbazolyl)]phenyl-10-phenylanthracene (CzPA), and 1,4-bis[4-(N-carbazolyl)phenyl]-2,3,5,6-tetraphenylbenzene.

Moreover, aromatic hydrocarbon compounds such as 2-tert-butyl-9,10-di(2-naphthyl)anthracene (t-BuDNA), 2-tert-butyl-9,10-di(1-naphthyl)anthracene, 9,10-bis(3,5-diphenylphenyl)anthracene (DPPA), 2-tert-butyl-9,10-bis(4-phenylphenyl)anthracene (t-BuDBA), 9,10-di(2-naphthyl)anthracene (DNA); 9,10-diphenylanthracene (DPAnth), 2-tert-butylanthracene (t-BuAnth); 9,10-bis(4-methyl-1-naphthyl)anthracene (DMNA), 9,10-bis[2-(1-naphthyl)phenyl]-2-tert-butylanthracene, 9,10-bis[2-(1-naphthyl)phenyl]anthracene, and 2,3,6,7-tetramethyl-9,10-di(1-naphthyl)anthracene can be given.

Furthermore, aromatic hydrocarbon compounds such as 2,3,6,7-tetramethyl-9,10-di(1-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (DPVBi); and 9,10-bis[4-(2,2-diphenylvinyl)phenyl]anthracene (DPVPA) can be given.

As the acceptor substance, organic compounds such as 7,7,8,8-tetracyano-2,3,5,6-tetrafluoroquinodimethane (F$_4$-TCNQ) and chloranil; transition metal oxide can be given. In addition, oxide of metal belonging to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable since they have a high electron-accepting property. Among them, molybdenum oxide is especially preferable since it is stable in air, has a low hygroscopic property, and is easily handled.

Note that the composite material may be formed using the above-described acceptor substance and a high molecular compound such as poly(N-vinylcarbazole) (PVK), poly(4-vinyltriphenylamine) (PVTPA), poly[N-(4-{N'-[4-(4-diphenylamino)phenyl]phenyl-N'-phenylamino}phenyl)methacrylamide] (PTPDMA), or poly[N,N'-bis(4-butylphenyl)-N,N'-bis(phenyl)benzidine (poly-TPD) to be used for the first layer 111.

The second layer 112 which is a hole-transporting layer contains a substance having a high hole-transporting property. As the substance having a high hole-transporting property, the following can be used, for example: an aromatic amine compound such as NPB (or α-NPD), TPD, 4,4'-bis[N-(9,9-dimethylfluoren-2-yl)-N-phenylamino]biphenyl (DFLDPBi), or 4,4'-bis[N-(spiro-9,9'-bifluoren-2-yl)-N-phenylamino]-biphenyl (BSPB); 4,4'-di(N-carbazolyl)biphenyl (CBP); 2,7-di(N-carbazolyl)-spiro-9,9'-bifluorene (SFDCz); 4,4',4"-tris[N-(3-methylphenyl)-N-phenylamino]triphenylamine (MTDATA); N-[4-(9H-carbazol-9-yl)phenyl]-N-phenyl-spiro-9,9'-bifluoren-2-amine (YGASF), N,N'-bis[4-(9H-carbazol-9-yl)phenyl-N,N'-diphenylvinyl-4,4'-diamine (YGABP); 4-(9H-carbazol-9-yl)-2'-phenyltriphenylamine (o-YGA1BP); 4-(9H-carbazol-9-yl)-3'-phenyltriphenylamine (m-YGA1BP); 4-(9H-carbazol-9-yl)-4'- phenyltriphenylamine (p-YGA1BP); 1,3,5-tris(N-carbazolyl)benzene (TCzB); or 4,4',4"-tris(N-carbazolyl)triphenylamine (TCTA) which is a low molecular organic compound; or PVK, PVTPA, PTPDMA, or Poly-TPD which is a high molecular compound.

Note that the above-described materials each mainly have a hole mobility of greater than or equal to $10^{-6}$ cm$^2$/V$_s$. Note that known materials other than the above-described materials can be used as long as they have a hole-transporting property which is higher than an electron-transporting property.

In Embodiment Mode 1, although the above-described substance can be used for the first layer 111 and the second layer 112, it is necessary to select a substance so that the highest occupied molecular orbital level (HOMO level) (the absolute value) of a material used for the second layer 112 becomes deeper (larger) than that of a substance used for the first layer 111.

Note that, of the above-described materials, the HOMO level of NPB is −5.27 [eV], the HOMO level of YGASF is −5.44 [eV], the HOMO level of YGABP is −5.40 [eV], the HOMO level of o-YGA1BP is −5.43 [eV], and the HOMO level of m-YGA1BP is −5.50 [eV]. Thus, in the case of the structure shown in FIG. 1A, for example, it is possible to employ a combination in which a composite material of NPB whose HOMO level is −5.27 and molybdenum oxide is used for the first layer 111 and YGASF whose HOMO level is −5.44 is used for the second layer 112.

With the above-described structure, the injection amount of holes from the first layer (the hole-injecting layer) 111 into the second layer (the hole-transporting layer) 112 can be suppressed, and furthermore, the injection amount of holes into the third layer (the light-emitting layer) 113 can be suppressed. Thus, increase in element efficiency can be achieved.

The third layer 113 is a light-emitting layer containing a substance having a high light-transmitting property. Low molecular organic compounds described below can be used for the third layer 113.

As a light-emitting substance which exhibits bluish light emission, the following can be given: N,N'-bis[4-(9H-carbazol-9-yl)phenyl]-N,N-diphenylstilbene-4,4'-diamine (YGA2S), 4-(9H-carbazol-9-yl)-4'-(10-phenyl-9-anthryl)triphenylamine (YGAPA), and the like.

As a light-emitting substance which exhibits greenish light emission, the following can be given: N-(9,10-diphenyl-2-anthryl)-N,9-diphenyl-9H-carbazol-3-amine (2PCAPA), N-[9,10-bis(1,1'-biphenyl-2-yl)-2-anthryl]-N,9-diphenyl-9H-carbazol-3-amine (2PCABPhA), N-(9,10-diphenyl-2-anthryl)-N,N',N'-triphenyl-1,4-phenylenediamine (2DPAPA), N-[9,10-bis(1,1'-biphenyl-2-yl)-2-anthryl]-N,N',N'-triphenyl-1,4-phenylenediamine (2DPABPhA), 9,10-bis(1,1'-biphenyl-2-yl)-N-[4-(9H-carbazol-9-yl)phenyl]-N-phenylanthracen-2-amine (2YGABPhA), N,N,9-triphenylanthracene-9-amine (DPhAPhA), and the like.

As a light-emitting substance which exhibits yellowish light emission, the following can be given: rubrene, 5,12-bis(1,1'-biphenyl-4-yl)-6,11-diphenyltetracene (BPT), and the like. As a light-emitting substance which exhibits reddish light emission, the following can be given: N,N,N',N'-tetrakis(4-methylphenyl)tetracene-5,11-diamine (p-mPhTD), 7,13-diphenyl-N,N,N',N'-tetrakis(4-methylphenyl)acenaphtho[1,2-a]fluoranthene-3,10-d iamine (p-mPhAFD), and the like The third layer 113 may have a structure in which the above-described substance having a high light-emitting property is dispersed in another substance. Note that, in the case where the above-described substance is dispersed, the substance is preferably dispersed so that the concentration thereof becomes less than or equal to 20% of the total in mass ratio. Although known substances can be used as a substance which disperses a substance having a light-emitting property, it is preferable to use a substance whose lowest unoccupied molecular orbital level (LUMO level) (the absolute value) is deeper (larger) than that of the substance having a light-emitting property and highest occupied molecular orbital level (HOMO level) (the absolute value) is shallower (smaller) than that of the substance having a light-emitting property.

Specifically, the following metal complex can be used: tris(8-quinolinolato)aluminum (III) (Alq), tris(4-methyl-8-quinolinolato)aluminum (III) (Almq$_3$), bis(10-hydroxybenzo[h]quinolinato)beryllium (II) (BeBq$_2$), or bis(2-methyl-8-quinolinolato)(4-phenylphenolato)aluminum (III) (BAlq), bis(8-quinolinolato)zinc(II) (Znq), bis[2-(2-benzoxazolyl)phenolato]zinc(II) (ZnPBO), or bis[2-(2-benzothiazolyl)phenolato]zinc(II) (ZnBTZ).

Alternatively, the following heterocyclic compound can be used: 2-(4-biphenylyl)-5-(4-tert-butylphenyl)-1,3,4-oxadiazole (PBD), 1,3-bis[5-p-tert-butylphenyl)-1,3,4-oxadiazol-2-yl]benzene (OXD-7), 3-(4-biphenylyl)-4-phenyl-5-(4-tert-butylphenyl)-1,2,4-triazole (TAZ), 2,2',2"-(1,3,5-benzenetriyl)tris(1-phenyl-1H-benzimidazole) (TPBI), bathophenanthroline (BPhen), or bathocuproine (BCP).

Alternatively, the following condensed aromatic compound can also be used: 9-[4-(10-phenyl-9-anthryl)phenyl]-9H-carbazole (CzPA), 3,6-diphenyl-9-[4-(10-phenyl-9-anthryl)phenyl]-9H-carbazole (DPCzPA), 9,10-bis(3,5-diphenylphenyl)anthracene (DPPA), 9,10-di(2-naphthyl)anthracene (DNA), 2-tert-butyl-9,10-di(2-naphthyl)anthracene (t-BuDNA), 9,9'-bianthryl (BANT), 9,9'-(stilbene-3,3'-diyl)diphenanthrene (DPNS), 9,9'-(stilbene-4,4'-diyl)diphenanthrene (DPNS2), or 3,3',3"-(benzene-1,3,5-triyl)tripyrene (TPB3).

Alternatively, as a substance for dispersing a substance having a light-emitting property, plural kinds of substances can be used. For example, in order to control crystallization, a substance which controls crystallization, such as rubrene, may be further added. Furthermore, NPB, Alq, or the like may be added in order to efficiently transfer energy to the substance having a light-emitting property. With a structure in which a substance having a high light-emitting property is thus dispersed in another substance, crystallization of the third layer 113 can be suppressed. Furthermore, concentration quenching caused by high concentration of a substance having a high light-emitting property can also be suppressed.

Further, in particular, among the above-described substances, a substance having an electron-transporting property is preferably used so that a substance having a light-emitting property is dispersed therein to form the third layer 113. Specifically, CzPA, DNA, and t-BuDNA among the above-described condensed aromatic compounds, and furthermore, high molecular compounds to be given later as a substance which can be used for the fourth layer 114.

Alternatively, for the third layer 113, high molecular compounds given below can also be used.

As a light-emitting substance which exhibits bluish light emission, the following can be given: poly(9,9-dioctylfluorene-2,7-diyl) (PFO), poly[(9,9-dioctylfluorene-2,7-diyl-co-(2,5-dimethoxybenzene-1,4-diyl)] (PF-DMOP), poly{(9,9-dioctylfluorene-2,7-diyl)-co-[N,N'-di-(p-butylphenyl)-1,4-diaminobenzene]} (TAB-PFH), and the like.

As a light-emitting material which exhibits greenish light emission, the following can be given: poly(p-phenylenevinylene) (PPV), poly[(9,9-dihexylfluorene-2,7-diyl)-alt-co-(benzo[2,1,3]thiadiazol-4,7-diyl)] (PFBT), poly[(9,9-dioctyl-2,7-divinylenefluorenylene)-alt-co-(2-methoxy-5-(2-ethylhexyloxy)-1, 4-phenylene)], and the like.

As a light-emitting material which exhibits light emission in the range of orangish to reddish, the following can be given: poly[2-methoxy-5-(2'-ethylhexoxy)-1,4-phenylenevinylene] (MEH-PPV), poly(3-butylthiophene-2,5-diyl) (R4-PAT), poly{[9,9-dihexyl-2,7-bis(-cyanovinylene)fluorenylene]-alt-co-[2,5-bis(N,N'-diphenyl amino)-1,4-phenylene]}, poly{[2-methoxy-5-(2-ethylhexyloxy)-1,4-bis(-cyanovinylenephenylene)]-alt-co-[2,5-bis(N,N'-diphenylamino)-1, 4-phenylene]} (CN-PPV-DPD), and the like.

The fourth layer 114 is an electron-transporting layer which contains a substance having a high electron-transporting property. For the fourth layer 114, for example, as a low molecular organic compound, a metal complex, such as Alq, Almq$_3$, BeBq$_2$, BAlq, Znq, ZnPBO, or ZnBTZ, or the like can be used. Alternatively, instead of the metal complex, a heterocyclic compound such as PBD, OXD-7, TAZ, TPBI, BPhen, or BCP can be used. The substances given here are mainly substances having an electron mobility of greater than or equal to $10^{-6}$ cm$^2$/V$_s$. Note that any substance other than the above-described substances may be used for the electron-transporting layer as long as it is a substance in which an electron-transporting property is higher than a hole-transporting property. Further, the electron-transporting layer is not limited to a single layer but may have a stacked structure of two or more layers formed of the above-described substances.

For the fourth layer 114, a high molecular compound can also be used. For example, poly[(9,9-dihexylfluorene-2,7-diyl)-co-(pyridine-3,5-diyl)] (PF-Py), poly[(9,9-dioctylfluorene-2,7-diyl)-co-(2,2'-pyridine-6,6'-diyl)] (PF-BPy), or the like can be used.

The fifth layer 115 is an electron-injecting layer which contains a substance having a high electron-injecting property. For the fifth layer 115, an alkali metal, an alkaline earth metal, or a compound thereof such as lithium fluoride (LiF), cesium fluoride (CsF), or calcium fluoride (CaF$_2$) can be used. Alternatively, a layer formed of a substance having an electron-transporting property which contains an alkali metal, an alkaline earth metal, or a compound thereof, specifically, a layer formed of Alq which contains magnesium (Mg), or the like may be used. Note that in this case, electrons can be injected more efficiently from the second electrode 104.

For the second electrode 104, a metal, an alloy, an electrically conductive compound, a mixture thereof, or the like having a low work function (specifically a work function of greater than or equal to 3.8 eV) can be used. As specific examples of such cathode materials, elements belonging to Group 1 and 2 of the periodic table, that is, alkali metals such as lithium (Li) and cesium (Cs), alkaline earth metals such as magnesium (Mg), calcium (Ca), and strontium (Sr), alloys containing them (MgAg or AlLi), rare earth metals such as europium (Eu) and ytterbium (Yb), alloys containing them, and the like are given.

Note that in the case where the second electrode 104 is formed using an alkali metal, an alkaline earth metal, or an alloy thereof, a vacuum evaporation method or a sputtering method can be used. Alternatively, in the case of using a silver paste or the like, a coating method, an inkjet method, or the like can be used.

Note that by provision of the fifth layer 115, the second electrode 104 can be formed using any of a variety of conductive materials such as Al, Ag, ITO, and indium tin oxide containing silicon or silicon oxide regardless of whether the work function is high or low. These conductive materials can be deposited by a sputtering method, an inkjet method, a spin coating method, or the like.

As a formation method of the EL layer 103 in which the first layer 111, the second layer 112, the third layer 113, the fourth layer 114, and the fifth layer 115 are stacked in this order, any of a variety of methods can be employed regardless of whether the method is a dry process or a wet process. For example, a vacuum evaporation method, an inkjet method, a spin coating method, or the like can be used. Note that a different formation method may be employed for each layer.

The second electrode 104 can also be formed by not only a dry process such as a sputtering method or a vacuum evaporation method but also a wet process such as a sol-gel method using a paste of a metal material.

In the above-described light-emitting element of the present invention, current flows due to a potential difference generated between the first electrode 102 and the second electrode 104 and holes and electrons recombine in the EL layer 103, so that light is emitted. Then, this emitted light is extracted through one or both of the first electrode 102 and the second electrode 104. Accordingly, one or both of the first electrode 102 and the second electrode 104 is/are an electrode having a light-transmitting property.

Figure 3A:
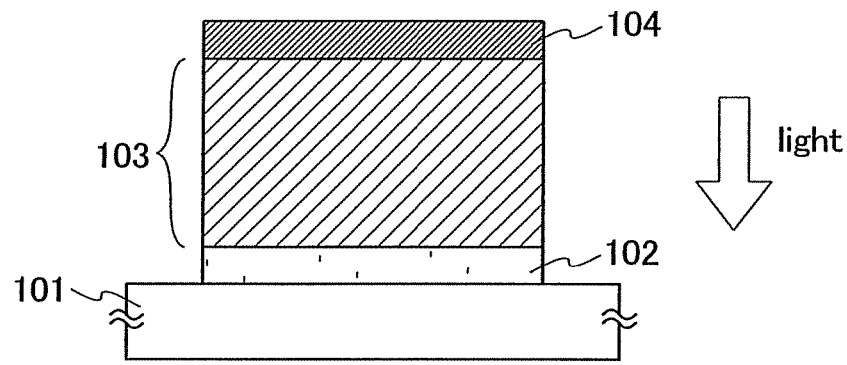
FIGS. 3A to 3C are views each illustrating a mode of emission of a light-emitting element in Embodiment Mode 1.
Figure 3B:
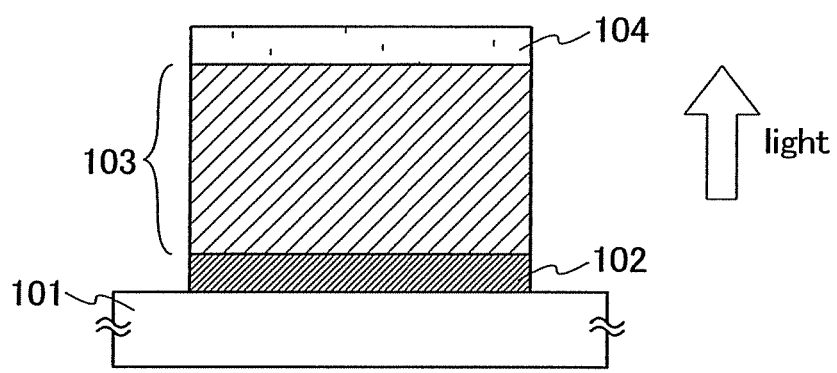
Figure 3C:
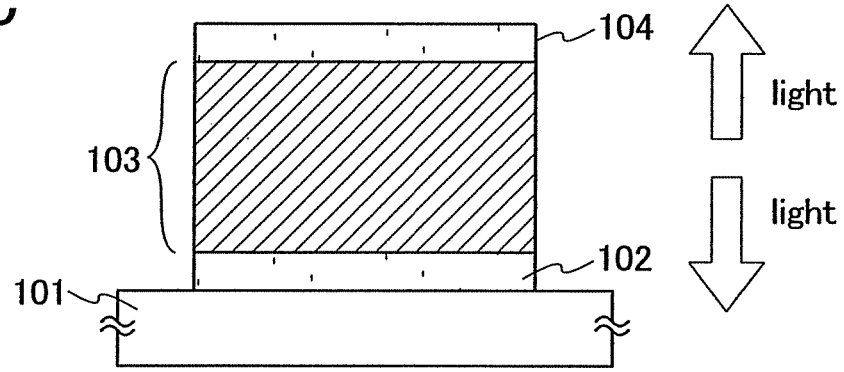

Note that in the case where only the first electrode 102 is an electrode having a light-transmitting property, light emitted from the EL layer 103 is extracted from the substrate 101 side through the first electrode 102, as shown in FIG. 3A. Alternatively, in the case where only the second electrode 104 is an electrode having a light-transmitting property, light emitted from the EL layer 103 is extracted from the side opposite to the substrate 101 side through the second electrode 104, as shown in FIG. 3B. Further alternatively, when the first electrode 102 and the second electrode 104 are both electrodes having a light-transmitting property, light emitted from the EL layer 103 is extracted to both the substrate 101 side and the opposite side, through the first electrode 102 and the second electrode 104, as shown in FIG. 3C.

Note that the structure of the layers provided between the first electrode 102 and the second electrode 104 is not limited to the above-described structure. Note that any structure other than the above-described structure may be used as long as it includes at least the first layer 111 which is a hole-injecting layer, the second layer 112 which is a hole-transporting layer, and the third layer 113 which is a light-emitting layer, and the first layer 111 is formed of a composite material, and substances are selected so that the highest occupied molecular orbital level (HOMO level) (the absolute value) of the substance used for the second layer 112 is deeper (larger) than that of the substance used for the first layer 111.

Alternatively, as shown in FIG. 2B, a structure may be employed in which the second electrode 104 functioning as a cathode, the EL layer 103, and the first electrode 102 functioning as an anode are stacked in this order over the substrate 101. Note that the EL layer 103 in this case has a structure in which the fifth layer 115, the fourth layer 114, the third layer 113, the second layer 112, the first layer 111, and the first electrode 102 are stacked in this order over the second electrode 104.

Note that with use of the light-emitting element of the present invention, a passive matrix light-emitting device or an active matrix light-emitting device in which drive of the light-emitting element is controlled by a thin film transistor (TFT) can be manufactured.

Note that there is no particular limitation on the structure of the TFT in the case of manufacturing an active matrix light-emitting device. For example, a staggered TFT or an inverted staggered TFT can be used as appropriate. Further, a driver circuit formed over a TF substrate may be formed of both of an n-type TFT and a p-type TFT or only either an n-type TFT or a p-type TFT. Furthermore, there is no particular limitation on crystallinity of a semiconductor film used for the TFT. An amorphous semiconductor film may be used, or a crystalline semiconductor film may be used.

In the light-emitting element described in this embodiment mode, the injection amount of holes from the first layer (the hole-injecting layer) 111 into the second layer (the hole-transporting layer) 112 can be controlled by provision of the first layer (the hole-injecting layer) 111 and the second layer (the hole-transporting layer) 112 so that the highest occupied molecular orbital level (HOMO level) (the absolute value) of the second layer 112 is deeper (larger) than that of the first layer (the hole-injecting layer) 111. Accordingly, the injection amount of holes into the third layer (the light-emitting layer) 113 can be suppressed; thus, increase in element efficiency can be achieved. Moreover, the first layer (the hole-injecting layer) 111 is formed using a composite material in which an acceptor substance is contained in a substance having a high hole-transporting property, whereby not only can element efficiency be increased but also increase in driving voltage can be kept to the minimum.

[Embodiment Mode 2]

In Embodiment Mode 2, a light-emitting element of the present invention which has a structure which reduces the electron transport rate in addition to the structure described in Embodiment Mode 1, which controls the injection amount of holes, will be described.

A light-emitting element in Embodiment Mode 2 includes a first electrode, a second electrode, and an EL layer provided between the first electrode and the second electrode. In the EL layer, at least a hole-injecting layer, a hole-transporting layer, a light-emitting layer, and a carrier-controlling layer are sequentially stacked from the first electrode side; and it is acceptable as long as the hole-injecting layer is formed of a composite material, and the hole-transporting layer and the hole-injecting layer are provided so that the HOMO level (the absolute value) of the hole-transporting layer becomes deeper (higher) than that of the hole-injecting layer. There is no particular limitation on other layers.

Figure 4:
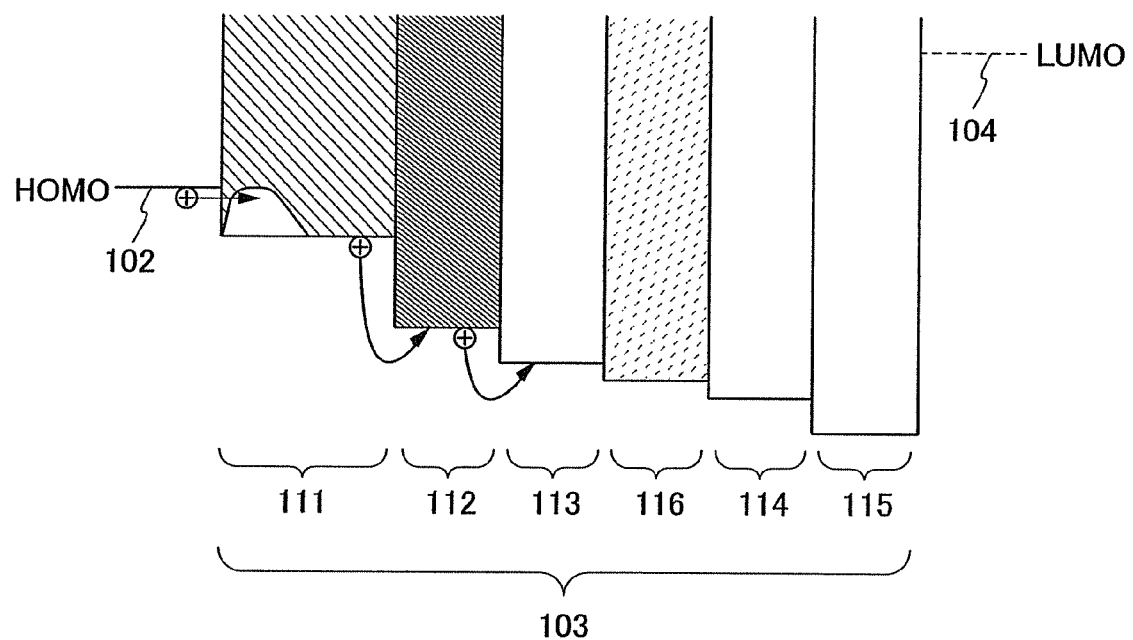
FIG. 4 is a view illustrating a band structure of a light-emitting element in Embodiment Mode 2.

The case will be described where, as shown in FIG. 4, the EL layer 103 has a structure in which the first layer (the hole-injecting layer) 111, the second layer (the hole-transporting layer) 112, the third layer (the light-emitting layer) 113, the sixth layer (the carrier-controlling layer) 116, the fourth layer (the electron-transporting layer) 114, and the fifth layer (the electron-injecting layer) 115 are stacked from the first electrode 102 side.

In the EL layer 103 of the light-emitting element shown in FIG. 4, the first layer (the hole-injecting layer) 111 is formed of a composite material in which an acceptor substance is contained in a substance having a high hole-transporting property; thus, the Fermi level is shifted and band heading occurs near the interface between the first layer (the hole-injecting layer) 111 and the first electrode 102. Accordingly, injection barrier near the interface between the first electrode 102 and the first layer (the hole-injecting layer) 111 becomes small (or disappears actually), and thus tunnel injection of holes from the first electrode 102 to the first layer (the hole-injecting layer) 111 becomes possible as if ohmic contact was formed.

The second layer (the hole-transporting layer) 112 and the first layer (the hole-injecting layer) 111 are provided so that the highest occupied molecular orbital level (HOMO level) (the absolute value) of the second layer (the hole-transporting layer) 112 becomes higher (larger) than that of the first layer (the hole-injecting layer) 111. Such a structure makes it possible to suppress the injection amount of holes into the second layer (the hole-transporting layer) 112 from the first layer (hole-injecting layer) 111. Thus, the injection amount of holes into the third layer (the light-emitting layer) 113 can be suppressed more in the case of the structure than in the case where an energy gap by the second layer (the hole-transporting layer) 112 is not provided. Note that, specifically, the absolute value of the HOMO level of the second layer 112 is preferably larger than that of the HOMO level of the first layer 111 by greater than or equal to 0.1 eV.

Note that with the structure shown in FIG. 4, the injection amount of holes into the third layer (the light-emitting layer) 113 can be suppressed. Moreover, by provision of the sixth layer (the carrier-controlling layer) 116 between the second electrode 104 and the third layer (the light-emitting layer) 113, the electron transport rate until reaching the third layer (the light-emitting layer) 113 from the second electrode 104 can be reduced; thus, balance of carriers (electrons and holes) which are recombined in the third layer (the light-emitting layer) 113 can be improved and higher efficiency of the element can be achieved.

The structure of the present invention shown in FIG. 4 is effective especially in the case where the third layer (the light-emitting layer) 113 contains a substance having an electron-transporting property. In the case where the third layer (the light-emitting layer) 113 contains a substance having an electron-transporting property, a light-emitting region is located near the interface between the third layer (the light-emitting layer) 113 and the second layer (the hole transporting layer) 112. Then, if cation is generated near the interface due to excessive holes, luminous efficiency is significantly decreased because cation serves as a quencher. However, since the structure of the present invention suppresses the injection amount of holes, generation of cation around the third layer (the light-emitting layer) 113 and decrease in luminous efficiency can be suppressed. Thus, a light-emitting element having high luminous efficiency can be formed.

In Embodiment Mode 2, the first electrode 102 functions as an anode and the second electrode 104 functions as a cathode. In other words, when voltage is applied to each electrode so that the potential of the first electrode 102 is higher than that of the second electrode 104, light can be emitted.

Figure 5A:
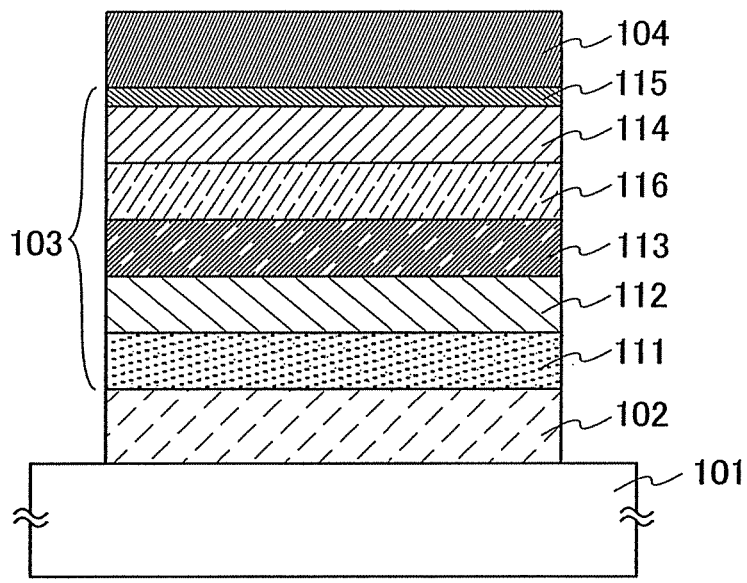
FIGS. 5A and 5B are views each illustrating a stacked structure of a light-emitting element in Embodiment Mode 2.

Next, a structure of a light-emitting element in Embodiment Mode 2 will be described with reference to FIGS. 5A and 5B. The substrate 101 is used as a support of the light-emitting element. Note that for the substrate 101, any of those described in Embodiment Mode 1 can be used.

For the first electrode 102 formed over the substrate 101, a metal, an alloy, an electrically conductive compound, a mixture thereof, or the like having a high work function (specifically a work function of greater than or equal to 4.0 eV) is preferably used, and a substance similar to those described in Embodiment Mode 1 can be used.

In the EL layer 103 formed over the first electrode 102, the structure of the first layer (the hole-injecting layer) 111, the second layer (hole-transporting layer) 112, and the third layer (the hole-transporting layer) 113 which are stacked in this order from the first electrode 102 side, and a formation method and a material which can be used for each layer are similar to those of Embodiment Mode 1. Therefore, description thereof is omitted in Embodiment Mode 2.

In addition to the structure described in Embodiment Mode 1, Embodiment Mode 2 has a feature of providing, between the third layer (light-emitting layer) 113 and the second electrode 104, the sixth layer (hereinafter, the layer is referred to as a "carrier-controlling layer") 116 which reduces the carrier (electron) transport rate; however, for the structure of the carrier-controlling layer, two kinds of methods (a method for kinetically controlling the carrier transport rate and a method for thermodynamically controlling the rate of transport of carriers) can be used.

Figure 6A:
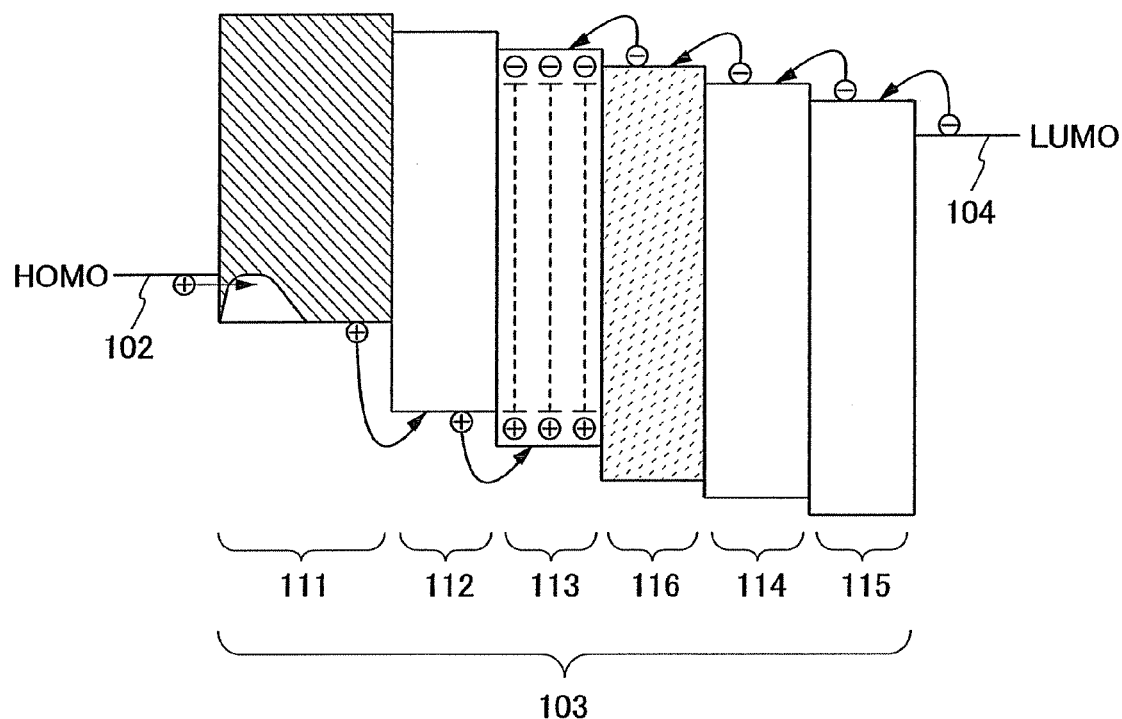
FIGS. 6A and 6B are views illustrating a mode of emission of a light-emitting element in Embodiment Mode 2.
Figure 6B:
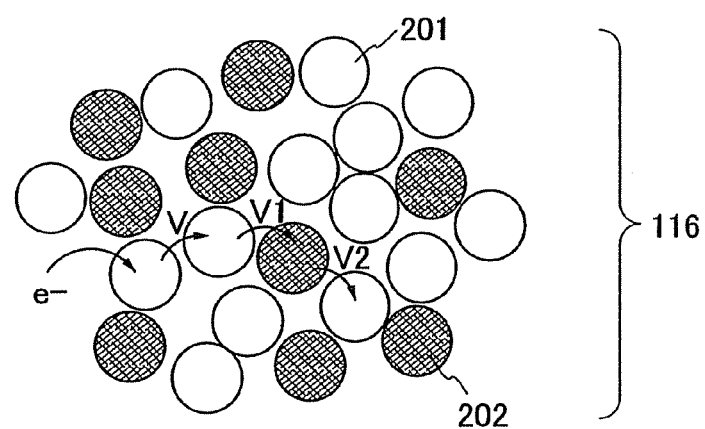

As the first method, the case of kinetically reducing the carrier (electron) transport rate by the sixth layer (the carrier-controlling layer) 116 will be described. FIGS. 6A and 6B are conceptual diagrams thereof.

The EL layer 103 is formed between the first electrode 102 and the second electrode 104. As a plurality of layers included in the EL layer 103, from the first electrode 102 side, the first layer (the hole-injecting layer) 111, the second layer (the hole-transporting layer) 112, the third layer (the light-emitting layer) 113, the sixth layer (the carrier-controlling layer) 116, the fourth layer (the electron-transporting layer) 114, and the fifth layer (the electron-injecting layer) 115 are formed in this order.

The sixth layer (the carrier-controlling layer) 116 is formed of two or more kinds of organic compounds. Here, the case where the sixth layer (the carrier-controlling layer) 116 is formed of two kinds of organic compounds, a first organic compound 201 and a second organic compound 202, as shown in FIG. 6B, is described. Note that an organic compound having a high electron-transporting property (an electron-transporting organic compound) is used as the first organic compound 201 and an organic compound having a high hole-transporting property (a hole-transporting organic compound) is used as the second organic compound 202.

The organic compounds used for the second organic compound 202 and the first organic compound 201 have LUMO levels close to each other. Specifically, a difference between the absolute value of the lowest unoccupied molecular orbital level (LUMO level) of the second organic compound 202 and the absolute value of the LUMO level of the first organic compound 201 are preferably less than or equal to 0.3 eV, more preferably less than or equal to 0.2 eV. That is, it is preferable that electrons which are carriers be easily transported between the first organic compound 201 and the second organic compound 202.

In this case, since the second organic compound 202 has a LUMO level as close as that of the first organic compound 201, electrons can be injected. The rate ($v_1$) of electron injection from the first organic compound 201 having an electron-transporting property into the second organic compound 202 having a hole-transporting property or the rate ($v_2$) of electron injection from the second organic compound 202 into the first organic compound 201 is smaller than the rate (v) of electron injection between the first organic compounds 201.

Thus, by formation of the sixth layer 116 with use of the first organic compound 201 having an electron-transporting property and the second organic compound 202 having a hole-transporting property, the electron transport rate in the sixth layer 116 can be reduced in comparison with the case where the sixth layer 116 is formed of only the first organic compound 201. That is, by formation of the sixth layer 116 with use of the first organic compound 201 and the second organic compound 202, the carrier (electron) transport rate in the sixth layer 116 can be reduced.

Note that in the case where the sixth layer 116 is formed of the first organic compound 201 and the second organic compound 202, the concentration is preferably controlled so that the content of the second organic compound 202 is less than 50% of the total in mass ratio. Further preferably, the concentration is controlled so that the content of the second organic compound 202 is greater than or equal to 1 wt % and less than or equal to 20 wt % of the total.

Note that as the first organic compound 201 contained in the seventh layer 117, specifically, the following can be used: a metal complex such as Alq, Almq$_3$, BeBq$_2$, BAlq, Znq, ZnPBO, or ZnBTZ; a heterocyclic compound such as PBD, OXD-7, TAZ, TPBI, BPhen, or BCP; and a condensed aromatic compound such as CzPA, DPCzPA, DPPA, DNA, t-BuDNA, BANT, DPNS, DPNS2, or TPB3. Alternatively, a high molecular compound such as poly[(9,9-dihexylfluorene-2,7-diyl)-co-(pyridine-3,5-diyl)] (PF-Py) or poly[(9,9-dioctylfluorene-2,7-diyl)-co-(2,2'-pyridine-6,6'-diyl)] (PF-BPy) can be used.

Further, for the second organic compound 202 contained in the sixth layer 116, specifically, the following can be used: a condensed aromatic hydrocarbon such as 9,10-diphenylanthracene (DPAnth) or 6,12-dimethoxy-5,11-diphenylchrysene; an aromatic amine compound such as N,N-dipheyl-9-[4-(10-phenyl-9-anthryl)phenyl]-9H-carbazol-3-amine (CzA1PA), 4-(10-phenyl-9-anthryl)triphenylamine (DPhPA), N,9-diphenyl-N-[4-(10-phenyl-9-anthryl)phenyl]-9H-carbazol-3-amine (PCAPA), N,9-diphenyl-N-{4-[4-(10-phenyl-9-anthryl)phenyl]phenyl}9H-carbazol-3-amine (PCAPBA), N-(9,10-diphenyl-2-anthryl)-N,9-diphenyl-9H-carbazol-3-amine (2PCAPA), NPB (or α-NPD), TPD, DFLDPBi, or BSPB; a compound having an amino group, such as coumarin 7 or coumarin 30 can be used. Alternatively, a high molecular compound such as PVK, PVTPA, PTPDMA, or Poly-TPD can be used.

The above-described materials are combined with each other to form the sixth layer 116, and accordingly transport of electrons from the first organic compound 201 to the second organic compound 202 or from the second organic compound 202 to the first organic compound 201 is suppressed, so that the electron transport rate of the sixth layer 116 can be suppressed. Further, since the sixth layer 116 has a structure in which the second organic compound 202 is dispersed in the first organic compound 201, crystallization or aggregation with time is not easily caused. Thus, the above-described effect of suppressing electron transport does not easily change with time. As a result, the carrier balance also does not easily change with time. This leads to increase in the lifetime of the light-emitting element, that is, improvement in reliability.

Note that among the above-described combinations, a combination of a metal complex as the first organic compound 201 and an aromatic amine compound as the second organic compound 202 is preferable. A metal complex has a large dipole moment as well as a high electron-transporting property, whereas an aromatic amine compound has a relatively small dipole moment as well as a high hole-transporting property. Thus, by combination of substances whose dipole moments greatly differ from each other, the above-described effect of suppressing electron transport can be further increased. Specifically, where the dipole moment of the first organic compound 201 is $P_1$ and the dipole moment of the second organic compound 202 is $P_2$, a combination satisfying $P_1/P_2 \geq 3$ is preferable.

For example, the dipole moment of Alq which is a metal complex is 9.40 debye, and the dipole moment of 2PCAPA which is an aromatic amine compound is 1.15 debye. Accordingly, in the case where an organic compound having an electron-transporting property, such as a metal complex, is used as the first organic compound 201 and an organic compound having a hole-transporting property, such as an aromatic amine compound, is used as the second organic compound 202, it is preferable to obtain $P_1/P_2 \geq 3$.

An emission color of the second organic compound contained in the sixth layer 116 and an emission color of the substance having a high light-emitting property which is contained in the third layer (the light-emitting layer) 113 are preferably similar colors. Specifically, a difference between the peak value of the emission spectrum of the second organic compound 202 and the peak value of the emission spectrum of the substance having a high light-emitting property is preferably within 30 nm. The difference within 30 nm allows the emission color of the second organic compound 202 and the emission color of the substance having a high light-emitting property to be similar colors. Therefore, even if the second organic compound 202 emits light due to change in voltage or the like, change in emission color can be suppressed.

Figure 7:
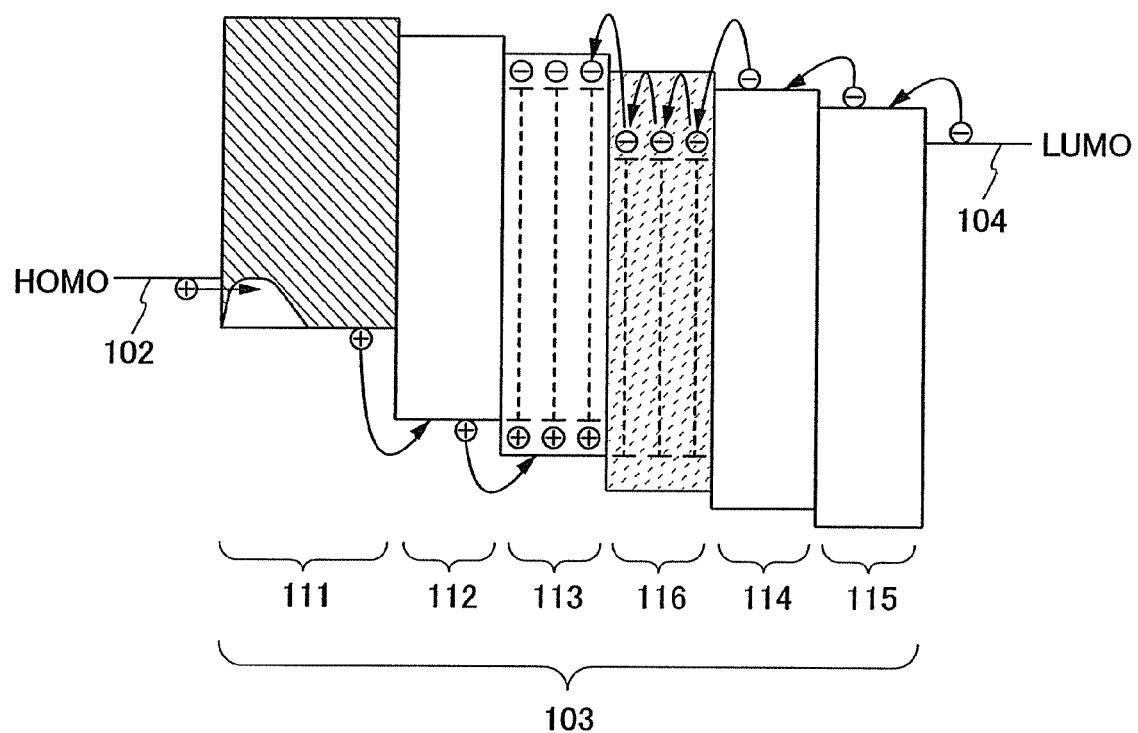
FIG. 7 is a view illustrating a band structure of a light-emitting element in Embodiment Mode 2.

As the second method, the case of thermodynamically reducing the carrier (electron) transport rate by the sixth layer (the carrier-controlling layer) 116 will be described. FIG. 7 is a conceptual diagram (a band diagram) thereof.

The EL layer 103 is included between the first electrode 102 and the second electrode 104. As a plurality of layers included in the EL layer 103, from the first electrode 102 side, the first layer (the hole-injecting layer) 111, the second layer (the hole-transporting layer) 112, the third layer (the light-emitting layer) 113, the sixth layer (the carrier-controlling layer) 116, the fourth layer (the electron-transporting layer) 114, and the fifth layer (the electron-injecting layer) 115 are formed in this order.

The sixth layer (the carrier-controlling layer) 116 is formed of two or more kinds of organic compounds. Here, the case where the sixth layer (the carrier-controlling layer) 116 is formed of two kinds of organic compounds, a first organic compound 203 and a second organic compound 204 is described. Note that an organic compound having a high electron-transporting property (an electron-transporting organic compound) is used as the first organic compound 203 and an organic compound having a function of trapping electrons (an electron-trapping organic compound) is used as the second organic compound 204.

The organic compounds used as the first organic compound 203 and the second organic compound 204 have LUMO levels that are apart from each other. Specifically, the absolute value of the lowest unoccupied molecular orbital level (LUMO level) of the second organic compound 204 is preferably larger than the absolute value of the LUMO level of the first organic compound 203 by greater than or equal to 0.3 eV.

As shown in FIG. 7, holes are injected from the first electrode 102 into the third layer (the light-emitting layer) 114 through the first layer 111 and the second layer 112. On the other hand, electrons are injected from the second electrode 104 into the sixth layer (the carrier-controlling layer) 116 through the fifth layer 115 and the fourth layer 114. Since the sixth layer 116 is formed of the first organic compound 203 having an electron-transporting property and the second organic compound 204 having an electron-trapping property, electrons injected into the sixth layer 116 enters the LUMO level of the second organic compound 204, not that of the first organic compound 203. Accordingly, the electron transport rate can be reduced.

Thus, by formation of the sixth layer 116 with use of the first organic compound 203 having an electron-transporting property and the second organic compound 204 having an electron-trapping property, the electron transport rate in the sixth layer 116 can be reduced more than in the case where the sixth layer 116 is formed of only the first organic compound 203. That is, by formation of the sixth layer 116 with use of the first organic compound 203 and the second organic compound 204, the carrier (electron) transport rate in the sixth layer 116 can be reduced.

Note that. in the case where the sixth layer 116 is formed of the first organic compound 203 and the second organic compound 204, the concentration is controlled so that the content of the second organic compound 204 is preferably less than 50% of the total in mass ratio. Further preferably, the concentration is controlled so that the content of the second organic compound 204 is greater than or equal to 0.1 wt % and less than or equal to 5 wt % of the total.

Note that for the first organic compound 203 contained in the sixth layer 116, specifically, a metal complex such as Alq, Almq$_3$, BeBq$_2$, BAlq, Znq, BAlq, ZnPBO, or ZnBTZ; a heterocyclic compound such as PBD, OXD-7, TAZ, TPBI, BPhen, or BCP; or a condensed aromatic compound such as CzPA, DPCzPA, DPPA, DNA, t-BuDNA, BANT, DPNS, DPNS2, or TPB3 can be used.

Alternatively, a high molecular compound such as poly[(9,9-dihexylfluorene-2,7-diyl)-co-(pyridine-3,5-diyl)] (PF-Py) or poly[(9,9-dioctyllfluorene-2,7-diyl)-co-(2,2'-pyridine-6,6'-diyl)] (PF-BPy) can be used. In particular, a metal complex is preferably stable with respect to electrons.

For the second organic compound 204 contained in the sixth layer 116, any of substances given below can be used. Note that, although the second organic compound 204 itself may emit light, in that case, the emission color of the third layer (the light-emitting layer) 113 and the emission color of the second organic compound 204 are preferably similar colors in order to keep the color purity of the light-emitting element.

For example, in the case where an organic compound contained in the third layer 113 is an organic compound which exhibits bluish light emission, such as YGA2S or YGAPA, the second organic compound 204 is preferably a compound which exhibits emission in the range of blue to blue green light, such as acridone, coumarin 102, coumarin 6H, coumarin 480D, or coumarin 30.

Further, in the case where the organic compound contained in the third layer (the light-emitting layer) 113 is an organic compound which exhibits greenish light emission, such as 2PCAPA, 2PCABPhA, 2DPAPA, 2DPABPhA, 2YGABPhA, or DPhAPhA, the second organic compound 204 is preferably a compound that exhibits light emission in the range of bluish green to yellowish green, such as N,N'-dimethylquinacridone (DMQd), N,N'-diphenylquinacridone (DPQd), 9,18-dihydrobenzo[h]benzo[7,8]quino[2,3-b]acridine-7,16-dione (DMNQd-1), 9,18-dihydro-9,18-dihydrobenzo[h]benzo[7,8]quino[2,3-b]acridine-7,16-dione (DMNQd-2), coumarin 30, coumarin 6, coumarin 545T, or coumarin 153.

Alternatively, when the organic compound contained in the third layer (the light-emitting layer) 113 is an organic compound which exhibits yellowish light emission, such as rubrene or BPT, the second organic compound 204 is preferably a substance which exhibits light emission in the range of yellowish green to yellowish orange, such as DMQd or (2-{2-[4-(9H-carbazol-9-yl)phenyl]ethenyl}-6-methyl-4H-pyran-4-ylidene)propanedinit rile (DCMCz).

Alternatively, when the organic compound contained in the third layer (the light-emitting layer) 113 is an organic compound which exhibits reddish light emission, such as p-mPhTD or p-mPhAFD, the second organic compound 204 is preferably a substance which exhibits light emission in the range of orange to red, such as 2-{2-[4-(dimethylamino)phenyl]ethenyl}-6-methyl-4H-pyran-4-ylidene)propanedinitrile (DCM1), {2-methyl-6-[2-(2,3,6,7-tetrahydro-1H,5H-benzo

[ij]quinolizin-9-yl)ethenyl]-4H-pyran-4-ylidene}propanedinitrile (DCM2), {2-(1,1-dimethylethyl)-6-[2-(2,3,6,7-tetrahydro-1,1,7,7-tetramethyl-1H,5H-benzo[ij]quinolizin-9-yl)ethenyl]-4H-pyran-4-ylidene}propanedinitrile (DCJTB), or Nile red.

In the case where the light-emitting material contained in the third layer (the light-emitting layer) 113 is a phosphorescent material, the second organic compound 204 is preferably also a phosphorescent compound. For example, when the light-emitting material is Ir(btp)$_2$(acac) given above, which exhibits red light emission, the second organic compound 204 may be a red phosphorescent material such as (acetylacetonato)bis[2,3-bis(4-fluorophenyl)quinoxalinato]iridium(III) (Ir(Fdpq)$_2$(acac)). Note that these compounds are compounds having low LUMO levels among compounds which are used for light-emitting elements. Thus, by addition of such a compound to the above-described first organic compound 203, an excellent electron-trapping property can be exhibited.

For the second organic compound 204, among the compounds given above, a quinacridone derivative such as DMQd, DPQd, DMNQd-1, or DMNQd-2 is preferably used because it is chemically stable. That is, by application of the quinacridone derivative, the lifetime of the light-emitting element can be particularly extended. Further, since the quinacridone derivative exhibits greenish light emission, the element structure of the light-emitting element of the present invention is particularly effective for a greenish light-emitting element. Since green is a color which needs the highest luminance in manufacturing a full-color display, there is a case where a greenish light-emitting element deteriorates faster than light-emitting elements of other colors in some cases. However, such a problem can be suppressed by application of the present invention.

Note that as described above, the absolute value of the LUMO level of the second organic compound 204 is preferably larger than the absolute value of the LUMO level of the first organic compound 203 by greater than or equal to 0.3 eV. Therefore, the first organic compound 203 may be selected as appropriate so as to satisfy the above-described condition depending on the kind of the substance used for the second organic compound 204.

Furthermore, the emission color of the substance having a high light-emitting property contained in the third layer 113 and the emission color of the second organic compound 204 contained in the sixth layer 116 are preferably similar colors. Thus, a difference between the peak value of the emission spectrum of the substance having a high light-emitting property and the peak value of the emission spectrum of the second organic compound 204 is preferably within 30 nm. The difference within 30 nm allows the emission color of the substance having a high light-emitting property and the emission color of the second organic compound 204 to be similar colors. Therefore, even if the second organic compound emits light due to change in voltage or the like, change in emission color can be suppressed.

Note that the second organic compound 204 does not necessarily emit light. For example, in the case where the substance having a high light-emitting property has higher luminous efficiency, it is preferable to control the concentration of the second organic compound 204 in the sixth layer 116 so that only light emission of the substance having a high light-emitting property can be substantially obtained (to set the concentration of the second organic compound 204 to be slightly lower than that of the substance having a high light-emitting property so that light emission of the second organic compound 204 can be suppressed). In this case, the emission color of the substance having a high light-emitting property and the emission color of the second organic compound 204 are similar colors (i.e., they have substantially the same levels of energy gaps). Therefore, energy is not easily transferred from the substance having a high light-emitting property to the second organic compound 204, and thus high luminous efficiency can be obtained.

Note that in such a case, the second organic compound 204 is preferably a coumarin derivative such as coumarin 102, coumarin 6H, coumarin 480D, coumarin 30, coumarin 6, coumarin 545T, or coumarin 153. Because a coumarin derivative has a relatively low electron-trapping property, the concentration of the coumarin derivative added to the first organic compound 203 may be relatively high. That is, the concentration can be easily controlled, and a layer having desired properties for controlling transport of carriers can be formed. Further, since a coumarin derivative has high luminous efficiency, decrease in efficiency of the whole light-emitting element can be suppressed even if the second organic compound 204 emits light.

Note that the sixth layer 116 in the present invention can be formed by the above-described two kinds of methods (a method for kinetically controlling transport of carriers and a method for thermodynamically controlling transport of carriers), and the thickness of the sixth layer 116 is preferably greater than or equal to 5 nm and less than or equal to 20 nm in either structure. This is because if the thickness is larger, excessive decrease in the electron transport rate leads to an increase in driving voltage, whereas if the thickness is smaller, a function of controlling carrier transport could be impaired.

Since the sixth layer 116 in the present invention is a layer for controlling the electron transport rate, the sixth layer 116 may be formed between the second electrode 104 and the third layer (the light-emitting layer) 113. More preferably, the sixth layer 116 is formed in contact with the third layer (the light-emitting layer) 113. The sixth layer 116 is provided so as to be in contact with the third layer (the light-emitting layer) 113, injection of electrons into the third layer (the light-emitting layer) 113 can be directly controlled; thus, change in carrier balance in the third layer (the light-emitting layer) 113 with time can be further suppressed, and a large effect can be obtained in terms of improvement in the lifetime of the element.

Note that in the case where the sixth layer 116 is formed in contact with the third layer (the light-emitting layer) 113, the first organic compound (201 and 203) contained in the sixth layer 116 and the organic compound contained in the third layer (the light-emitting layer) 113 in large amounts are preferably different organic compounds. In particular, in the case where the third layer (the light-emitting layer) 113 contains a substance (a third organic compound) in which a substance having a high light-emitting property is dispersed and the substance having a high light-emitting property (a fourth organic compound), the third organic compound and the first organic compound (201 and 203) are preferably different organic compounds. With such a structure, the transport of carriers (electrons) from the sixth layer 116 to the third layer (the light-emitting layer) 113 is suppressed also between the first organic compound (201 and 203) and the third organic compound, and the effect obtained by the provision of the sixth layer 116 can be further enhanced.

Further, since the sixth layer 116 contains two or more kinds of substances, the carrier balance can be precisely controlled by control of a combination of substances, the mixture ratio thereof, the thickness of the layer, or the like. Thus, the carrier balance can be controlled more easily than in the conventional manner. Furthermore, since transport of carriers is controlled using the organic compound, the mixture ratio of which is smaller in the sixth layer 116, the carrier balance does not easily change in comparison with the case of control using one substance. Accordingly, a light-emitting element which does not easily change with time and has a long lifetime can be realized.

In the EL layer 103, although the fourth layer (the electron-transporting layer) 114 and the fifth layer (the electron-injecting layer) 115 are stacked in this order over the above-described sixth layer (the carrier-controlling layer) 116, the structure thereof, a formation method, and a material which can be used for each layer are similar to those described in Embodiment Mode 1. Thus, description thereof is omitted in Embodiment Mode 2.

Next, the second electrode 104 is formed over the fifth layer (the electron-injecting layer) 115. Note that a formation method and a material which can be used for the second electrode 104 are also similar to those described in Embodiment Mode 1. Thus, the description thereof is omitted in Embodiment Mode 2.

Also in Embodiment Mode 2, in the case where only the first electrode 102 is an electrode having a light-transmitting property, light emitted from the EL layer 103 is extracted from the substrate 101 side through the first electrode 102, as shown in FIG. 3A. Alternatively, when only the second electrode 104 is an electrode having a light-transmitting property, light emitted from the EL layer 103 is extracted from the side opposite to the substrate 101 side through the second electrode 104, as shown in FIG. 3B. Further alternatively, when the first electrode 102 and the second electrode 104 are both electrodes having a light-transmitting property, light emitted from the EL layer 103 is extracted from both the substrate 101 side and the opposite side, through the first electrode 102 and the second electrode 104, as shown in FIG. 3C.

Note that the structure of the layers provided between the first electrode 102 and the second electrode 104 is not limited to the above-described structure. Note that any structure other than the above-described structure may be used as long as it includes at least the first layer 111 which is a hole-injecting layer, the second layer 112 which is a hole-transporting layer, the third layer 113 which a light-emitting layer, and the sixth layer 116 which is a carrier-controlling layer, and substances are selected so that the highest occupied molecular orbital level (HOMO level) (the absolute value) of the substance used for the second layer 112 is deeper (larger) than the HOMO level of the substance used for the first layer 111.

Figure 5B:
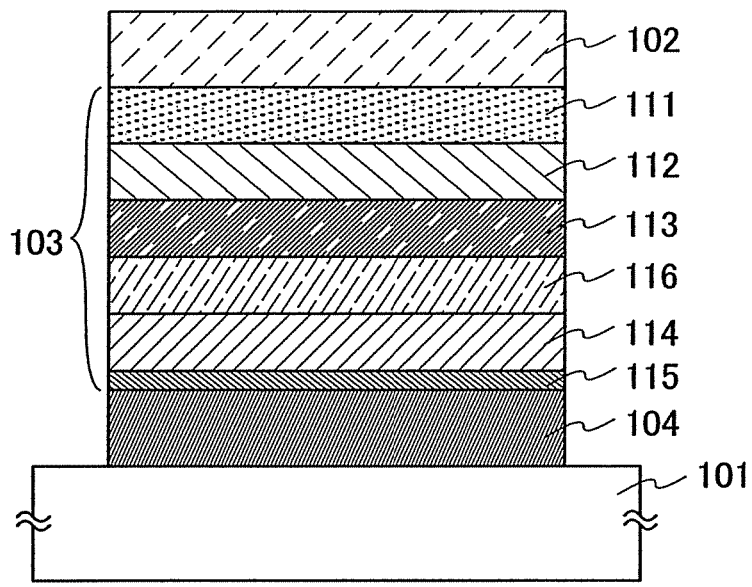

Alternatively, as shown in FIG. 5B, a structure may be employed in which the second electrode 104 functioning as a cathode, the EL layer 103, and the first electrode 102 functioning as an anode are stacked in this order over the substrate 101. Note that the EL layer 103 in this case has a structure in which the fifth layer 115, the fourth layer 114, the sixth layer 116, the third layer 113, the second layer 112, the first layer 111, and the first electrode 102 are stacked in this order over the second electrode 104.

Note that with use of the light-emitting element of the present invention, a passive matrix light-emitting device or an active matrix light-emitting device in which drive of the light-emitting element is controlled by a thin film transistor (TFT) can be manufactured.

Note that there is no particular limitation on the structure of the TF in the case of manufacturing an active matrix light-emitting device. For example, a staggered TFT or an inverted staggered TFT can be used as appropriate. Further, a driver circuit formed over a TFT substrate may be formed of both of an n-type TFT and a p-type TFT or only either an n-type TFT or a p-type TFT. Furthermore, there is no particular limitation on crystallinity of a semiconductor film used for the TFT. An amorphous semiconductor film may be used, or a crystalline semiconductor film may be used.

In the light-emitting element described in Embodiment Mode 2, the injection amount of holes from the first layer (the hole-injecting layer) 111 into the second layer (the hole-transporting layer) 112 can be suppressed by provision of the first layer (the hole-injecting layer) 111 and the second layer (the hole-transporting layer) 112 so that the highest occupied molecular orbital level (HOMO level) (the absolute value) of the second layer 112 is deeper (larger) than that of the first layer (the hole-injecting layer) 111. Accordingly, the injection amount of holes into the third layer (the light-emitting layer) 113 can be suppressed; thus, element efficiency can be increased. Moreover, the first layer (the hole-injecting layer) 111 is formed using a composite material in which an acceptor substance is contained in a substance having a high hole-transporting property, so that not only can element efficiency be increased but also increase in driving voltage can be kept to the minimum.

On the other hand, the sixth layer 116 is provided between the second electrode 104 and the third layer (the light-emitting layer) 113 to reduce the rate of transport of carriers (electrons); accordingly, an emission region, which has been so far formed near the interface between the third layer (the light-emitting layer) 113 and the fourth layer (the hole-transporting layer) 114 because of the fast transport rate, can be formed more centrally in the third layer (the light-emitting layer) 113 than in the conventional manner.

Further, the sixth layer 116 is provided to reduce the carrier (electron) transport rate; accordingly, it is possible to prevent deterioration of the second layer (the hole-transporting layer) 112, which is caused by carriers (electrons) which reach the second layer (the hole-transporting layer) 112 from the third layer (the light-emitting layer) 113 without contributing to light emission. Furthermore, by reduction of the carrier (electron) transport rate, it is possible not only to control the injection amount of carriers (electrons) into the third layer (the light-emitting layer) 113 but also to inhibit the suppressed injection amount of carriers (electrons) from changing with time. Thus, since decrease in the probability of recombination due to deterioration of the balance with time can be prevented, improvement in the lifetime of the element (suppression of deterioration of luminance with time) can also be achieved.

In the case of the structure described in this embodiment mode, since carriers (holes or electrons) which are injected into the third layer 113 are suppressed, the carrier balance in the third layer 113 is improved and the probability of the recombination is increased at the same time; accordingly, luminous efficiency can be increased.

Note that Embodiment Mode 2 can be combined with any of the structures described in Embodiment Mode 1, as appropriate.

[Embodiment Mode 3]

Figure 8:
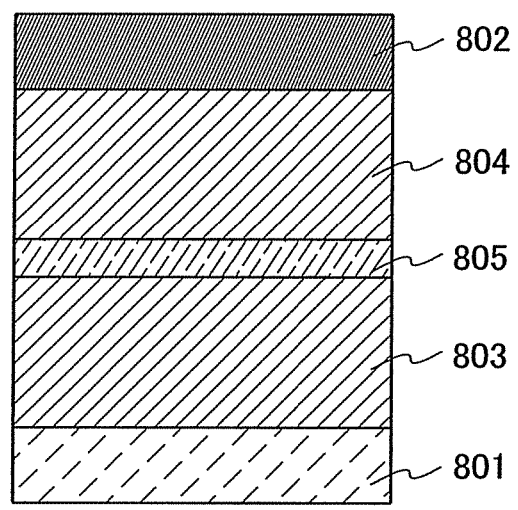
FIG. 8 is a view illustrating a stacked structure of a light-emitting element in Embodiment Mode 3.

In Embodiment Mode 3, a light-emitting element having a plurality of EL layers of the light-emitting elements described in Embodiment Modes 1 and 2 (hereinafter, such a light-emitting element is referred to as a "stacked-type light-emitting element") will be described with reference to FIG. 8. This light-emitting element is a stacked-type light-emitting element which has a plurality of EL layers (a first EL layer 803 and a second EL layer 804) between a first electrode 801 and a second electrode 802. Note that, although a structure of two EL layers is described in Embodiment Mode 3, a structure of three or more EL layers may be employed.

In Embodiment Mode 3, the first electrode 801 functions as an anode and the second electrode 802 functions as a cathode. Note that the first electrode 801 and the second electrode 802 can be made to have structures similar to those described in Embodiment Mode 1. Further, for the plurality of EL layers (the first EL layer 803 and the second EL layer 804), structures similar to those described in Embodiment Modes 1 and 2 can be used. Note that structures of the first EL layer 803 and the second EL layer 804 may be the same or different from each other and can be similar to those described in Embodiment Mode 1 or 2.

Further, a charge generation layer 805 is provided between the plurality of EL layers (the first EL layer 803 and the second EL layer 804). The charge generation layer 805 has a function of injecting electrons into one of the EL layers and injecting holes into the other of the EL layers when voltage is applied to the first electrode 801 and the second electrode 802. In Embodiment Mode 3, when voltage is applied so that the potential of the first electrode 801 is higher than that of the second electrode 802, the charge generation layer 805 injects electrons into the first EL layer 803 and injects holes into the second EL layer 804.

Note that the charge generation layer 805 preferably has a light-transmitting property in terms of light extraction efficiency. Further, the charge generation layer 805 functions even when it has lower conductivity than the first electrode 801 and the second electrode 802.

The charge generation layer 805 may have either a structure in which an acceptor substance is added to a substance having a high hole-transporting property or a structure in which a donor substance is added to a substance having a high electron-transporting property. Alternatively, both of these structures may be stacked.

In the case of the structure in which an acceptor substance is added to a substance having a high hole-transporting property, as the substance having a high hole-transporting property, an aromatic amine compound such as 4,4'-bis[N-(1-naphthyl)-N-phenylamino]biphenyl (NPB or α-NPD), N,N'-bis(3-methylphenyl)-N,N'-diphenyl-[1,1'-biphenyl]-4,4'-diamine (TPD), 4,4',4''-tris(N,N-diphenylamino)triphenylamine (TDATA), 4,4',4''-tris[N-(3-methylphenyl)-N-phenylamino]triphenylamine (MTDATA), or 4,4'-bis[N-(spiro-9,9'-bifluoren-2-yl)-N-phenylamino]-1,1'-biphenyl (BSPB), or the like can be used. The substances given here are mainly substances having a hole mobility of greater than or equal to $10^{-6}$ cm$^2$/V$_s$. However, any substance other than the above-described substances may be used as long as it is a substance whose hole-transporting property is higher than the electron-transporting property.

Further, as the acceptor substance, 7,7,8,8-tetracyano-2,3,5,6-tetrafluoroquinodimethane (F4-TCNQ), chloranil, and the like can be given. In addition, a transition metal oxide can be given. In addition, oxide of metal belonging to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable because their electron-accepting properties are high. Above all, molybdenum oxide is particularly preferable because it is stable even in the atmosphere, has a low hygroscopic property, and is easily handled.

On the other hand, in the case of the structure in which a donor substance is added to a substance having a high electron-transporting property, as the substance having a high electron-transporting property, a metal complex having a quinoline skeleton or a benzoquinoline skeleton, such as tris(8-quinolinolato)aluminum (Alq), tris(4-methyl-8-quinolinolato)aluminum (Almq$_3$), bis(10-hydroxybenzo[h]-quinolinato)beryllium (BeBq$_2$), or bis(2-methyl-8-quinolinolato)(4-phenylphenolato)aluminum (BAlq), or the like can be used. Alternatively, a metal complex having an oxazole-based or thiazole-based ligand, such as bis[2-(2-benzoxazolyl)phenolato]zinc (Zn(BOX)$_2$), or bis[2-(2-benzothiazolyl)phenolato]zinc (Zn(BTZ)$_2$), or the like can be used. Further alternatively, instead of the metal complex, 2-(4-biphenylyl)-5-(4-tert-butylphenyl)-1,3,4-oxadiazole (PBD), 1,3-bis[5-p-tert-butylphenyl)-1,3,4-oxadiazol-2-yl]benzene (OXD-7), 3-(4-biphenylyl)-4-phenyl-5-(4-tert-butylphenyl)-1,2,4-triazole (TAZ), bathophenanthroline (BPhen), bathocuproine (BCP), or the like can also be used. The substances given here are mainly substances having an electron mobility of $10^{-6}$ cm$^2$/V$_s$ or more. However, any substance other than the above-described substances may be used as long as it is a substance whose electron-transporting property is higher than the hole-transporting property.

Further, for the donor substance, an alkali metal, an alkaline earth metal, a rare earth metal, a metal belonging to Group 13 of the periodic table, or oxide or carbonate thereof can be used. Specifically, lithium (Li), cesium (Cs), magnesium (Mg), calcium (Ca), ytterbium (Yb), indium (In), lithium oxide, cesium carbonate, or the like is preferably used. Alternatively, an organic compound such as tetrathianaphthacene may be used for the donor substance.

Note that by formation of the charge generation layer 805 with use of any of the above-described material, increase in driving voltage in the case where the EL layers are stacked can be suppressed.

Although the light-emitting element having two EL layers is described in Embodiment Mode 3, the present invention can be similarly applied to a light-emitting element in which three or more EL layers are stacked. A plurality of EL layers are arranged to be partitioned from each other with a charge generation layer between a pair of electrodes, like the light-emitting element of Embodiment Mode 3, so that an element with a long lifetime can be achieved in a region of high luminance, with current density kept low. Further, when the light-emitting element is applied to lighting as an application example, drop in voltage due to the resistance of an electrode material can be suppressed, and thus uniform emission in a large area can be achieved. Further, a light-emitting device which can be driven at low voltage and has low power consumption can be realized.

Further, when the EL layers have different emission colors, a desired emission color can be obtained from the whole light-emitting element. For example, in the light-emitting element having two EL layers, when an emission color of the first EL layer and an emission color of the second EL layer are made to be complementary colors, it is possible to obtain a light-emitting element from which white light is emitted from the whole light-emitting element. Note that the complementary colors refer to colors which can produce an achromatic color when they are mixed. That is, white light emission can be obtained by mixture of light from substances whose emission colors are complementary colors.

Also in a light-emitting element having three EL layers, for example, white light can be similarly obtained from the whole light-emitting element when an emission color of a first EL layer is red, an emission color of a second EL layer is green, and an emission color of a third EL layer is blue.

Note that Embodiment Mode 3 can be combined with any of the structures described in Embodiment Mode 1 or 2, as appropriate.

[Embodiment Mode 4]

In Embodiment Mode 4, a light-emitting device having a light-emitting element of the present invention in a pixel portion will be described with reference to FIGS. 9A and 9B. Note that FIG. 9A is a top view showing the light-emitting device and FIG. 9B is a cross-sectional view taken along lines A-A' and B-B' of FIG. 9A.

Figure 9A:
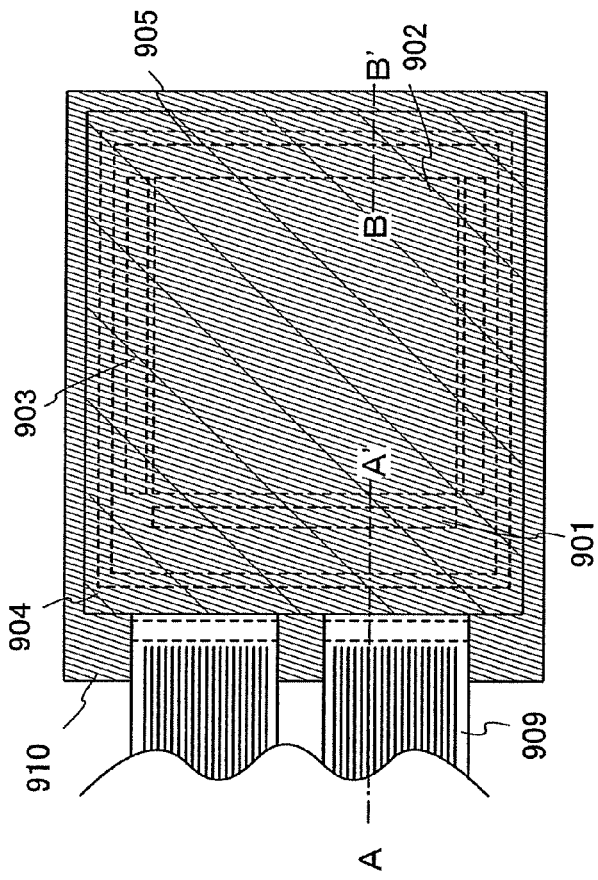
FIGS. 9A and 9B are views illustrating an active matrix light-emitting device in Embodiment Mode 4.
Figure 9B:
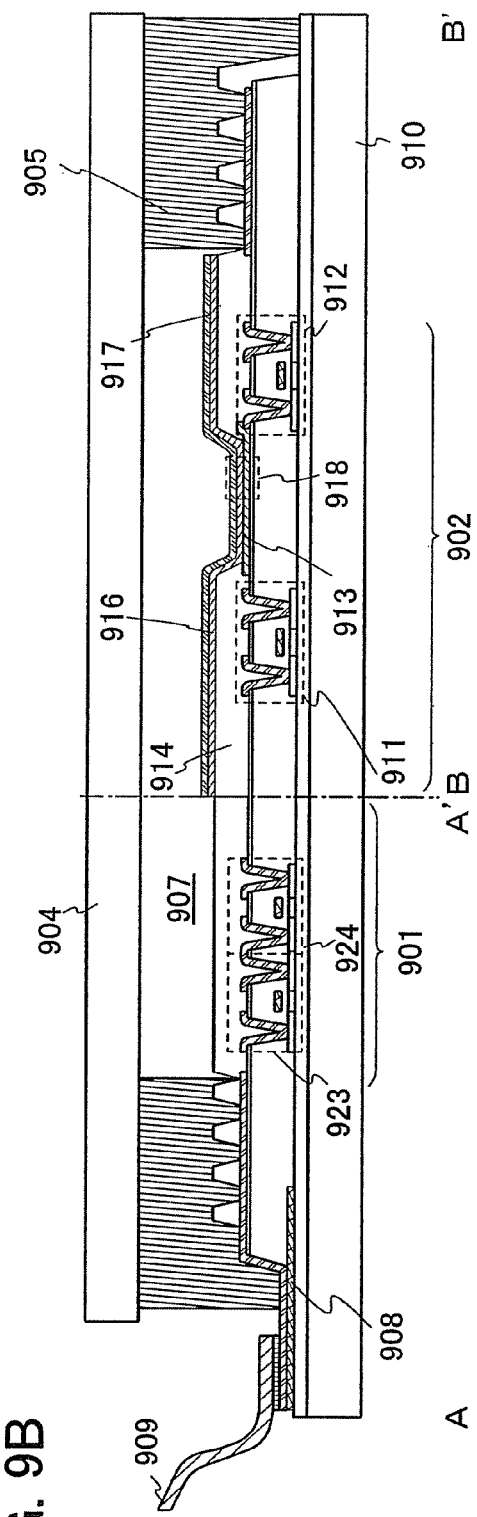

In FIG. 9A, a portion 901 indicated by a dotted line is a driver circuit portion (a source side driver circuit); a portion 902 indicated by a dotted line is a pixel portion; and a portion 903 indicated by a dotted line is a driver circuit portion (a gate side driver circuit). Further, a reference numeral 904 denotes a sealing substrate; a reference numeral 905 denotes a sealant; and a portion enclosed by the sealant 905 is a space 907.

Note that a lead wiring 908 is a wiring for transmitting signals to be input to the source side driver circuit 901 and the gate side driver circuit 903 and receives signals such as a video signal, a clock signal, a start signal, and a reset signal from a flexible printed circuit (FPC) 909 which is to be an external input terminal. Note that, although only the FPC is shown here, the FPC may be provided with a printed wiring board (PWB). Further, the light-emitting device in this specification includes not only a light-emitting device itself but also a light-emitting device provided with an FPC or a PWB.

Next, a cross-sectional structure will be described with reference to FIG. 9B. Although the driver circuit portion and the pixel portion are formed over an element substrate 910, one pixel in the pixel portion 902 and the source side driver circuit 901 which is the driver circuit portion are shown here. Note that a CMOS circuit which is a combination of an n-channel TFT 923 and a p-channel TFT 924 is formed as the source side driver circuit 901. Further, each driver circuit portion may be any of a variety of circuits such as a CMOS circuit, a PMOS circuit, and an NMOS circuit. In this embodiment mode, although a driver-integrated type structure in which a driver circuit is formed over a substrate is described, a driver circuit is not necessarily formed over a substrate but can be formed outside a substrate.

Further, the pixel portion 902 is formed of a plurality of pixels each including a switching TFT 911, a current control TFT 912, and a first electrode 913 which is electrically connected to a drain of the current control TFT 912. Note that an insulator 914 is formed to cover an end portion of the first electrode 913.

Further, the insulator 914 is preferably formed so as to have a curved surface with curvature at an upper end portion or a lower end portion thereof in order to make the coverage favorable. For example, positive type photosensitive acrylic is used as a material of the insulator 914, so that the insulator 914 can be formed to have a curved surface with a curvature radius (greater than or equal to 0.2 μm and less than or equal to 3 μm) only at the upper end portion. Further, either a negative type material becomes insoluble in an etchant by light irradiation or a positive type material which becomes soluble in an etchant by light irradiation can be used as the insulator 914.

An EL layer 916 and a second electrode 917 are formed over the first electrode 913. Here, as a material used for the first electrode 913, any of a variety of metals, alloys, and electrically conductive compounds, or a mixture thereof can be used. Note that, as a specific material, the material described in Embodiment Mode 1 as the material which can be used for the first layer can be used.

Further, the EL layer 916 is formed by any of a variety of methods such as an evaporation method using an evaporation mask, an inkjet method, and a spin coating method. The EL layer 916 has the structure described in Embodiment Mode 1 or 2. Further, as a material used for the EL layer 916, a low molecular compound or a high molecular compound (including an oligomer and a dendrimer) may be used. Further, as the material used for the EL layer, not only an organic compound but also an inorganic compound may be used.

Further, as a material used for the second electrode 917, any of a variety of metals, alloys, and electrically conductive compounds, or a mixture thereof can be used. When the second electrode 917 is used as a cathode, it is preferable to use, among these materials, any of metals, alloys, and electrically conductive compounds, a mixture thereof, or the like having a low work function (a work function of less than or equal to 3.8 eV). For example, an element belonging to Group 1 or 2 of the periodic table, that is, alkali metals such a lithium (Li) and cesium (Cs) and alkaline earth metals such as magnesium (Mg), calcium (Ca), and strontium (Sr); alloys containing them (MgAg or AlLi); or the like can be given.

Note that in the case where light generated in the EL layer 916 is transmitted through the second electrode 917, for the second electrode 917, a stack of a metal thin film with a reduced thickness and a transparent conductive film (indium tin oxide (ITO)), indium tin oxide containing silicon or silicon oxide, indium zinc oxide (IZO), or indium oxide containing tungsten oxide and zinc oxide (IWZO)) can also be used.

Furthermore, a structure is provided in which the sealing substrate 904 is attached, using the sealant 905 to the element substrate 910, so that the Light-emitting element 918 is provided in the space 907 surrounded by the element substrate 910, the sealing substrate 904, and the sealant 905. Note that the space 907 is filled with a filler. There are cases where the space 907 is filled with an inert gas (nitrogen, argon, or the like), and where the space 907 is filled with the sealant 905.

Note that an epoxy-based resin is preferably used for the sealant 905. Further, it is preferable that these materials hardly transmit water or oxygen. Further, as the sealing substrate 904, instead of a glass substrate or a quartz substrate, a plastic substrate formed of fiberglass-reinforced plastic (FRP), polyvinyl fluoride (PVF), polyester, acrylic, or the like can be used.

As described above, an active matrix light-emitting device having the light-emitting element of the present invention can be obtained.

Figure 10A:
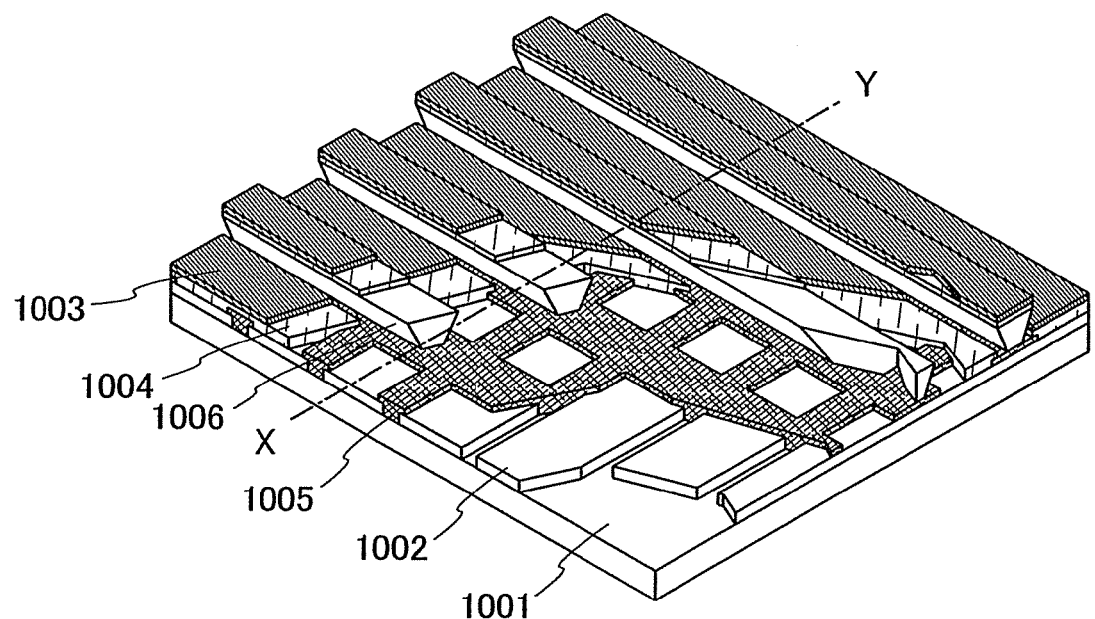
FIGS. 10A and 10B are views illustrating a passive matrix light-emitting device in Embodiment Mode 4.
Figure 10B:
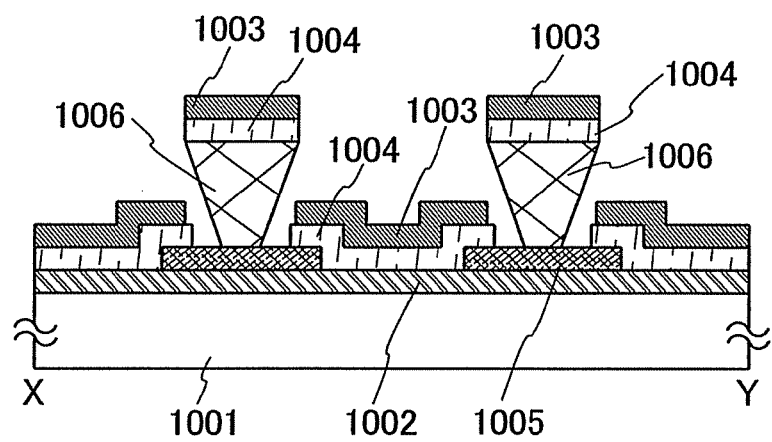

Further, the light-emitting element of the present invention can be used for a passive matrix light-emitting device instead of the above active matrix light-emitting device. FIGS. 10A and 10B are a perspective view and a cross-sectional view of a passive matrix light-emitting device using the light-emitting element of the present invention. Note that FIG. 10A is a perspective view of the light-emitting device and FIG. 10B is a cross-sectional view taken along a line X-Y of FIG. 10A.

In FIGS. 10A and 10B, an EL layer 1004 is provided between a first electrode 1002 and a second electrode 1003 over a substrate 1001. An end portion of the first electrode 1002 is covered by an insulating layer 1005. In addition, a partition layer 1006 is provided over the insulating layer 1005. Sidewalls of the partition layer 1006 have a slant such that a distance between one sidewall and the other sidewall becomes narrower as the sidewalls gets closer to a surface of the substrate. In other words, a cross section taken in the direction of a shorter side of the partition layer 1006 has a trapezoidal shape, and the base of the trapezoid (a side of the trapezoid which is parallel to the surface of the insulating layer 1005 and is in contact with the insulating layer 1005) is shorter than the upper side of the trapezoid (a side of the trapezoid which is parallel to the surface of the insulating layer 1005 and is not in contact with the insulating layer 1005). The provision of the partition layer 1006 in this manner can prevent the light-emitting element from being defective due to static electricity or the like.

Accordingly, the passive matrix light-emitting device using the light-emitting element of the present invention can be obtained.

Note that any of the light-emitting devices described in this embodiment mode (the active matrix light-emitting device and the passive matrix light-emitting device) are formed using the light-emitting element of the present invention, which has high luminous efficiency, and accordingly a light-emitting device having reduced power consumption can be obtained.

Note that Embodiment Mode 4 can be combined with any of the structures described in Embodiment Modes 1 to 3, as appropriate.

[Embodiment Mode 5]

In Embodiment Mode 5, electronic device including, as a part thereof, the light-emitting device of the present invention, which is described in Embodiment Mode 4, will be described. Examples of the electronic device include cameras such as video cameras or digital cameras, goggle type displays, navigation systems, audio playback devices (e.g., car audio systems and audio systems), computers, game machines, portable information terminals (e.g., mobile computers, cellular phones, portable game machines, and electronic books), image playback devices in which a recording medium is provided (specifically, devices which are capable of playing back recording media such as digital versatile discs (DVDs) and equipped with a display unit which can display images), and the like. Specific examples of these electronic devices are shown in FIGS. 11A to 11D.

Figure 11A:
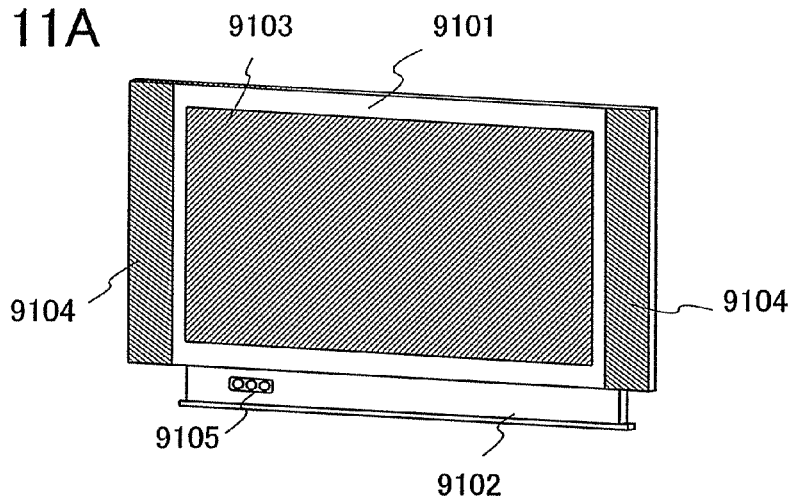
Figure 11A:
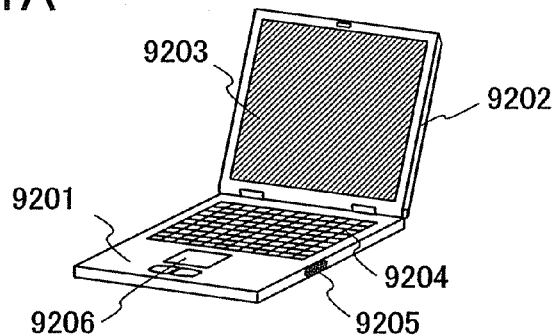

FIG. 11A shows a television set according to the present invention, which includes a housing 9101, a support base 9102, a display portion 9103, a speaker portion 9104, a video input terminal 9105, and the like. In this television set, the light-emitting device of the present invention can be applied to the display portion 9103. Since the light-emitting device of the present invention has a feature of high luminous efficiency, a television set having reduced power consumption can be obtained by application of the light-emitting device of the present invention.

FIG. 11B shows a computer according to the present invention, which includes a main body 9201, a housing 9202, a display portion 9203, a keyboard 9204, an external connection port 9205, a pointing device 9206, and the like. In this computer, the light-emitting device of the present invention can be applied to the display portion 9203. Since the light-emitting device of the present invention has a feature of high luminous efficiency, a computer having reduced power consumption can be obtained by application of the light-emitting device of the present invention.

Figure 11C:
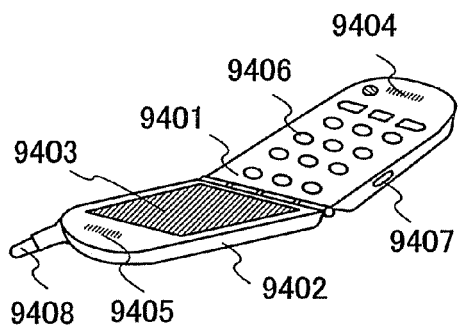

FIG. 11C shows a cellular phone according to the present invention, which includes a main body 9401, a housing 9402, a display portion 9403, an audio input portion 9404, an audio output portion 9405, operation keys 9406, an external connection port 9407, an antenna 9408, and the like. In this cellular phone, the light-emitting device of the present invention can be applied to the display portion 9403. Since the light-emitting device of the present invention has a feature of high luminous efficiency, a cellular phone having reduced power consumption can be obtained by application of the light-emitting device of the present invention.

Figure 11D:
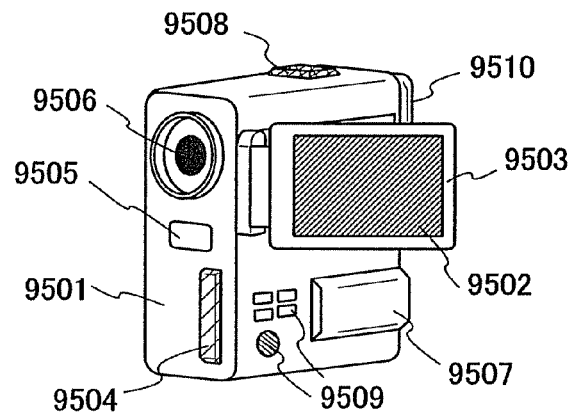

FIG. 11D shows a camera according to the present invention, which includes a main body 9501, a display portion 9502, a housing 9503, an external connection port 9504, a remote control receiver 9505, an image receiver 9506, a battery 9507, an audio input portion 9508, operation keys 9509, an eye piece portion 9510, and the like. In this camera, the light-emitting device of the present invention can be applied to the display portion 9502. Since the light-emitting device of the present invention has a feature of high luminous efficiency, a camera having reduced power consumption can be obtained by application of the light-emitting device of the present invention.

As described above, the applicable range of the light-emitting device of the present invention is wide so that this light-emitting device can be applied to electronic devices of a variety of fields. With use of the light-emitting device of the present invention, an electronic device having reduced power consumption can be obtained.

Figure 12:
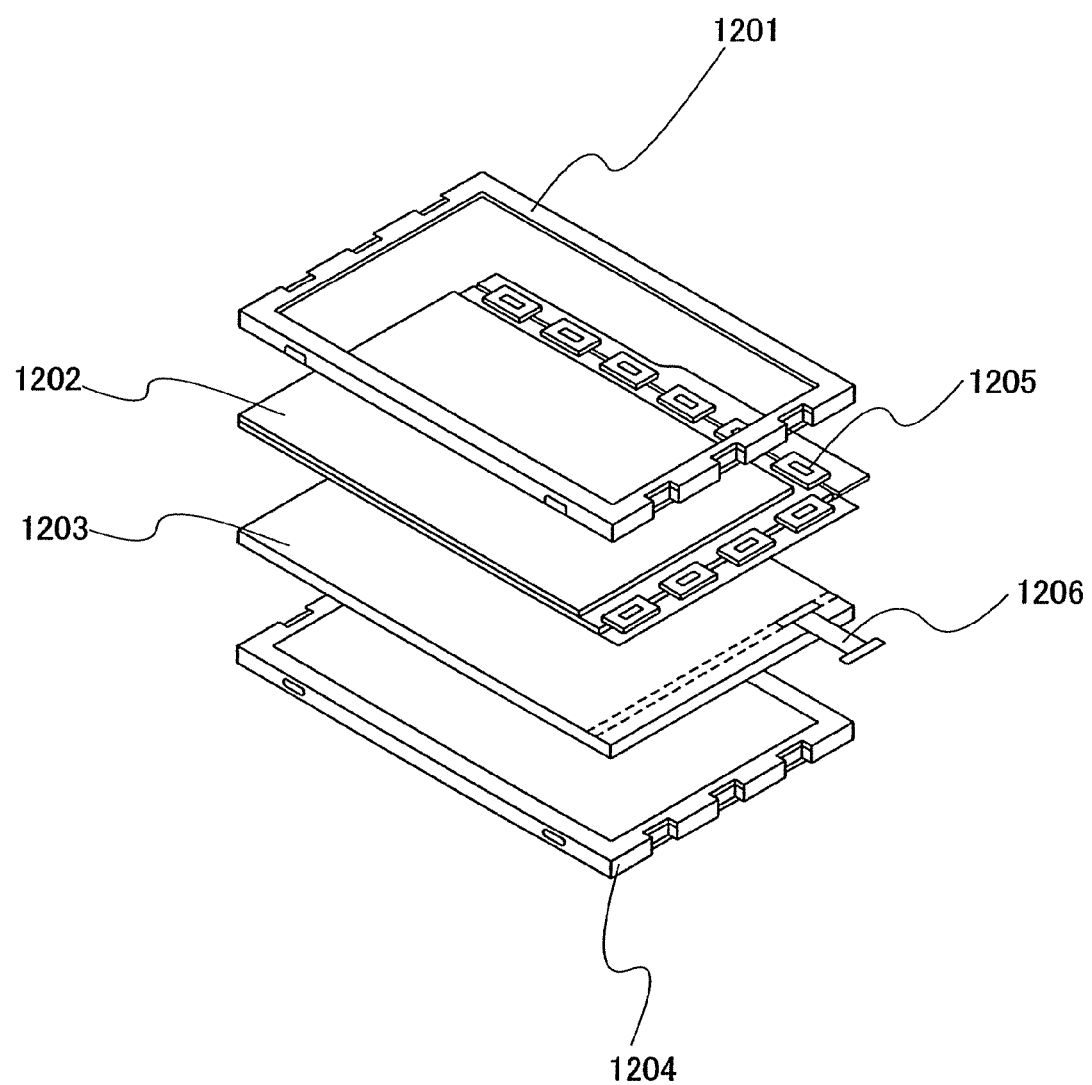
FIG. 12 is a view illustrating a liquid crystal display device using a light-emitting device of the present invention as a backlight.

Further, the light-emitting device of the present invention can also be used as a lighting apparatus. FIG. 12 shows an example of a liquid crystal display device using the light-emitting device of the present invention as a backlight. The liquid crystal display device shown in FIG. 12 includes a housing 1201, a liquid crystal layer 1202, a backlight 1203, and a housing 1204. The liquid crystal layer 1202 is connected to a driver IC 1205. Further, the light-emitting device of the present invention is used as the backlight 1203 to which current is supplied through a terminal 1206.

Using the light-emitting device of the present invention as a backlight of a liquid crystal display device as described above, a backlight having low power consumption can be obtained. Further, since the light-emitting device of the present invention is a surface emitting lighting apparatus and can be formed to have a large area, a larger-area backlight can also be obtained. Accordingly, a larger-area liquid crystal display device having low power consumption can be obtained.

Figure 13:
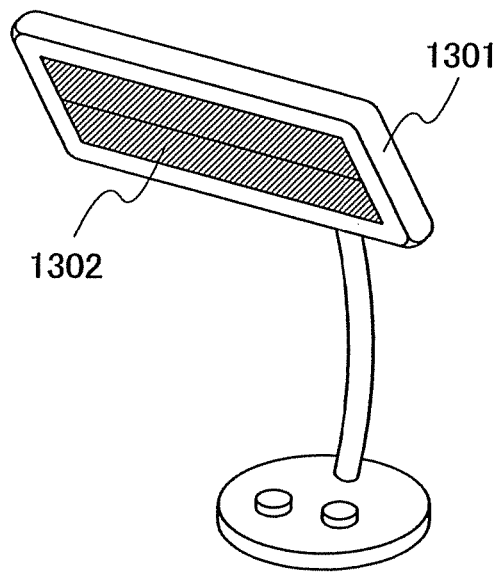
FIG. 13 is a view illustrating a desk lamp using a light-emitting device of the present invention.

FIG. 13 shows an example in which the light-emitting device to which the present invention is applied is used as a desk lamp that is a lighting apparatus. The desk lamp shown in FIG. 13 includes a housing 1301 and a light source 1302, and the light-emitting device of the present invention is used as the light source 1302. The light-emitting device of the present invention has the light-emitting element having high luminous efficiency and therefore can be used as a desk lamp having low power consumption.

Figure 14:
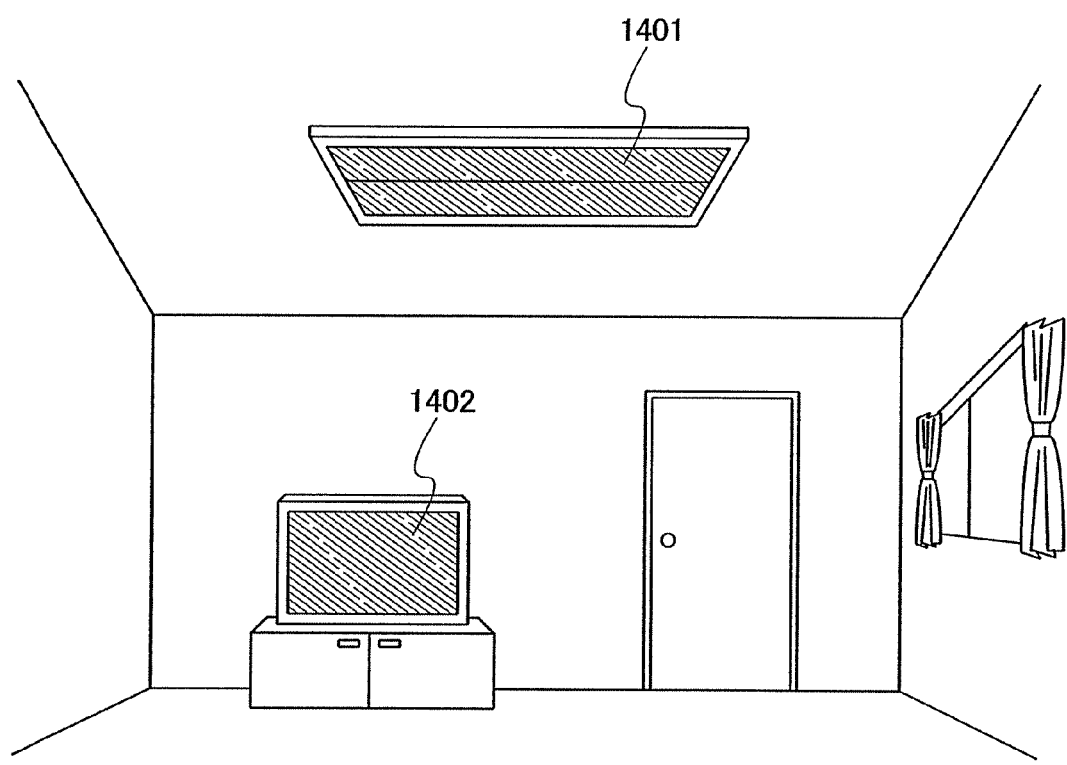
FIG. 14 is a view illustrating an indoor lighting device using a light-emitting device of the present invention.

FIG. 14 shows an example in which the light-emitting device to which the present invention is applied is used as an indoor lighting apparatus 3001. The light-emitting device of the present invention can be formed to have a large area and therefore can be used as a large-area lighting device. Further, the light-emitting device of the present invention has the light-emitting element having high luminous efficiency and therefore can be used as a lighting apparatus having low power consumption. As described above, in a room where a light-emitting device to which the present invention is applied is used as the indoor lighting device 1401, a television set 1402 of the present invention, as described using FIG. 11A, is placed, and thus public broadcasting and movies can be watched.

Note that Embodiment Mode 5 can be combined with any of the structures described in Embodiment Modes 1 to 4, as appropriate.

[Embodiment 1]

Figure 15:
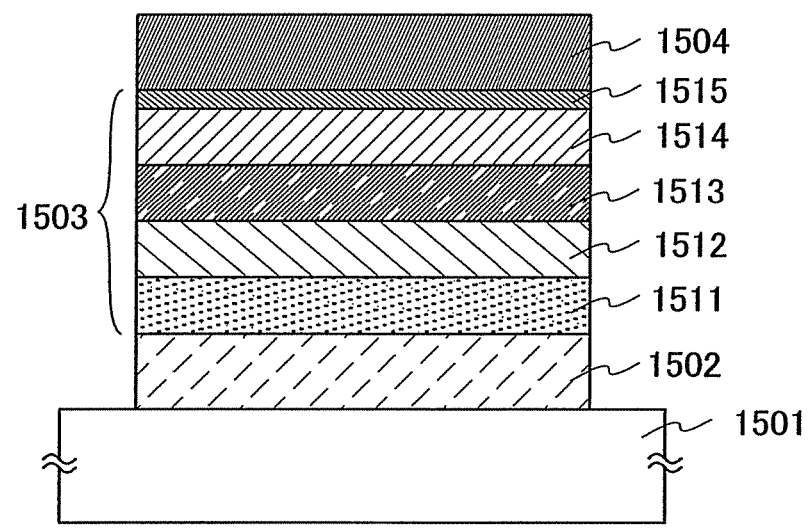
FIG. 15 is a view illustrating an element structure of a light-emitting element in Embodiment 1.

In Embodiment 1, manufacturing methods of light-emitting elements having the structure described in Embodiment Mode 1 as light-emitting elements of the present invention and measurement results of the element characteristics thereof will be described. Note that the element structures of the light-emitting elements described in this embodiment (light-emitting elements 1 to 4) and the element structure of a light-emitting element 5 to be compared to these light-emitting elements are shown in FIG. 15. Further, the structural formulae of organic compounds used in Embodiment 1 are shown below.

[Chemical Formula 1]
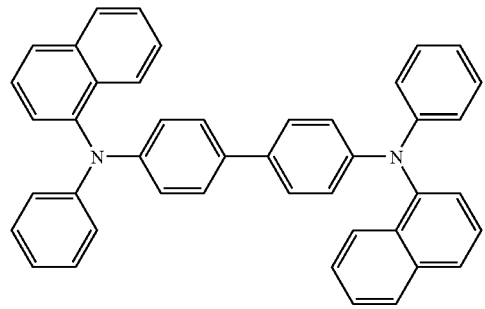
NPB
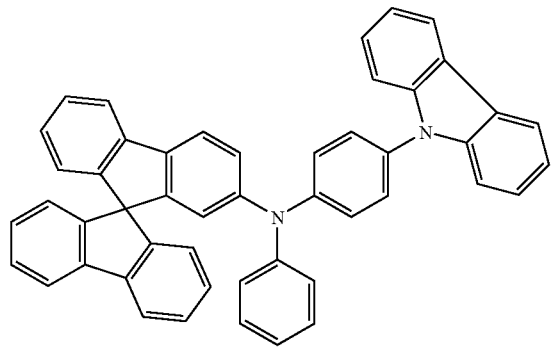
YGASF
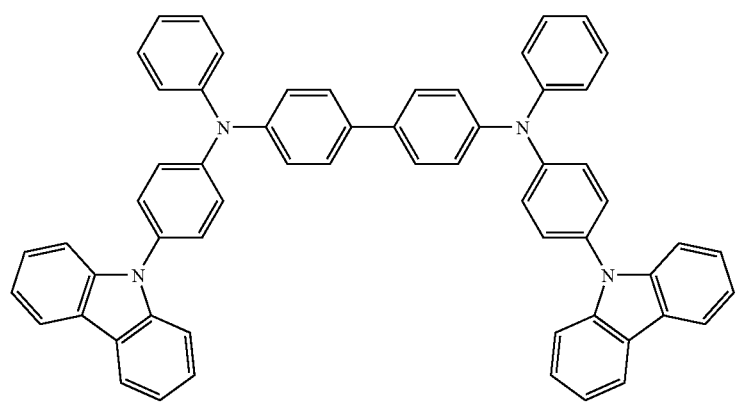
YGABP
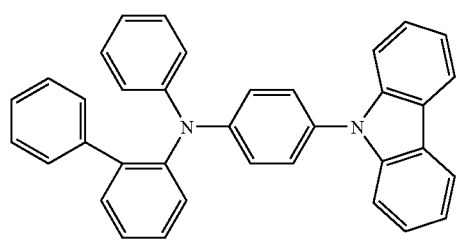
o-YGA1BP
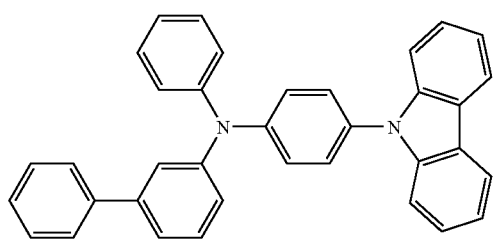
m-YGA1BP

[Chemical Formula 2]

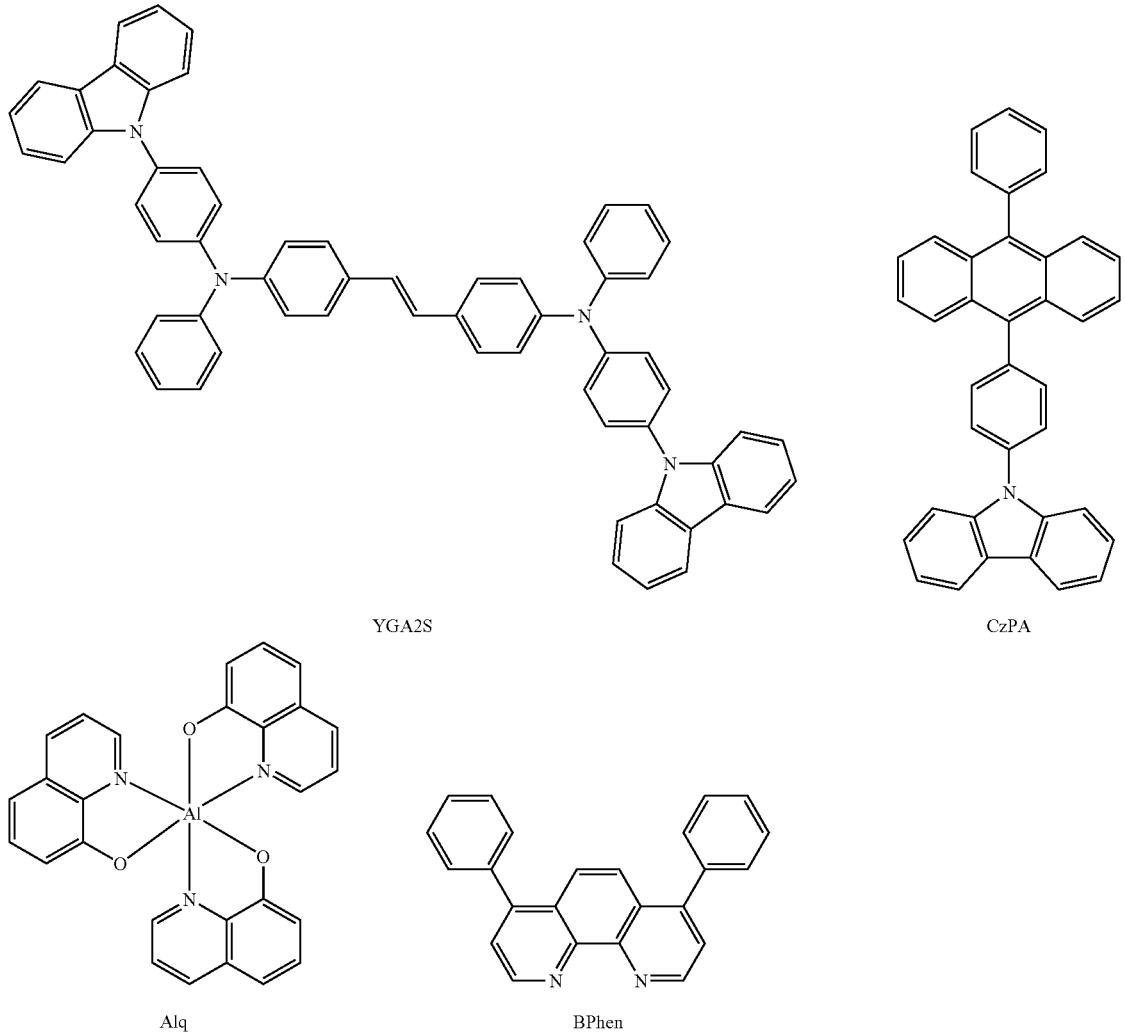

YGA2S

CzPA

Alq

BPhen (Manufacture of Light-Emitting Element 1)

The light-emitting element 1 is a light-emitting element having the structure described with reference to FIG. 1 in Embodiment Mode 1. Specifically, the light-emitting element 1 is a light-emitting element in the case where the HOMO level (the absolute value) of a second layer 1512 of FIG. 15 is deeper (larger) than the HOMO levels of a first layer 1511 and a third layer 1513.

First, indium tin oxide containing silicon oxide was deposited over a substrate 1501 which is a glass substrate by a sputtering method to form a first electrode 1502. Note that the thickness of the first electrode 1502 was set to be 110 nm and the area thereof was set to be 2 mm×2 mm.

Next, an EL layer 1503 in which a plurality of layers are stacked is formed over the first electrode 1502. The EL layer 1503 has a structure in which the first layer 1511 which is a hole-injecting layer, the second layer 1512 which is a hole-transporting layer, the third layer 1513 which is a light-emitting layer, a fourth layer 1514 which is an electron-transporting layer, and a fifth layer 1515 which is an electron-injecting layer are stacked in this order.

The substrate provided with the first electrode 1502 was fixed to a substrate holder which was provided in a vacuum evaporation apparatus so that a surface provided with the first electrode 1502 faced downward. The pressure in the vacuum evaporation apparatus was reduced to approximately $10^{-4}$ Pa. Then, over the first electrode 1502, 4,4'-bis[N-(1-naphthyl)-N-phenylamino]biphenyl (NPB) and molybdenum(VI) oxide were co-evaporated to form the first layer 1511 which is a hole-injecting layer. The thickness of the first layer 1511 was set to be 50 nm, and the evaporation rate was adjusted such that the weight ratio of NPB to molybdenum(VI) oxide became 4:1 (=NPB:molybdenum oxide). Note that a co-evaporation method is an evaporation method in which evaporation is performed using a plurality of evaporation sources in one treatment chamber at the same time.

Next, N-[4-(9H-carbazol-9-yl)phenyl]-N-phenyl-spiro-9,9'-bifluoren-2-amine (YGASF) was deposited over the first layer 1511 to a thickness of 10 nm by an evaporation method using resistive heating to form the second layer 1512 which is a hole-transporting layer.

Next, the third layer 1513 which is a light-emitting layer was formed over the second layer 1512 by an evaporation method using resistive heating. By co-evaporation of 9-[4-(10-phenyl-9-anthryl)phenyl]-9H-carbazole (CzPA) and N,N'-bis[4-(9H-carbazol-9-yl)phenyl]-N,N'-diphenylstilbene-4,4'-diamine (YGA2S), the third layer 1513 with a thickness of 30 nm was formed. Here, the evaporation rate was adjusted such that the weight ratio of CzPA to YGA2S became 1:0.04 (=CzPA:YGA2S).

Furthermore, tris(8-quinolinolato)aluminum(III) (Alq) was deposited over the third layer 1513 to a thickness of 20 nm, and bathophenanthroline (BPhen) was deposited thereover to a thickness of 10 nm by an evaporation method using resistive heating to form the fourth layer 1514 which is an electron-transporting layer.

Lithium fluoride (LiF) was deposited over the fourth layer 1514 to a thickness of 1 nm to form the fifth layer 1515 which is an electron-injecting layer.

Lastly, aluminum was deposited to a thickness of 200 nm by an evaporation method using resistive heating to form a second electrode 1504. Accordingly, the light-emitting element 1 was manufactured.

Sealing was performed in a glove box under a nitrogen atmosphere so that the light-emitting element 1 obtained as described above was not exposed to the atmosphere, and then operation characteristics of this light-emitting element were measured. Note that the measurements were performed at room temperature (in an atmosphere kept at 25° C.).

Figure 17:
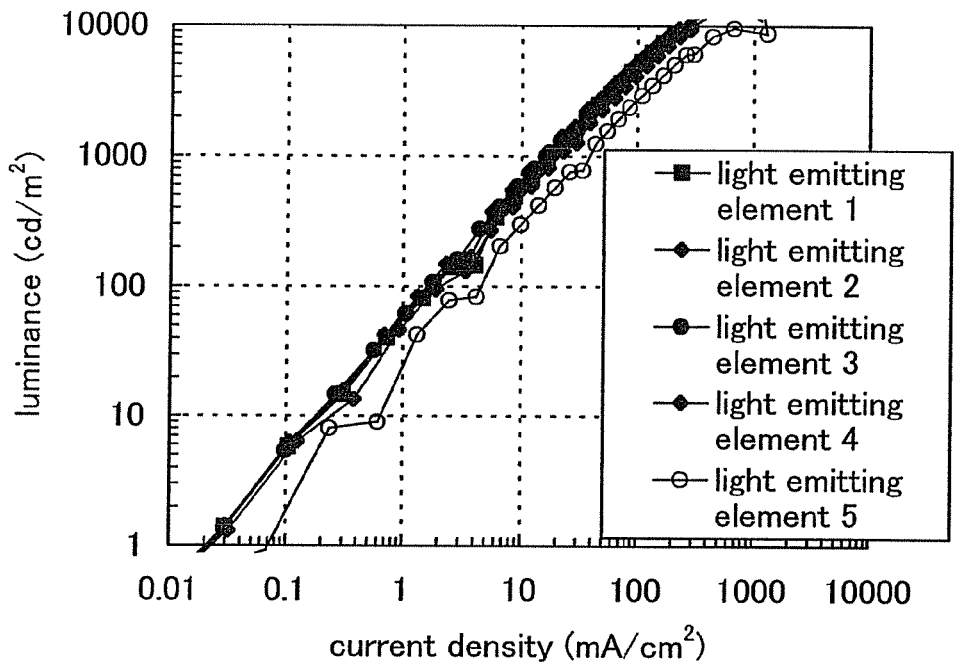
FIG. 17 is a graph showing current density vs. luminance characteristics of light-emitting elements 1 to 5.
Figure 18:
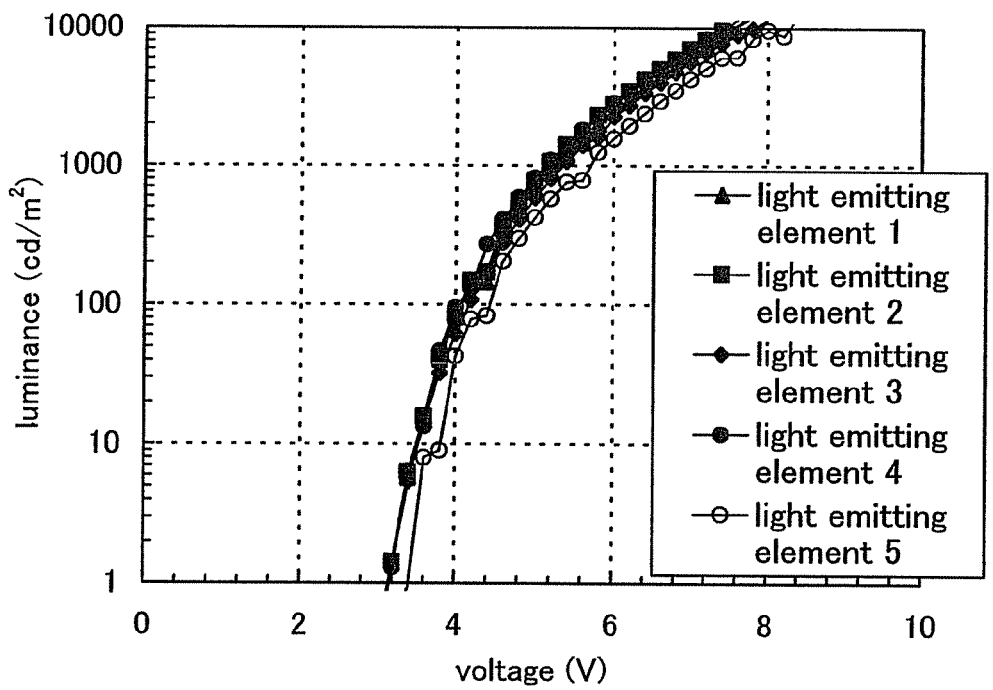
FIG. 18 is a graph showing voltage vs. luminance characteristics of light-emitting elements 1 to 5.
Figure 19:
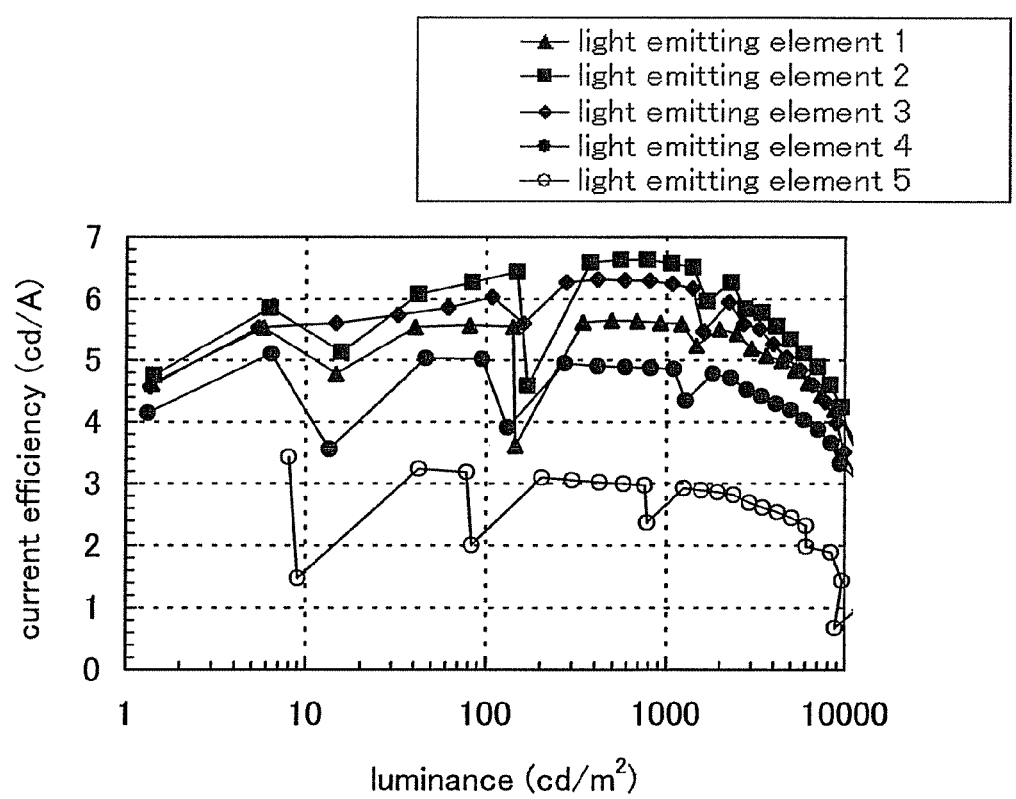
FIG. 19 is a graph showing luminance-current efficiency characteristics of light-emitting elements 1 to 5.
Figure 20:
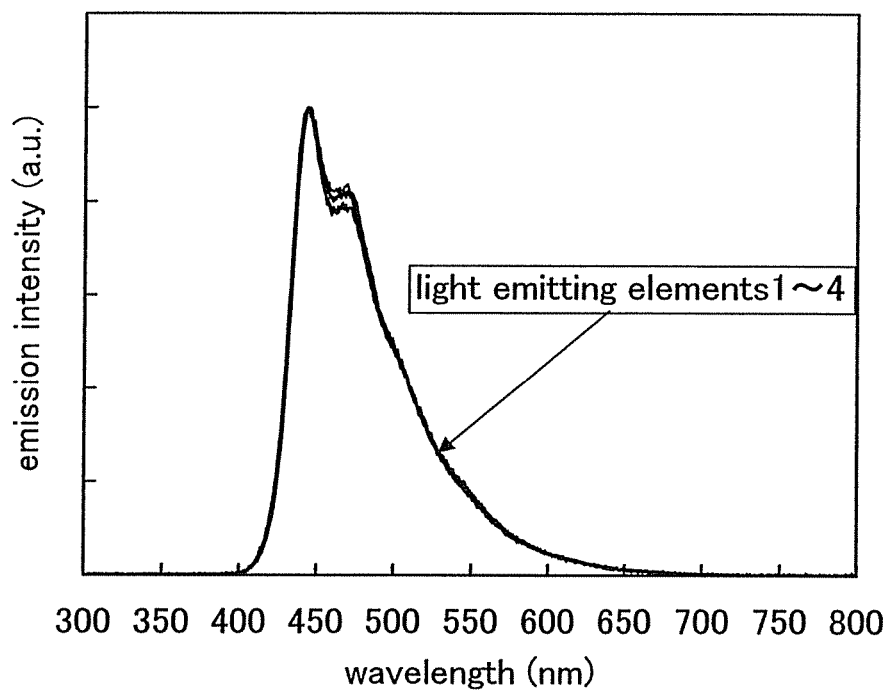
FIG. 20 is a graph showing an emission spectrum of light-emitting elements 1 to 4.

The current density-luminance characteristics of the light-emitting element 1 are shown in FIG. 17. The voltage vs. luminance characteristics are shown in FIG. 18. The luminance vs. current efficiency characteristics are shown in FIG. 19. The emission spectrum at current of 1 mA is shown in FIG. 20.

The CIE chromaticity coordinate of the light-emitting element 1 at a luminance of 1000 cd/m$^2$ was (x=0.16, y=0.16), and blue light which derives from YGA2S was emitted. In addition, at a luminance of 1000 cd/m$^2$, the current efficiency was 5.6 cd/A; thus, the light-emitting element 1 had high efficiency. At a luminance of 1000 cd/m$^2$, the driving voltage was 5.2 V.

(Manufacture of Light-Emitting Element 2)

The light-emitting element 2 is a light-emitting element having the structure described with reference to FIG. 1 in Embodiment Mode 1 in a similar manner to the light-emitting element 1. Specifically, the light-emitting element 2 is a light-emitting element in the case where the HOMO level (the absolute value) of the second layer 1512 of FIG. 15 is deeper (larger) than the HOMO level of the first layer 1511.

The light-emitting element 2 was manufactured in a similar manner to the light-emitting element 1 except that 4-(9H-carbazol-9-yl)-2'-phenyltriphenylamine (o-YGA1BP) instead of YGASF was used for the second layer 1512 of the light-emitting element 1.

Sealing was performed in a glove box under a nitrogen atmosphere so that the obtained light-emitting element 2 was not exposed to the atmosphere, and then operation characteristics of this light-emitting element were measured. Note that the measurements were performed at room temperature (in an atmosphere kept at 25° C.).

The current density vs. luminance characteristics of the light-emitting element 2 are shown in FIG. 17. The voltage vs. luminance characteristics are shown in FIG. 18. The luminance vs. current efficiency characteristics are shown in FIG. 19. The emission spectrum at current of 1 mA is shown in FIG. 20.

The CIE chromaticity coordinate of the light-emitting element 2 at a luminance of 1000 cd/m$^2$ was (x=0.16, y=0.16), and blue light which derives from YGA2S was emitted. In addition, at a luminance of 1000 cd/m$^2$, the current efficiency was 6.6 cd/A; thus, the light-emitting element 2 had high efficiency. At a luminance of 1000 cd/m$^2$, the driving voltage was 5.2 V.

(Manufacture of Light-Emitting Element 3)

Similarly to the light-emitting element 1 and the light-emitting element 2, the light-emitting element 3 is a light-emitting element having the structure described with reference to FIG. 1 in Embodiment Mode 1. Specifically, the light-emitting element 3 is a light-emitting element in the case where the HOMO level (the absolute value) of the second layer 1512 of FIG. 15 is deeper (larger) than the HOMO level of the first layer 1511.

The light-emitting element 3 was manufactured using 4-(9H-carbazol-9-yl)-3'-phenyltriphenylamine (m-YGA1BP) instead of YGASF used for the second layer 1512 of the light-emitting element 1, in a similar manner to the light-emitting element 1.

Sealing was performed in a glove box under a nitrogen atmosphere so that the obtained light-emitting element 3 was not exposed to the atmosphere, and then operation characteristics of this light-emitting element were measured. Note that the measurements were performed at room temperature (in an atmosphere kept at 25° C.).

The current density vs. luminance characteristics of the light-emitting element 3 are shown in FIG. 17. The voltage vs. luminance characteristics are shown in FIG. 18. The luminance vs. current efficiency characteristics are shown in FIG. 19. The emission spectrum at current of 1 mA is shown in FIG. 20.

The CIE chromaticity coordinate of the light-emitting element 3 at a luminance of 1000 cd/m$^2$ was (x=0.16, y=0.16), and blue light which derives from YGA2S was emitted. In addition, at a luminance of 1000 cd/m$^2$, the current efficiency was 6.2 cd/A; thus, the light-emitting element 3 had high efficiency. At a luminance of 1000 cd/m$^2$, the driving voltage was 5.4 V.

(Manufacture of Light-Emitting Element 4)

Similarly to the light-emitting elements 1 to 3, the light-emitting element 4 is a light-emitting element having the structure described with reference to FIG. 1 in Embodiment Mode 1. Specifically, the light-emitting element 4 is a light-emitting element in the case where the HOMO level (the absolute value) of the second layer 1512 of FIG. 15 is deeper (larger) than the HOMO level of the first layer 1511.

The Light-emitting element 4 was manufactured using N,N'-bis[4-(9H-carbazol-9-yl)phenyl-N,N'-diphenylvinyl-4,4'-diamine (YGABP) instead of YGASF used for the second layer 1512 of the light-emitting element 1, in a similar manner to the light-emitting element 1.

Sealing was performed in a glove box under a nitrogen atmosphere so that the obtained light-emitting element 4 was not exposed to the atmosphere, and then operation characteristics of this light-emitting element were measured. Note that the measurements were performed at room temperature (in an atmosphere kept at 25° C.).

The current density vs. luminance characteristics of the light-emitting element 4 are shown in FIG. 17. The voltage vs. luminance characteristics are shown in FIG. 18. The luminance vs. current efficiency characteristics are shown in FIG. 19. The emission spectrum at current of 1 mA is shown in FIG. 20.

The CIE chromaticity coordinate of the light-emitting element 4 at a luminance of 1000 cd/m$^2$ was (x=0.16, y=0.16), and blue light which derives from YGA2S was emitted. In addition, at a luminance of 1000 cd/m$^2$, the current efficiency was 4.9 cd/A; thus, the light-emitting element 4 had high efficiency. At a luminance of 1000 cd/m$^2$, the driving voltage was 5.2 V.

(Manufacture of Light-Emitting Element 5)

Next, as a light-emitting element for comparison, the light-emitting element 5 (a structure in which the second layer 1512 of the above-described light-emitting elements 1 to 4 is formed using NPB) was manufactured. Specifically, the light-emitting element 5 is a light-emitting element in the case where the HOMO level of the second layer 1512 of FIG. 15 is the same as the HOMO level of the first layer 1511. A manufacturing method thereof will be described below.

First, indium tin oxide containing silicon oxide was deposited over the glass substrate 1501 by a sputtering method to form the first electrode 1502. Note that the thickness thereof was set to be 110 nm and the area thereof was set to be 2 mm×2 mm.

The substrate provided with the first electrode 1502 was fixed to a substrate holder which was provided in a vacuum evaporation apparatus so that a surface provided with the first electrode 1502 faced downward. The pressure in the vacuum evaporation apparatus was reduced to approximately $10^{-4}$ Pa. Then, over the first electrode 1502, 4,4'-bis[N-(1-naphthyl)-N-phenylamino]biphenyl (NPB) and molybdenum(VI) oxide were co-evaporated to form the first layer 1511 which is a hole-injecting layer. The thickness of the first layer 1511 was set to be 30 nm, and the evaporation rate was adjusted such that the weight ratio of NPB to molybdenum(VI) oxide became 4:1 (=NPB:molybdenum oxide). Note that a co-evaporation method refers to an evaporation method in which evaporation is performed using a plurality of evaporation sources in one treatment chamber at the same time.

Next, 4,4'-bis[N-(1-naphthyl)-N-phenylamino]biphenyl (NPB) was deposited to a thickness of 10 nm by an evaporation method using resistive heating to form the second layer 1512 which is a hole-transporting layer.

Next, the third layer 1513 which is a light-emitting layer is formed over the second layer 1512. By co-evaporation of 9-[4-(N-carbazolyl)phenyl]-10-phenylanthracene (CzPA) and N,N'-bis[4-(9H-carbazol-9-yl)phenyl]-N,N'-diphenyl-stilbene-4,4'-diamine (YGA2S), the fourth layer 1514 with a thickness of 30 nm was formed. Here, the evaporation rate was adjusted such that the weight ratio of CzPA to YGA2S became 1:0.04 (=CzPA:YGA2S).

Then, tris(8-quinolinolato)aluminum(III) (Alq) was deposited over the third layer 1513 to a thickness of 20 nm, and bathophenanthroline (BPhen) was deposited thereover to a thickness of 10 nm by an evaporation method using resistive heating to form the fourth layer 1514 which is an electron-transporting layer.

Next, lithium fluoride (LiF) was deposited over the fourth layer 1514 to a thickness of 1 nm to form the fifth layer 1515 which is an electron-injecting layer.

Lastly, aluminum was deposited to a thickness of 200 nm by an evaporation method using resistive heating to form the second electrode 1504. Accordingly, the light-emitting element 5 was manufactured.

Sealing was performed in a glove box under a nitrogen atmosphere so that the light-emitting element 5 obtained as described above was not exposed to the atmosphere, and then operation characteristics of the light-emitting element 5 were measured. Note that the measurements were performed at room temperature (in an atmosphere kept at 25° C.).

The current density vs. luminance characteristics of the light-emitting element 5 are shown in FIG. 17. The voltage vs. luminance characteristics are shown in FIG. 18. The luminance vs. current efficiency characteristics are shown in FIG. 19.

The CIE chromaticity coordinate of the light-emitting element 5 at a luminance of 1000 cd/m² was (x=0.16, y=0.16), and blue light which derives from YGA2S was emitted as in the light-emitting elements 1 to 4. Further, the current efficiency of the light-emitting element 5 was 3.0 cd/A. It is found that by comparison with the current efficiency of the light-emitting elements 1 to 4, the current efficiency of the light-emitting element 5 was lower than that of the light-emitting elements 1 to 4.

As described above, it was found that the light-emitting elements 1 to 4 have higher efficiency than the light-emitting element 5. Thus, it is found that a light-emitting element having high efficiency can be obtained by application of the present invention.

[Embodiment 2]

Figure 16A:
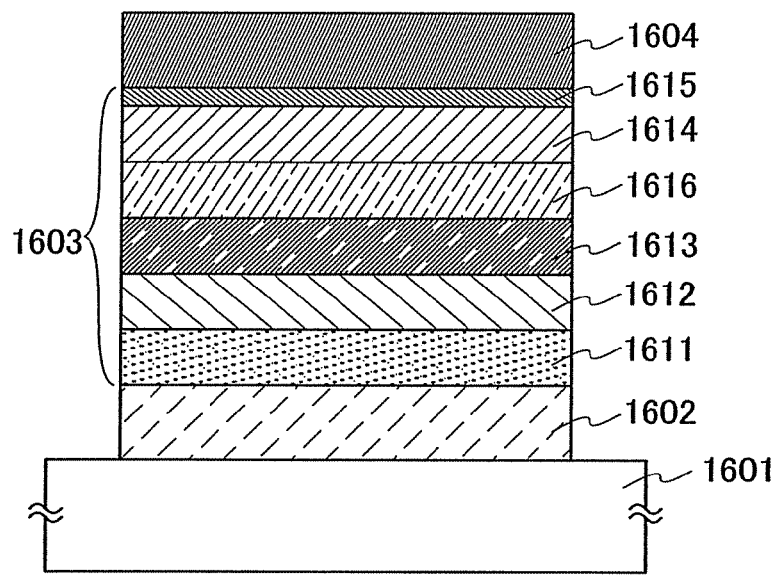
FIGS. 16A and 16B are views each illustrating an element structure of a light-emitting element in Embodiment 2.
Figure 16B:
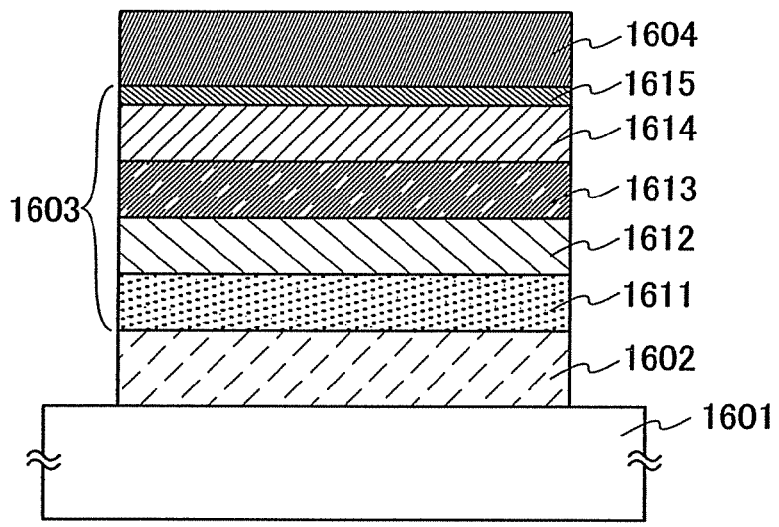

In Embodiment 2, manufacturing methods of light-emitting elements having the structure described in Embodiment Mode 2, which are light-emitting elements of the present invention, and measurement results of the element characteristics thereof will be described. Note that the element structures of the light-emitting elements described in this example (light-emitting elements 6 to 8) are shown in FIG. 16A and the element structure of a light-emitting element 9 to be compared to these light-emitting elements is shown in FIG. 16B. Further, the structural formula of an organic compound used in Embodiment 2 is shown below. Note that the organic compounds described in Embodiment 1 can be referred to Embodiment 1 and the description thereof is omitted here.

[Chemical Formula 3]

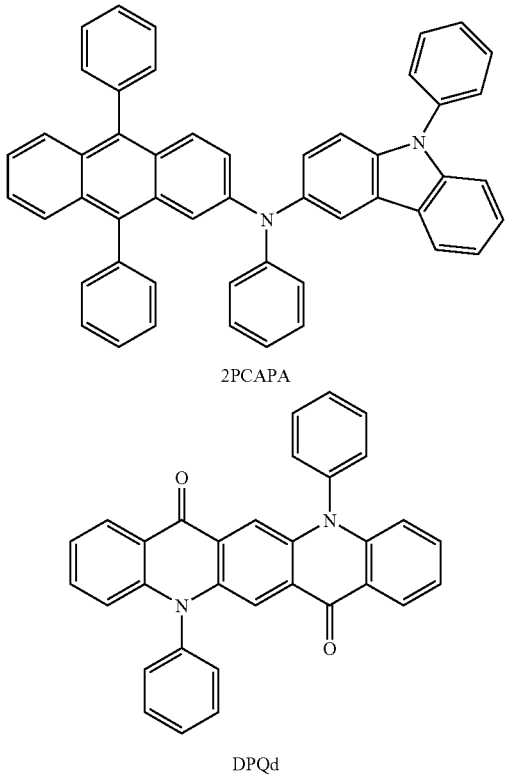

2PCAPA

DPQd (Manufacture of Light-Emitting Element 6)

The light-emitting element t 6 is a light-emitting element having the structure described with reference to FIG. 4 in Embodiment Mode 2. Specifically, the light-emitting element 6 is a light-emitting element in the case where the HOMO level of a second layer 1612 of FIG. 16A is deeper (the absolute value is larger) than the HOMO level of a first layer 1611. Furthermore, the light-emitting element 6 is a light-emitting element in the case where a sixth layer kinetically controls carriers (electrons) as shown in the conceptual diagrams of FIGS. 6A and 6B.

First, indium tin oxide containing silicon oxide was deposited over a substrate 1601 which is a glass substrate by a sputtering method to form a first electrode 1602. Note that the thickness of the first electrode 1602 was set to be 110 nm and the area thereof was set to be 2 mm×2 mm.

Next, an EL layer 1603 in which a plurality of layers are stacked is formed over the first electrode 1602. In this embodiment, the EL layer 1603 has a structure in which the first layer 1611 which is a hole-injecting layer, the second layer 1612 which is a hole-transporting layer, a third layer 1613 which is a light-emitting layer, a sixth layer 1616 which is a carrier-controlling layer for controlling transport of electron carriers, a fourth layer 1614 which is an electron-transporting layer, and a fifth layer 1615 which is an electron-injecting layer are stacked in this order.

The substrate provided with the first electrode 1602 was fixed to a substrate holder which was provided in a vacuum evaporation apparatus so that a surface provided with the first electrode 1602 faced downward. The pressure in the vacuum evaporation apparatus was reduced to approximately $10^{-4}$ Pa. Then, over the first electrode 1602, 4,4'-bis[N-(1-naphthyl)-N-phenylamino]biphenyl (NPB) and molybdenum(VI) oxide were co-evaporated to form the first layer 1611 which is a hole-injecting layer. The thickness of the first layer 1611 was set to be 50 nm, and the evaporation rate was adjusted such that the weight ratio of NPB to molybdenum(VI) oxide became 4:1 (=NPB:molybdenum oxide). Note that a co-evaporation method refers to an evaporation method in which evaporation is performed using a plurality of evaporation sources in one treatment chamber at the same time.

Next, N-[4-(9H-carbazol-9-yl)phenyl]-N-phenyl-spiro-9,9'-bifluoren-2-amine (YGASF) was deposited over the first layer 1611 to a thickness of 10 nm by an evaporation method using resistive heating to form the second layer 1612 which is a hole-transporting layer.

Next, the third layer 1613 which is the light-emitting layer is formed over the second layer 1612. By co-evaporation of 9-[4-(10-phenyl-9-anthryl)phenyl]-9H-carbazole (CzPA) and N-(9,10-diphenyl-2-anthryl)-N,9-diphenyl-9H-carbazol-3-amine (2PCAPA), the third layer 1613 with a thickness of 30 nm was formed. Here, the evaporation rate was adjusted such that the weight ratio of CzPA to 2PCAPA became 1:0.05 (=CzPA:2PCAPA).

Furthermore, over the third layer 1613, tris(8-quinolinolato)aluminum(III) (Alq) and N-(9,10-diphenyl-2-anthryl)-N,9-diphenyl-9H-carbazol-3-amine (2PCAPA) were co-evaporated to form the sixth layer 1616 which is a carrier-controlling layer for controlling electron carriers to a thickness of 10 nm. Here, the evaporation rate was adjusted such that the weight ratio of Alq to 2PCAPA became 1:0.1 (=Alq:2PCAPA).

Then, bathophenanthroline (BPhen) was deposited over the sixth layer 1616 to a thickness of 30 nm by an evaporation method using resistive heating to form the fourth layer 1614 which is an electron-transporting layer.

Lithium fluoride (LiF) was deposited over the fourth layer 1614 to a thickness of 1 nm to form the fifth layer 1615 which is an electron-injecting layer.

Lastly, aluminum was deposited to a thickness of 200 nm by an evaporation method using resistive heating to form a second electrode 1604. Accordingly, the light-emitting element 6 was manufactured.

Sealing was performed in a glove box under a nitrogen atmosphere so that the light-emitting element 6 of the present invention which is obtained as described above was not exposed to the atmosphere, and then operation characteristics of this light-emitting element were measured. Note that the measurements were performed at room temperature (in an atmosphere kept at 25 ° C.).

Figure 21:
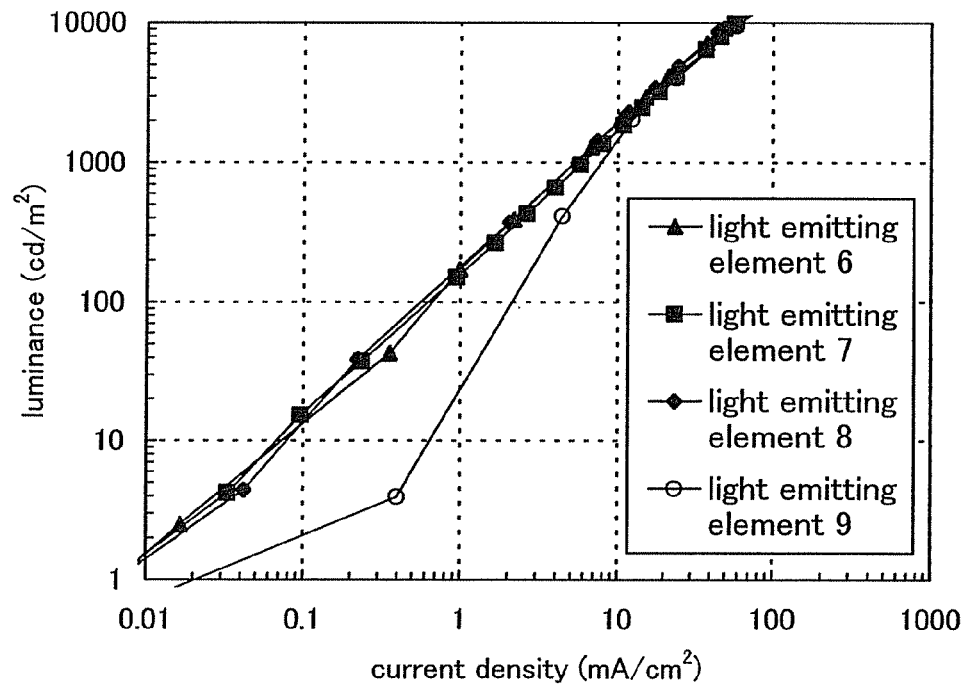
FIG. 21 is a graph showing current density vs. luminance characteristics of light-emitting elements 6 to 9.
Figure 22:
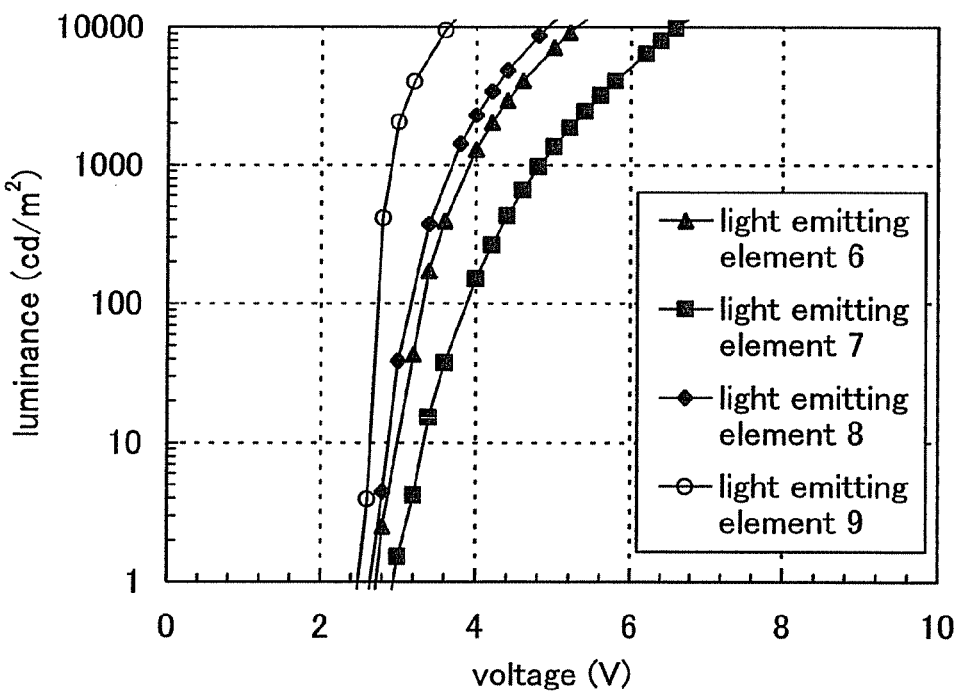
FIG. 22 is a graph showing voltage vs. luminance characteristics of light-emitting elements 6 to 9.
Figure 23:
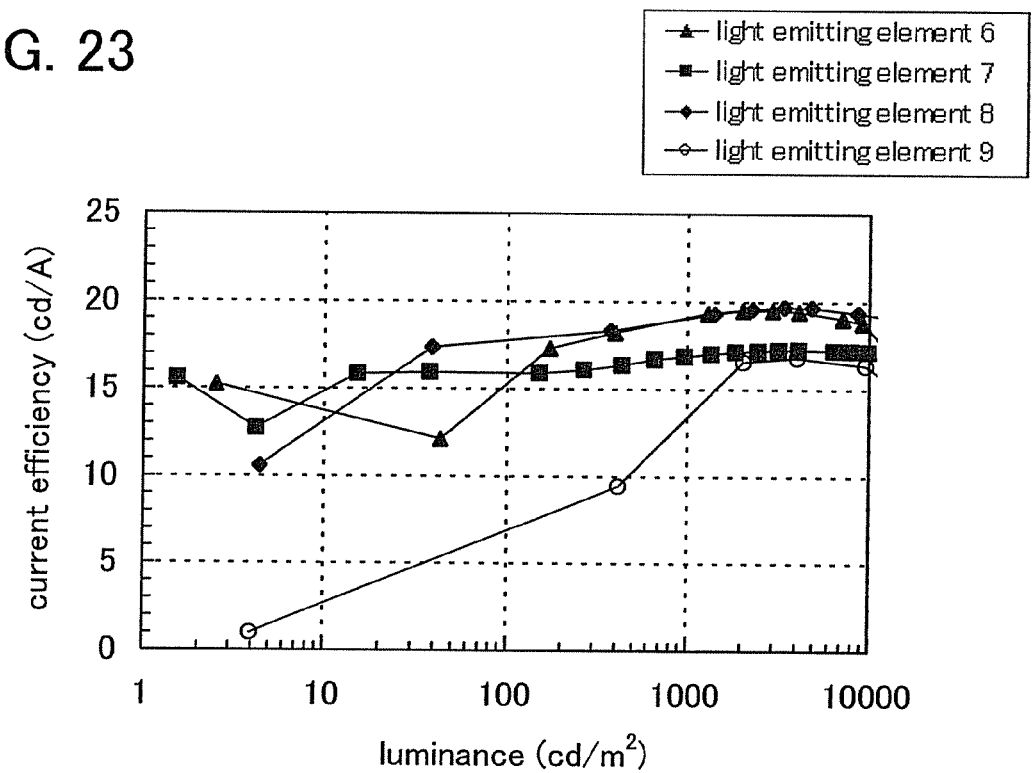
FIG. 23 is a graph showing luminance vs. current efficiency characteristics of light-emitting elements 6 to 9.
Figure 24:
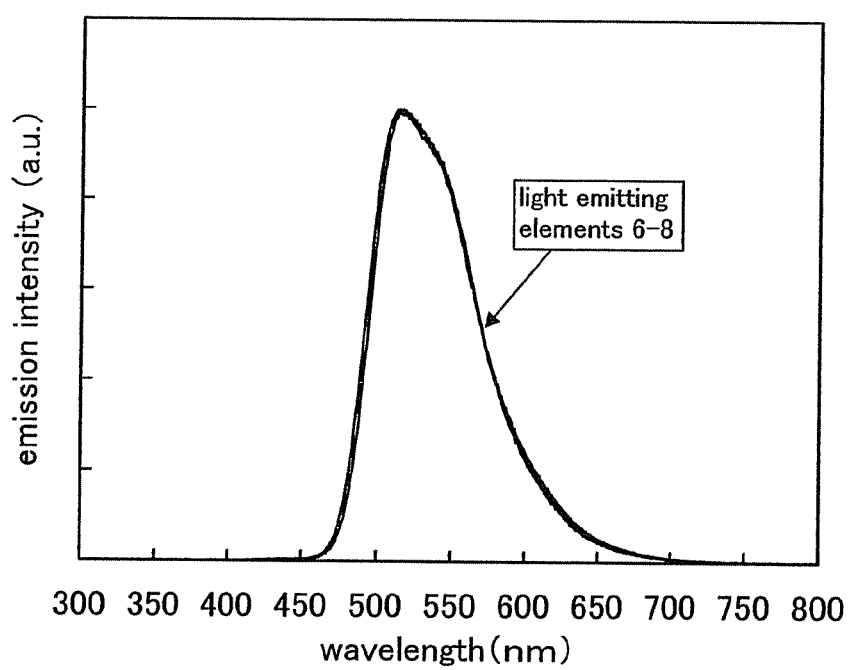
FIG. 24 is a graph showing an emission spectrum of light-emitting elements 6 to 8.
Figure 25:
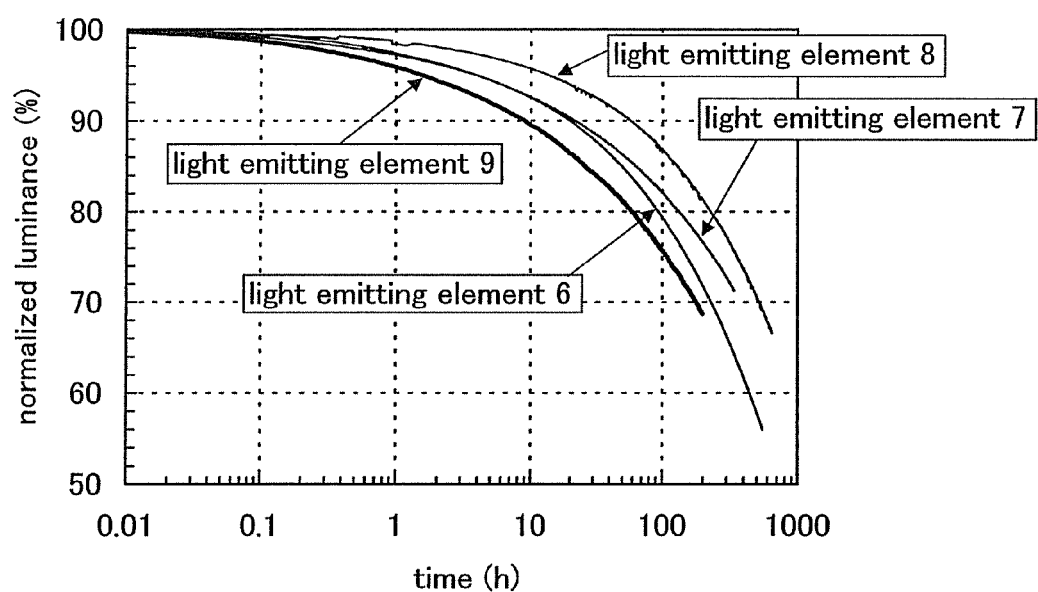
FIG. 25 is a graph showing the results of a continuous lighting test in which light-emitting elements 6 to 9 were continuously lit by constant current driving.

The current density vs. luminance characteristics of the Light-emitting element 6 are shown in FIG. 21. The voltage vs. luminance characteristics are shown in FIG. 22. The luminance vs. current efficiency characteristics are shown in FIG. 23. The emission spectrum at current of 1 mA is shown in FIG. 24. Further, FIG. 25 shows the results of continuous lighting tests in which the light-emitting element 6 was continuously lit by constant current driving with the initial luminance set at 5000 $cd/m^2$ (the vertical axis indicates the relative luminance on the assumption that 5000 $cd/m^2$ is 100%).

The CIE chromaticity coordinate of the light-emitting element 6 at a luminance of 5000 $cd/m^2$ was (x=0.30, y=0.61), and green light which derives from 2PCAPA was emitted. In addition, at a luminance of 5000 $cd/m^2$, the current efficiency was 19 cd/A; thus, the light-emitting element 6 had high efficiency. At a luminance of 5000 $cd/m^2$, the driving voltage was 4.8 V.

Furthermore, the continuous lighting tests were conducted in which the light-emitting element 6 was continuously lit by constant current driving with the initial luminance set at 5000 $cd/m^2$. As a result, 79% of the initial luminance was maintained even after 100 hours. Thus, it was found that the light-emitting element 6 has a long lifetime.

(Manufacture of Light-Emitting Element 7)

The light-emitting element 7 is a light-emitting element having the structure described with reference to FIG. 4 in Embodiment Mode 2. Specifically, the light-emitting element 7 is a light-emitting element in the case where the HOMO level (the absolute value) of the second layer 1612 of FIG. 16A is deeper (larger) than the HOMO level of the first layer 1611. Furthermore, the light-emitting element 7 is a light-emitting element in the case where the sixth layer thermodynamically controls carriers (electrons) as shown in the conceptual diagram of FIG. 7.

The light-emitting element 7 was manufactured in a similar manner to the light-emitting element 6 except that a co-evaporated film of Alq and N,N'-diphenylquinacridone (DPQd) was used instead of the co-evaporated film of Alq and 2PCAPA, which was used for the sixth layer 1616 of the light-emitting element 6. Here, the evaporation rate was adjusted such that the weight ratio of Alq to DPQd became 1:0.005 (=Alq:DPQd).

Sealing was performed in a glove box under a nitrogen atmosphere so that the obtained light-emitting element 7 of the present invention was not exposed to the atmosphere, and then operation characteristics of this light-emitting element were measured. Note that the measurements were performed at room temperature (in an atmosphere kept at 25° C.).

The current density vs. luminance characteristics of the light-emitting element 7 are shown in FIG. 21. The voltage vs. luminance characteristics are shown in FIG. 22. The luminance vs. current efficiency characteristics are shown in FIG. 23. The emission spectrum at current of 1 mA is shown in FIG. 24. Further, FIG. 25 shows the results of continuous lighting tests in which the light-emitting element 7 was continuously lit by constant current driving with the initial luminance set at 5000 $cd/m^2$ (the vertical axis indicates the relative luminance on the assumption that 5000 $cd/m^2$ is assumed as 100%).

The CIE chromaticity coordinate of the light-emitting element 7 at a luminance of 5000 $cd/m^2$ was (x=0.30, y=0.61), and green light which derives from 2PCAPA was emitted. In addition, at a luminance of 5000 $cd/m^2$, the current efficiency was 17 cd/A; thus, the light-emitting element 7 had extremely high efficiency. At a luminance of 5000 cd/m², the driving voltage was 6.1 V.

Furthermore, the continuous lighting tests were conducted in which the light-emitting element 7 was continuously lit by constant current driving with the initial luminance set at 5000 cd/m². As a result, 82% of the initial luminance was maintained even after 100 hours. Thus, it was found that the Light-emitting element 7 has a long lifetime.

(Manufacture of Light-Emitting Element 8)

The light-emitting element 8 is a light-emitting element having the structure described with reference to FIG. 4 in Embodiment Mode 2. Specifically, the light-emitting element 8 is a light-emitting element in the case where the HOMO level (the absolute value) of the second layer 1612 of FIG. 16A is deeper (larger) than the HOMO level of the first layer 1611. Furthermore, the light-emitting element 8 is a light-emitting element in the case where the sixth layer kinetically controls carriers (electrons) as shown in the conceptual diagram of FIGS. 6A and 6B.

The light-emitting element 8 was manufactured in a similar manner to the light-emitting element 6 except that N,N'-bis[4-(9H-carbazol-9-yl)phenyl-N,N'-diphenylvinyl-4,4'-diamine (YGABP) was used instead of YGASF used for the second layer 1612 of the light-emitting element 5.

Sealing was performed in a glove box under a nitrogen atmosphere so that the obtained light-emitting element 8 of the present invention was not exposed to the atmosphere, and then operation characteristics of this light-emitting element were measured. Note that the measurements were performed at room temperature (in an atmosphere kept at 25° C.).

The current density vs. luminance characteristics of the light-emitting element 8 are shown in FIG. 21. The voltage vs. luminance characteristics are shown in FIG. 22. The luminance vs. current efficiency characteristics are shown in FIG. 23. The emission spectrum at current of 1 mA is shown in FIG. 24. Further, FIG. 25 shows the results of continuous lighting tests in which the light-emitting element 8 was continuously lit by constant current driving with the initial luminance set at 5000 cd/m² (the vertical axis indicates the relative luminance on the assumption that 5000 cd/m² is assumed as 100%).

The CIE chromaticity coordinate of the light-emitting element 8 at a luminance of 5000 cd/m² was (x=0.29, y=0.63), and green light which derives from 2PCAPA was emitted. In addition, at a luminance of 5000 cd/m², the current efficiency was 20 cd/A; thus, the light-emitting element 8 had high efficiency. At a luminance of 5000 cd/m², the driving voltage was 4.6 V.

Furthermore, the continuous lighting tests were conducted in which the light-emitting element 8 was continuously lit by constant current driving with the initial luminance set at 5000 cd/m². As a result, 87% of the initial luminance was maintained even after 100 hours. Thus, it was proved that the light-emitting element 8 has a long lifetime.

(Manufacture of Light-Emitting Element 9)

Next, as a light-emitting element for comparison, the light-emitting element 9 having the structure shown in FIG. 16B (a structure in which the second layers 1612 of the above-described light-emitting elements 6 to 8 were formed using NPB and the sixth layer 1616 was not provided) was manufactured. A manufacturing method thereof will be described below.

First, indium tin oxide containing silicon oxide was deposited over the glass substrate 1601 by a sputtering method to form the first electrode 1602. Note that the thickness of the first electrode 1602 was set to be 110 nm and the area thereof was set to be 2 mm×2 mm.

Next, the substrate provided with the first electrode 1602 was fixed to a substrate holder which was provided in a vacuum evaporation apparatus so that a surface provided with the first electrode 1602 faced downward. The pressure in the vacuum evaporation apparatus was reduced to approximately $10^{-4}$ Pa. Then, over the first electrode 1602, 4,4'-bis[N-(1-naphthyl)-N-phenylamino]biphenyl (NPB) and molybdenum(VI) oxide were co-evaporated to form the first layer 1611 which is a hole-injecting layer. The thickness of the first layer 1611 was set to be 50 nm, and the evaporation rate was adjusted such that the weight ratio of NPB to molybdenum (VI) oxide became 4:1 (=NPB:molybdenum oxide). Note that a co-evaporation method is an evaporation method in which evaporation is performed using a plurality of evaporation sources in one treatment chamber at the same time.

Next, 4,4'-bis[N-(1-naphthyl)-N-phenylamino]biphenyl (NPB) was deposited to a thickness of 10 nm by an evaporation method using resistive heating to form the second layer 1612 which is a hole-transporting layer.

Next, the third layer 1613 which is the light-emitting layer was formed over the second layer 1612. By co-evaporation of 9-[4-(10-phenyl-9-anthryl)phenyl]-9H-carbazole (CzPA) and N-(9,10-diphenyl-2-anthryl)-N,9-diphenyl-9H-carbazol-3-amine (2PCAPA), the third layer 1613 with a thickness of 40 nm was formed. Here, the evaporation rate was adjusted such that the weight ratio of CzPA to 2PCAPPA became 1:0.05 (=CzPA:2PCAPA).

Then, bathophenanthroline (BPhen) was deposited over the third layer 1613 to a thickness of 30 nm by an evaporation method using resistive heating to form the fourth layer 1614 which is an electron-transporting layer.

Next, lithium fluoride (LiF) was deposited over the fourth layer 1614 to a thickness of 1 nm to form the fifth layer 1615 which is an electron-injecting layer.

Lastly, aluminum was deposited to a thickness of 200 nm by an evaporation method using resistive heating to form the second electrode 1604. Accordingly, the light-emitting element 9 was manufactured.

Sealing was performed in a glove box under a nitrogen atmosphere so that the light-emitting element 9 obtained as described above was not exposed to the atmosphere, and then operation characteristics of the light-emitting element 9 were measured. Note that the measurements were performed at room temperature (in an atmosphere kept at 25° C.).

The current density vs. luminance characteristics of the light-emitting element 9 are shown in FIG. 21. The voltage vs. luminance characteristics are shown in FIG. 22. The luminance vs. current efficiency characteristics are shown in FIG. 23. Further, FIG. 25 shows the results of continuous lighting tests in which the light-emitting element 9 was continuously lit by constant current driving with the initial luminance set at 5000 cd/m² (the vertical axis indicates the relative luminance on the assumption that 5000 cd/m² is assumed as 100%).

The CIE chromaticity coordinate of the light-emitting element 9 at a luminance of 5000 cd/m² was (x=0.30, y=0.62), the current efficiency was 16 cd/A, and green light which derives from 2PCAPA was emitted as in the light-emitting elements 6 to 8. It was found that by comparison with the current efficiency of the light-emitting elements 6 to 8, the current efficiency of the light-emitting element 9 was lower than that of the light-emitting elements 6 to 8. Further, the continuous lighting tests were conducted in which the light-emitting element 8 was continuously lit by constant current driving with the initial luminance set at 5000 cd/m². As a result, the luminance has decreased to 76% of the initial luminance after 100 hours, as shown in FIG. 25. Thus, the light-emitting element 9 exhibited the lifetime shorter than the light-emitting elements 6 to 8.

As described above, it was found that the light-emitting elements 6 to 8 have higher efficiency than the light-emitting element 9. Thus, it is found that a light-emitting element having high efficiency and a long lifetime can be obtained by application of the present invention.

[Embodiment 3]

In Embodiment 3, the oxidation reaction characteristics of N-[4-(9H-carbazol-9-yl)phenyl]-N-phenyl-spiro-9,9'-bifluoren-2-amine (YGASF), 4-(9H-carbazol-9-yl)-2'-phenyltriphenylamine (o-YGA1BP), 4-(9H-carbazol-9-yl)-3'-phenyltriphenylamine (m-YGA1BP), N,N'-bis[4-(9H-carbazol-9-yl)phenyl-N,N'-diphenylvinyl-4,4'-diamine (YGABP), and 4,4'-bis[N-(1-naphthyl)-N-phenylamino]biphenyl (NPB), which were used for the second layers (the second layer 1512 of FIG. 15A and the second layer 1612 of FIG. 16A) which were hole-transporting layers of the light-emitting elements manufactured in Embodiment 1 and Embodiment 2 (the light-emitting elements 1 to 4 and the light-emitting elements 6 to 8) were measured by cyclic voltammetry (CV).

Moreover, from the measurements, the HOMO levels of YGASF, YGABP, o-YGA1BP, m-YGA1BPm and NPB were calculated. Note that the electrochemical analyzer (ALS model 600A or 600C, manufactured by BAS Inc.) was used for the measurements.

As for a solution used for the CV measurements, dehydrated dimethylformamide (DMF) (manufactured by Aldrich Inc., 99.8%, Catalog No. 22705-6) was used as a solvent, and tetra-n-butylammonium perchlorate (n-Bu$_4$NClO$_4$, manufactured by Tokyo Chemical Industry Co., Ltd., Catalog No. T0836), which is a supporting electrolyte, was dissolved in the solvent such that the concentration of tetra-n-butylammonium perchlorate was 100 mmol/L. Furthermore, the object of the measurements was also dissolved in the solvent and adjusted such that the concentration thereof became 1 mmol/L. Further, a platinum electrode (a PTE platinum electrode, manufactured by BAS Inc.) was used as a working electrode; a platinum electrode (a VC-3 Pt counter electrode (5 cm), manufactured by BAS Inc.) was used as an auxiliary electrode; and an Ag/Ag$^+$ electrode (an RE5 nonaqueous solvent reference electrode, manufactured by BAS Inc.) was used as a reference electrode. Note that the CV measurements were conducted at room temperature (20° C. to 25° C.).

(Calculation of Potential Energy of Reference Electrode with Respect to Vacuum Level)

First, the potential energy (eV) of the reference electrode (the Ag/Ag$^+$ electrode) used in Embodiment 3 with respect to the vacuum level was calculated. That is, the Fermi level of the Ag/Ag$^+$ electrode was calculated. It is known that the oxidation-reduction potential of ferrocene in methanol is +0.610 [V vs. SHE] with respect to a standard hydrogen electrode (Reference: Christian R. Goldsmith et al., *J. Am. Chem. Soc.*, Vol. 124, No. 1, pp. 83-96, 2002). On the other hand, when the oxidation-reduction potential of ferrocene in methanol was calculated using the reference electrode used in Embodiment 3, the result was +0.20 V [vs. Ag/Ag$^+$]. Therefore, it was found that the potential energy of the reference electrode used in Embodiment 3 was lower than that of the standard hydrogen electrode by 0.41 [eV].

Here, it is known that the potential energy of the standard hydrogen electrode with respect to the vacuum level is −4.44 eV (Reference: Toshihiro Ohnishi and Tamami Koyama, *High Molecular EL Material*, Kyoritsu Shuppan, pp. 64-67). Accordingly, the potential energy of the reference electrode used in Embodiment 3 with respect to the vacuum level could be calculated to be −4.44−0.41=−4.85 [eV].

MEASUREMENT EXAMPLE 1

YGASF

Figure 26:
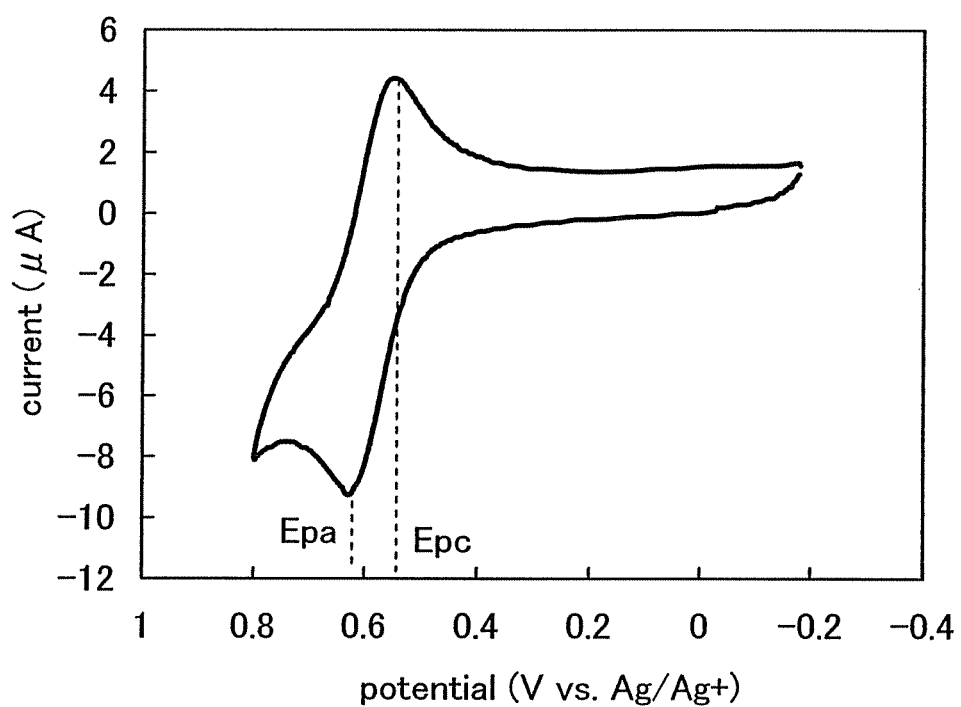
FIG. 26 is a graph showing CV characteristics of YGASF.

In Measurement Example 1, the oxidation reaction characteristics of YGASF were measured by cyclic voltammetry (CV). The scan rate was set to be 0.1 V/sec. FIG. 26 shows the measurement results. Note that the measurements of the oxidation reaction characteristics were performed in such a manner that the working electrode with respect to the reference electrode was scanned with potentials ranging from −0.18 V to +0.80 V, and then potentials raging from +0.80 V to −0.18 V.

As shown in FIG. 26, it can be seen that an oxidation peak potential $E_{pa}$ is +0.63 V and a reduction peak potential $E_{pc}$ is +0.55 V. Therefore, a half-wave potential (an intermediate potential between $E_{pc}$ and $E_{pa}$) can be calculated to be +0.59 V. This shows that YGASF is oxidized by an electric energy of +0.59 [V vs. Ag/Ag$^+$], and this energy corresponds to the HOMO level. Here, as described above, the potential energy of the reference electrode used in Embodiment 3 with respect to the vacuum level is −4.85 [eV]. Therefore, the HOMO level of YGASF was calculated to be −4.85−(+0.59)=−5.44 [eV].

MEASUREMENT EXAMPLE 2

YGABP

Figure 27:
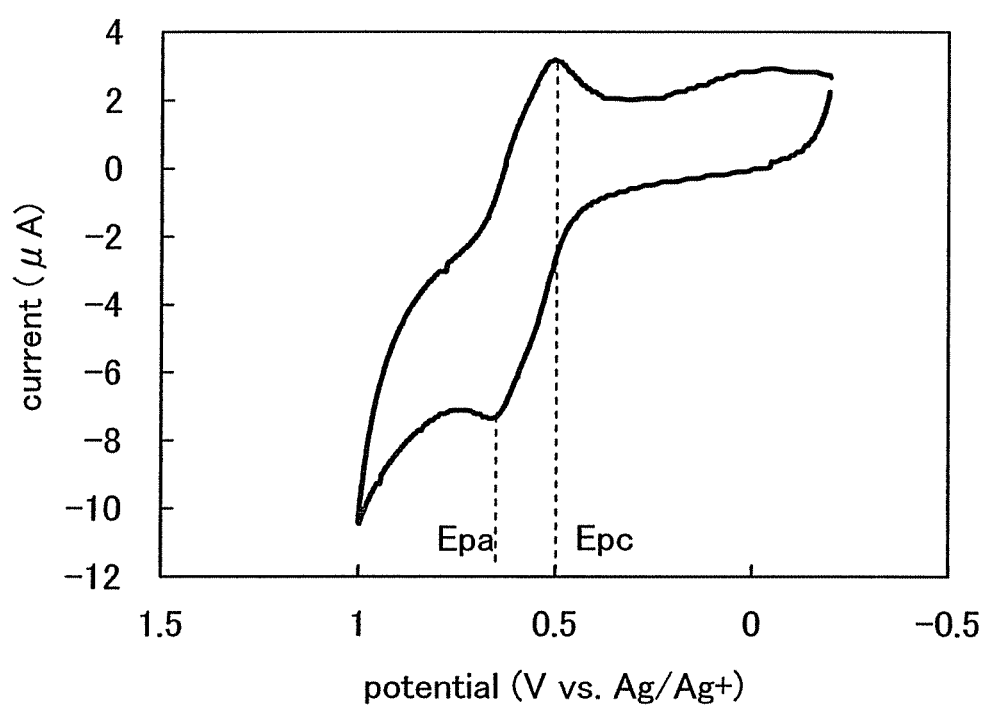
FIG. 27 is a graph showing CV characteristics of YGABP.

In Measurement Example 2, the oxidation reaction characteristics of YGABP were measured by cyclic voltammetry (CV). The scan rate was set to be 0.1 V/sec. FIG. 27 shows the measurement results. Note that the measurements of the oxidation characteristics were performed in such a manner that the working electrode with respect to the reference electrode was scanned with potentials ranging from −0.20 V to +1.00 V, and then potentials raging from +1.00 V to −0.20 V.

As shown in FIG. 27, it can be seen that an oxidation peak potential $E_{pa}$ is +0.66 V and a reduction peak potential $E_{pc}$ is +0.50 V. Therefore, a half-wave potential (an intermediate potential between $E_{pc}$ and $E_{pa}$) can be calculated to be +0.58 V. This shows that YGABP can be oxidized by an electric energy of +0.58 [V vs. Ag/Ag$^+$], and this energy corresponds to the HOMO level. Here, as described above, the potential energy of the reference electrode used in Embodiment 3 with respect to the vacuum level is −4.85 [eV]. Therefore, the HOMO level of YGABP was calculated to be −4.85−(+0.58) =−5.43 [eV].

MEASUREMENT EXAMPLE 3 o-YGA1BP

Figure 28:
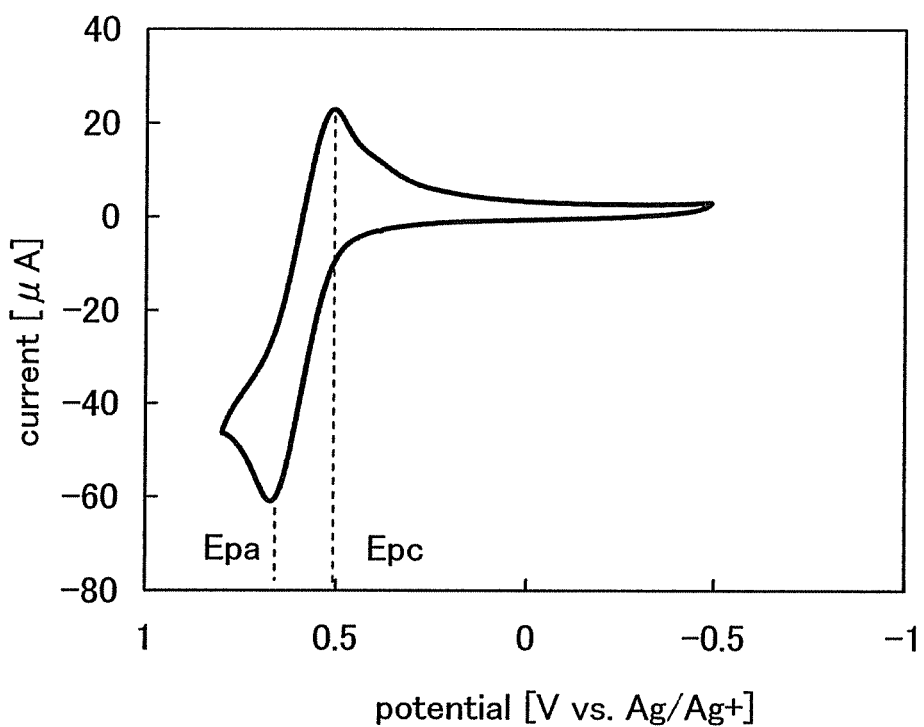
FIG. 28 is a graph showing CV characteristics of o-YGA1BP.

In Measurement Example 3, the oxidation reaction characteristics of o-YGA1BP were measured by cyclic voltammetry (CV). The scan rate was set to be 0.1 V/sec. FIG. 28 shows the measurement results. Note that the measurements of the oxidation characteristics were performed in such a manner that the working electrode with respect to the reference electrode was scanned with potentials ranging from −1.00 V to +1.00 V, and then potentials raging from +1.00 V to −1.00 V.

As shown in FIG. 28, it can be seen that an oxidation peak potential $E_{pa}$ is +0.67 V and a reduction peak potential $E_{pc}$ is +0.51 V. Therefore, a half-wave potential (an intermediate potential between $E_{pc}$ and $E_{pa}$) can be calculated to be +0.58 V. This shows that o-YGA1BP can be oxidized by an electric energy of +0.58 [V vs. Ag/Ag$^+$], and this energy corresponds to the HOMO level. Here, as described above, the potential energy of the reference electrode used in Embodiment 3 with respect to the vacuum level is −4.85 [eV]. Therefore, the HOMO level of o-YGA1BP was calculated to be −4.85−(+0.58)=−5.43 [eV].

MEASUREMENT EXAMPLE 4 m-YGA1BP

Figure 29:
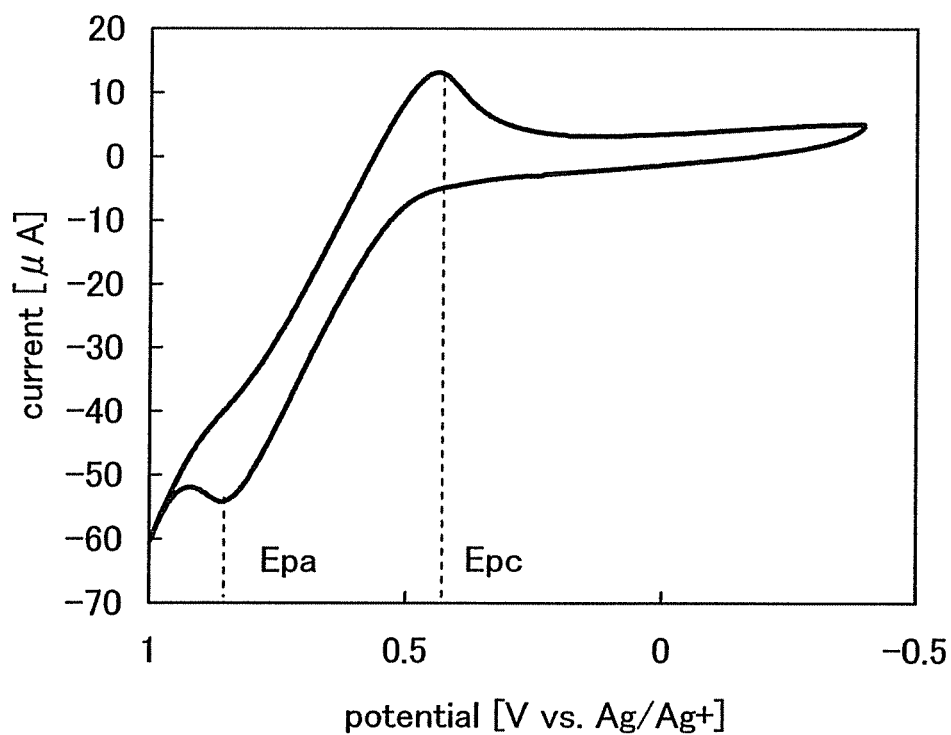
FIG. 29 is a graph showing CV characteristics of m-YGA1BP.

In Measurement Example 4, the oxidation reaction characteristics of m-YGA1BP were measured by cyclic voltammetry (CV). The scan rate was set to be 0.1 V/sec. FIG. 29 shows the measurement results. Note that the measurements of the oxidation reaction characteristics were performed in such a manner that the working electrode with respect to the reference electrode was scanned with potentials ranging from −0.50 V to +1.00 V, and then potentials raging from +1.00 V to −0.50 V.

As shown in FIG. 29, it can be seen that an oxidation peak potential $E_{pa}$ is +0.86 V and a reduction peak potential $E_{pc}$ +0.44 V. Therefore, a half-wave potential (an intermediate potential between $E_{pc}$ and $E_{pa}$) can be calculated to be +0.65 V. This shows that m-YGA1BP can be oxidized by an electric energy of +0.65 [V vs. Ag/Ag$^+$], and this energy corresponds to the HOMO level. Here, as described above, the potential energy of the reference electrode used in Embodiment 3 with respect to the vacuum level is −4.85 [eV]. Therefore, the HOMO level of m-YGA1BP was calculated to be −4.85−(+0.65)=−5.50 [eV].

MEASUREMENT EXAMPLE 5

NPB

Figure 30:
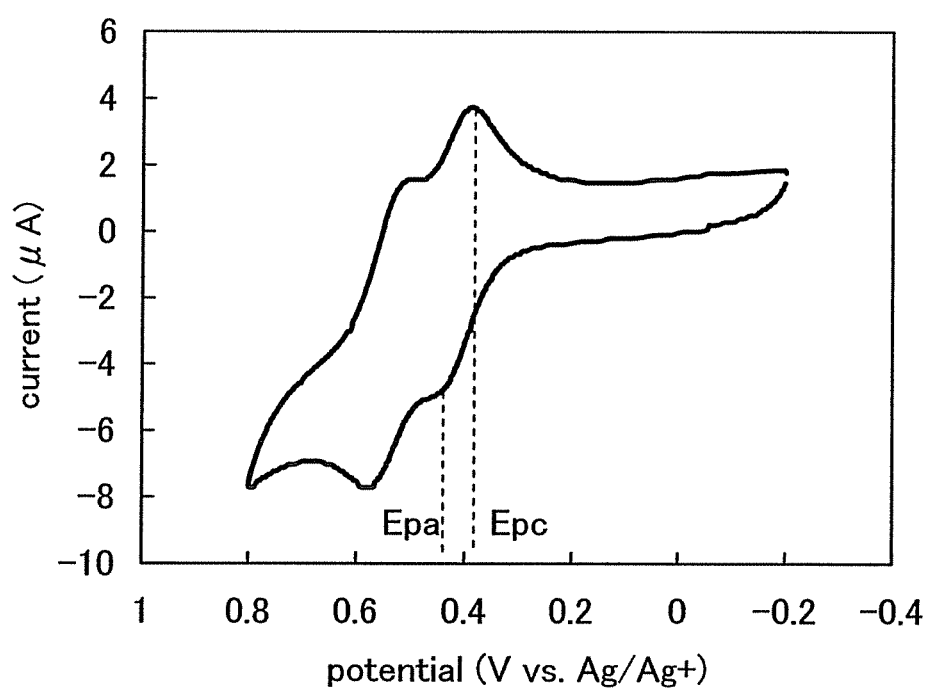
FIG. 30 is a graph showing CV characteristics of NPB.

In Measurement Example 5, the oxidation reaction characteristics of NPB were evaluated by cyclic voltammetry (CV) measurements. The scan rate was set to be 0.1 V/sec. FIG. 30 shows the measurement results. Note that the measurements of the oxidation reaction characteristics were performed in such a manner that the working electrode with respect to the reference electrode was scanned with potentials ranging from −0.20 V to +0.80 V, and then potentials raging from +0.80 V to −0.20 V.

As shown in FIG. 30, it can be seen that an oxidation peak potential $E_{pa}$ is +0.45 V and a reduction peak potential $E_{pc}$ is +0.39 V. Therefore, a half-wave potential (an intermediate potential between $E_{pc}$ and $E_{pa}$) can be calculated to be +0.42 V. This shows that NPB can be oxidized by an electric energy of +0.42 [V vs. Ag/Ag$^+$], and this energy corresponds to the HOMO level. Here, as described above, the potential energy of the reference electrode used in Embodiment 3 with respect to the vacuum level is −4.85 [eV]. Therefore, the HOMO level of NPB was calculated to be −4.85−(+0.42)=−5.27 [eV].

Note that by comparison among the HOMO levels of YGASF, YGABP, o-YGA1BP, m-YGA1BP, and NPB which were calculated in the above-described manner, it can be found that the HOMO level of YGASF is lower than that of NPB by 0.17 [eV], the HOMO level of YGABP is lower than that of NPB by 0.16 [eV], the HOMO level of o-YGA1BP is lower than that of NPB by 0.16 [eV], and the HOMO level of m-YGA1BP is lower than that of NPB by 0.23 [eV].

That is, by formation of the second layer (the second layer 1512 of FIG. 15 and the second layer 1612 of FIGS. 16A and 16B) which is a hole-transporting layer with use of YGASF, YGABP, o-YGA1BP, or m-YGA1BP, the injection amount of holes from the first layer (the first layer 1511 of FIG. 15 and the first layer 1611 of FIGS. 16A and 16B) which is a hole-injecting layer into the second layer (the second layer 1512 of FIG. 15 and the second layer 1612 of FIGS. 16A and 16B) which is a hole-transporting layer can be suppressed. Accordingly, the injection amount of holes into the third layer (the third layer 1513 of FIG. 15 and the third layer 1613 of FIGS. 16A and 16B) which is a light-emitting layer can be suppressed; thus, increase in element efficiency can be achieved.

Thus, it can be said that the element structures of Embodiments 1 and 2 in which YGASF, YGABP, o-YGA1BP, or m-YGA1BP is used for the second layer which is a hole-transporting layer of the light-emitting element of the present invention are suitable for the present invention.

[Embodiment 4]

In this Embodiment, the reduction reaction characteristics of tris(8-quinolinolato)aluminum(III) (Alq), N,N'-diphenylquinacridone (DPQd), and N-(9,10-diphenyl-2-anthryl)-N,9-diphenyl-9H-carbazol-3-amine (2PCAPA), which were used for the sixth layer which is a carrier-controlling layer for controlling transport of electron carriers (the sixth layer 1616 of FIG. 16A) in the light-emitting elements (the light-emitting elements 6 to 8) manufactured in Embodiment 2, were measured by cyclic voltammetry (CV). Further, from the measurements, the LUMO levels of Alq, DPQd, and 2PCAPA were calculated. Note that an electrochemical analyzer (ALS model 600A or 600C, manufactured by BAS Inc.) was used for the measurements.

As for a solution used for the CV measurements, dehydrated dimethylformamide (DMF) (manufactured by Aldrich Inc., 99.8%, Catalog No. 22705-6) was used as a solvent, and tetra-n-butylammonium perchlorate (n-Bu$_4$NClO$_4$, manufactured by Tokyo Chemical Industry Co., Ltd., Catalog No. T0836), which is a supporting electrolyte, was dissolved in the solvent such that the concentration of tetra-n-butylammonium perchlorate was 100 mmol/L. Furthermore, the object of the measurements was also dissolved in the solvent and adjusted such that the concentration thereof was 10 mmol/L. Further, a platinum electrode (a PTE platinum electrode, manufactured by BAS Inc.) was used as a working electrode; a platinum electrode (a VC-3 Pt counter electrode (5 cm), manufactured by BAS Inc.) was used as an auxiliary electrode; and an Ag/Ag$^+$ electrode (an RE5 nonaqueous solvent reference electrode, manufactured by BAS Inc.) was used as a reference electrode. Note that the CV measurements were conducted at room temperature (20° C. to 25° C.).

(Calculation of Potential Energy of Reference Electrode with Respect to Vacuum Level)

First, the potential energy (eV) of the reference electrode (an Ag/Ag$^+$ electrode) used in Embodiment 4 with respect to the vacuum level was calculated. That is, the Fermi level of the Ag/Ag$^+$ electrode was calculated. It is known that the oxidation-reduction potential of ferrocene in methanol is +0.610 [V vs. SHE] with respect to a standard hydrogen electrode (Reference: Christian R. Goldsmith et al., *J. Am. Chem. Soc.*, Vol. 124, No. 1, pp. 83-96, 2002). On the other hand, when the oxidation-reduction potential of ferrocene in methanol was calculated using the reference electrode used in Embodiment 4, the result was +0.20 V [vs. Ag/Ag$^+$]. Therefore, it was found that the potential energy of the reference electrode used in Embodiment 4 was lower than that of the standard hydrogen electrode by 0.41 [eV].

Here, it is known that the potential energy of the standard hydrogen electrode with respect to the vacuum level is −4.44 eV (Reference: Toshihiro Ohnishi and Tamami Koyama, High Molecular EL Material, Kyoritsu Shuppan, pp. 64-67). Accordingly, the potential energy of the reference electrode used in Embodiment 3 with respect to the vacuum level could be calculated to be −4.44−0.41=−4.85 [eV].

MEASUREMENT EXAMPLE 6

Alq

Figure 31:
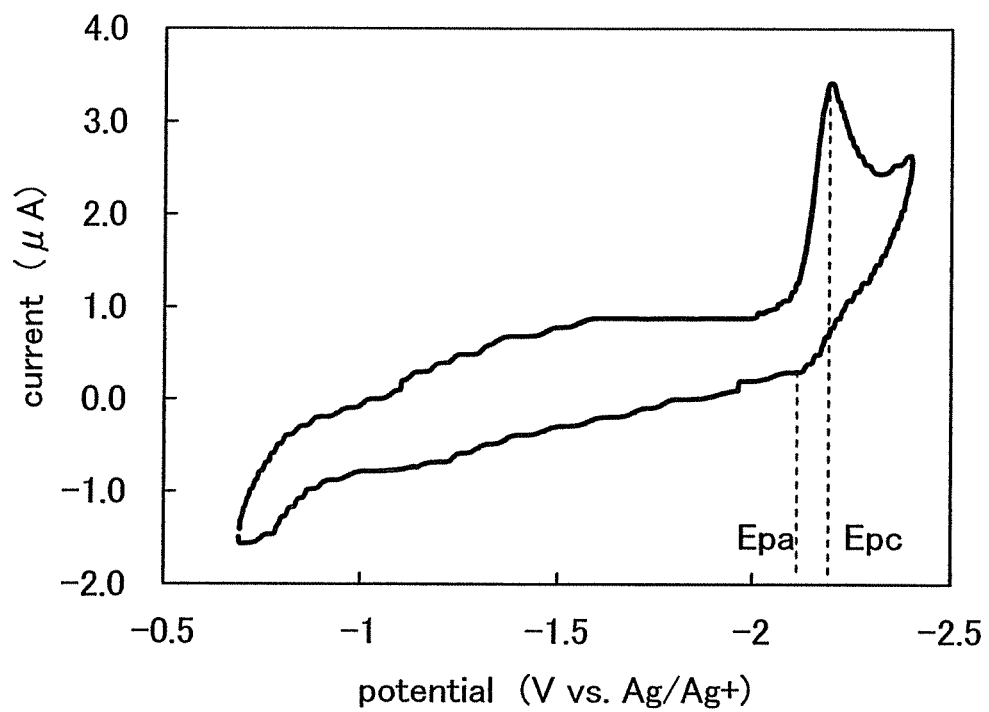
FIG. 31 is a graph showing CV characteristics of Alq.

In Measurement Example 6, the reduction reaction characteristics of Alq were measured by cyclic voltammetry (CV). The scan rate was set to be 0.1 V/sec. FIG. 31 shows the measurement results. Note that the measurements of the reduction reaction characteristics were performed in such a manner that the working electrode with respect to the reference electrode was scanned with potentials ranging from −0.69 V to −2.40 V, and then potentials ranging from −2.40 V to −0.69 V.

As shown in FIG. 31, it can be seen that an oxidation peak potential $E_{pa}$ is −2.12 V and a reduction peak potential $E_{pc}$ is −2.20 V. Therefore, a half-wave potential (an intermediate potential between $E_{pc}$ and $E_{pa}$) can be calculated to be −2.16 V. This shows that Alq is reduced by an electric energy of −2.16 [V vs. Ag/Ag$^+$], and this energy corresponds to the LUMO level. Here, as described above, the potential energy of the reference electrode used in Embodiment 4 with respect to the vacuum level is −4.85 [eV]. Therefore, the LUMO level of Alq was calculated to be −4.85−(−2.16)=−2.69 [eV].

MEASUREMENT EXAMPLE 7

DPQd

Figure 32:
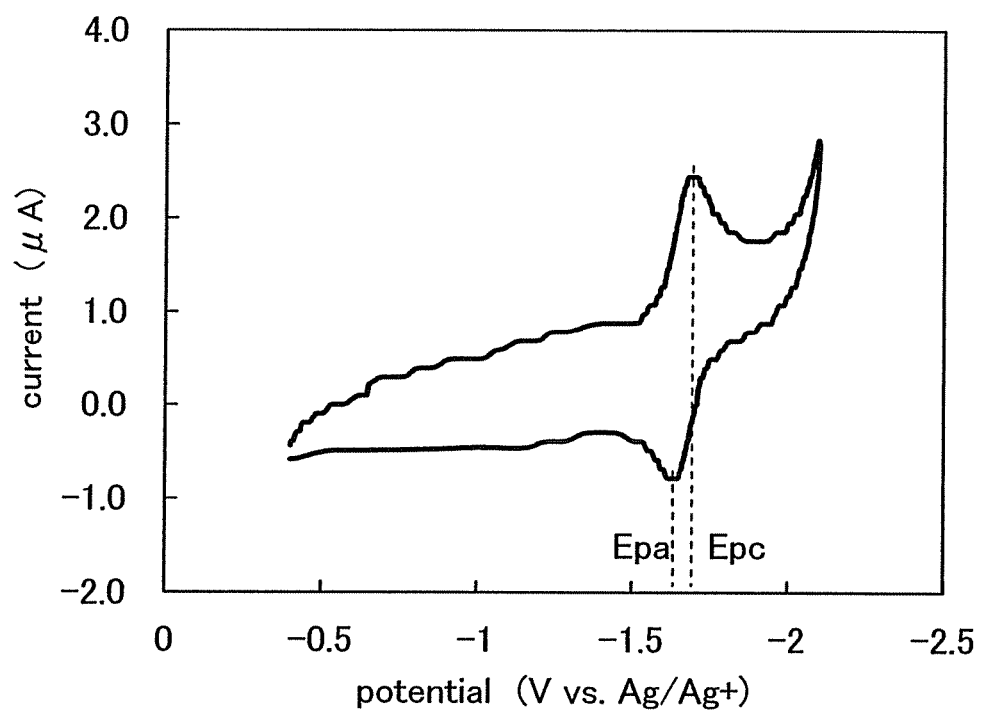
FIG. 32 is a graph showing CV characteristics of DPQd.

In Measurement Example 7, the reduction reaction characteristics of DPQd were measured by cyclic voltammetry (CV). The scan rate was set to be 0.1 V/sec. FIG. 32 shows the measurement results. Note that the measurements of the reduction reaction characteristics were performed in such a manner that the working electrode with respect to the reference electrode was scanned with potentials ranging from −0.40 V to −2.10 V, and then potentials raging from −2.10 V to −0.40 V. Further, since DPQd has low solubility and could not be completely dissolved in a solvent even when the solution was adjusted to contain DPQd at a concentration of 1 mmol/L, the supernatant fluid was extracted with the undissolved residue which is precipitated and used for the measurements.

As shown in FIG. 32, it can be seen that an oxidation peak potential $E_{pa}$ is −1.63 V and a reduction peak potential $E_{pc}$ is −1.69 V. Therefore, a half-wave potential (an intermediate potential between $E_{pc}$ and $E_{pa}$) can be calculated to be −1.66 V. This shows that DPQd is reduced by an electric energy of −1.66 [V vs. Ag/Ag$^+$], and this energy corresponds to the LUMO level. Here, as described above, the potential energy of the reference electrode used in Embodiment 4 with respect to the vacuum level is −4.85 [eV]. Therefore, the LUMO level of DPQd can be calculated to be −4.85−(−1.66)=−3.19 [eV].

MEASUREMENT EXAMPLE 8

2PCAPA

Figure 33:
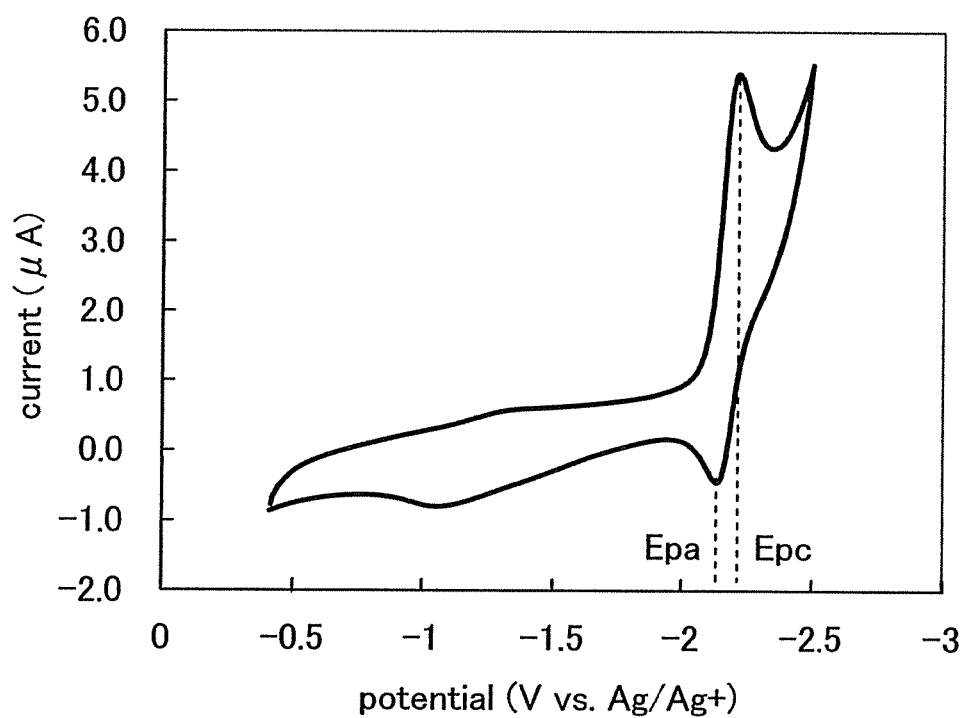
FIG. 33 is a graph showing CV characteristics of 2PCAPA.

In Measurement Example 8, the reduction reaction characteristics of 2PCAPA were measured by cyclic voltammetry (CV). The scan rate was set to be 0.1 V/sec. FIG. 33 shows the measurement results. Note that the measurements of the reduction reaction characteristics were performed in such a manner that the working electrode with respect to the reference electrode was scanned with potentials ranging from −0.41 V to −2.50 V, and then potentials raging from −2.50 V to −0.41 V.

As shown in FIG. 33, it can be seen that an oxidation peak potential $E_{pa}$ is −2.14 V and a reduction peak potential $E_{pc}$ is −2.21 V. Therefore, a half-wave potential (an intermediate potential between $E_{pc}$ and $E_{pa}$) can be calculated to be −2.18 V. This shows that 2PCAPA is reduced by an electric energy of −2.18 [V vs. Ag/Ag$^+$], and this energy corresponds to the LUMO level. Here, as described above, the potential energy of the reference electrode used in Embodiment 4 with respect to the vacuum level is −4.85 [eV]. Therefore, the LUMO level of 2PCAPA can be calculated to be −4.85−(−2.18)=−2.67 [eV].

Note that by comparison between the LUMO levels of Alq and DPQd which were calculated in the above-described manner, it can be found that the LUMO level of DPQd is lower than that of Alq by 0.50 [eV]. This means that by addition of DPQd to Alq, DPQd acts as an electron trap. This is the case described in Embodiment Mode 2 in which the sixth layer thermodynamically controls transport of carriers (electrons) and is formed of a metal complex (Alq) which is a material having an electron-transporting property and a quinacridone derivative (DPQd) having an electron-trapping property.

Further, by comparison between the LUMO levels of Alq and 2PCAPA which were calculated in the above-described manner, it can be found that a difference between the LUMO levels of 2PCAPA and Alq is only 0.02 [eV]. This means that by addition of 2PCAPA to Alq, electrons can be easily transported to 2PCAPA and the electron transport rate of the whole layer is reduced. This is the case described in Embodiment Mode 2 where the sixth layer controls transport of carriers (electrons) kinetically and is formed of a metal complex (Alq) which is a material having an electron-transporting property and an aromatic amine compound (2PCAPA) having a hole-transporting property.

Thus, it is found that an element structure including a carrier-controlling layer formed of a combination of Alq and DPQd or a combination of Alq and 2PCAPA is suitable for the present invention.

This application is based on Japanese Patent Application serial No. 2007-272003 filed with Japan Patent Office on Oct. 19, 2007, the entire contents of which are hereby incorporated by reference.

The invention claimed is:
1. A light-emitting element comprising:
an EL layer between an anode and a cathode,
wherein the EL layer comprises a first layer including a hole-injecting property, a second layer including a hole-transporting property, a third layer including a light-emitting property, and a fourth layer controlling transport of electrons,
wherein the first layer and the second layer are interposed between the anode and the third layer,
wherein the fourth layer is interposed between the cathode and the third layer,
wherein the fourth layer comprises a first organic compound including an electron-transporting property and a second organic compound including a hole-transporting property, wherein an absolute value of a highest occupied molecular orbital level of the second layer is larger than an absolute value of a highest occupied molecular orbital level of the first layer, wherein the third layer is in direct contact with the second layer and the fourth layer, wherein the third layer comprises a third organic compound and a light-emitting material, wherein the light-emitting material is a phosphorescent material, wherein the second organic compound is a red phosphorescent material, wherein a difference between a peak value of an emission spectrum of the second organic compound and a peak value of an emission spectrum of the light-emitting material is within 30 nm, and wherein the light-emitting material is different from the second organic compound.

2. The light-emitting element according to claim 1, wherein the absolute value of the highest occupied molecular orbital level of the second layer is larger than the absolute value of the highest occupied molecular orbital level of the first layer by greater than or equal to 0.1 eV.

3. A light-emitting device manufactured using the light-emitting element according to claim 1.

4. An electronic device manufactured using the light-emitting device according to claim 3.

5. The light-emitting element according to claim 1, a fifth layer including an electron-injecting property, wherein the fifth layer is included in the EL layer, and wherein the fifth layer is interposed between the anode and the fourth layer.

6. A light-emitting element comprising:
an EL layer between an anode and a cathode,
wherein the EL layer comprises a first layer including a hole-injecting property, a second layer including a hole-transporting property, a third layer including a light-emitting property, and a fourth layer controlling transport of electrons, wherein the first layer and the second layer are interposed between the anode and the third layer, wherein the third layer is in direct contact with the second layer and the fourth layer, wherein an absolute value of a highest occupied molecular orbital level of the second layer is larger than an absolute value of a highest occupied molecular orbital level of the first layer, wherein the fourth layer comprises a first organic compound including an electron-transporting property and a second organic compound including a hole-transporting property, wherein a content of the second organic compound is less than 50 % of the total in mass ratio, wherein the third layer comprises a third organic compound and a light-emitting material, wherein the light-emitting material is a phosphorescent material, wherein the second organic compound is a red phosphorescent material, wherein a difference between a peak value of an emission spectrum of the second organic compound and a peak value of an emission spectrum of the light-emitting material is within 30 nm, and wherein the light-emitting material is different from the second organic compound.

7. The light-emitting element according to claim 6,
wherein a difference between an absolute value of a lowest unoccupied molecular orbital level of the second organic compound and an absolute value of a lowest unoccupied molecular orbital level of the first organic compound is less than or equal to 0.3 eV.

8. The light-emitting element according to claim 6,
wherein a difference between an absolute value of a lowest unoccupied molecular orbital level of the second organic compound and an absolute value of a lowest unoccupied molecular orbital level of the first organic compound is less than or equal to 0.3 eV, and wherein the first organic compound is a metal complex.

9. The light-emitting element according to claim 6, wherein the absolute value of the highest occupied molecular orbital level of the second layer is larger than the absolute value of the highest occupied molecular orbital level of the first layer by greater than or equal to 0.1 eV.

10. A light-emitting device manufactured using the light-emitting element according to claim 6.

11. An electronic device manufactured using the light-emitting device according to claim 10.

12. The light-emitting element according to claim 6,
a fifth layer including an electron-injecting property,
wherein the fifth layer is included in the EL layer, and
wherein the fifth layer is interposed between the anode and the fourth layer.

* * * * *